(12) United States Patent
Arigane et al.

(10) Patent No.: US 9,589,638 B2
(45) Date of Patent: Mar. 7, 2017

(54) SEMICONDUCTOR DEVICE AND METHOD OF DRIVING SEMICONDUCTOR DEVICE

(71) Applicant: Renesas Electronics Corporation, Tokyo (JP)

(72) Inventors: Tsuyoshi Arigane, Tokyo (JP); Daisuke Okada, Tokyo (JP); Digh Hisamoto, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/152,391

(22) Filed: May 11, 2016

(65) Prior Publication Data

US 2016/0379713 A1 Dec. 29, 2016

(30) Foreign Application Priority Data

Jun. 23, 2015 (JP) ................................. 2015-125716

(51) Int. Cl.
*G11C 16/04* (2006.01)
*G11C 16/14* (2006.01)
(Continued)

(52) U.S. Cl.
CPC .......... *G11C 16/0466* (2013.01); *G11C 16/14* (2013.01); *G11C 16/344* (2013.01);
(Continued)

(58) Field of Classification Search
CPC ....... G11C 16/16; G11C 16/14; G11C 16/344; G11C 16/0483
(Continued)

(56) References Cited

U.S. PATENT DOCUMENTS 7,110,297 B2 * 9/2006 Morikawa ........... H01L 29/7923
257/314
7,902,591 B2 * 3/2011 Kito .................... H01L 21/8221
257/324
(Continued)

FOREIGN PATENT DOCUMENTS

EP 2 521 135 A1 11/2012
EP 2 626 903 A1 8/2013
(Continued)

OTHER PUBLICATIONS

Extended European Search Report dated Jan. 25, 2017.

*Primary Examiner* — Pho M Luu
(74) *Attorney, Agent, or Firm* — McGinn IP Law Group, PLLC

(57) ABSTRACT

A first potential and a second potential lower than the first potential are applied to a first end of a memory gate electrode part of the nonvolatile memory and to a second end of the memory gate electrode part, respectively, so that a current is caused to flow in a direction in which the memory gate electrode part extends, then, a hole is injected from the memory gate electrode part into a charge accumulating part below it, therefore, an electron accumulated in the charge accumulating part is eliminated. By causing the current to flow through the memory gate electrode part of a memory cell region as described above, Joule heat can be generated to heat the memory cell. Consequently, in the erasing by a FN tunneling method in which the erasing characteristics degrade at a low temperature, the erasing speed can be improved by heating the memory gate electrode part.

20 Claims, 41 Drawing Sheets

(51) Int. Cl.
  *H01L 29/423* (2006.01)
  *H01L 27/115* (2006.01)
  *H01L 29/51* (2006.01)
  *G11C 16/34* (2006.01)

(52) U.S. Cl.
  CPC .. *H01L 27/11568* (2013.01); *H01L 29/42344* (2013.01); *H01L 29/511* (2013.01); *H01L 29/518* (2013.01); *G11C 16/0483* (2013.01)

(58) Field of Classification Search
  USPC .................................................. 365/185.29
  See application file for complete search history.

(56) References Cited

U.S. PATENT DOCUMENTS

| | | | | |
|---|---|---|---|---|
| 8,148,789 | B2* | 4/2012 | Kito | ............ H01L 27/115 257/315 |
| 8,185,802 | B2* | 5/2012 | Noguchi | ............ G06F 11/1068 365/185.09 |
| 2012/0281478 | A1 | 11/2012 | Lue et al. | |
| 2012/0327719 | A1 | 12/2012 | Lue | |
| 2013/0082315 | A1 | 4/2013 | Hosoda et al. | |
| 2013/0100743 | A1 | 4/2013 | Lue | |

FOREIGN PATENT DOCUMENTS

| | | |
|---|---|---|
| JP | 2005-277032 A | 10/2005 |
| JP | 2013-093546 A | 5/2013 |

* cited by examiner

FIG. 12

| PULSE NUMBER | N=1 | N>1 |
|---|---|---|
| MD | 0.3V | 0.3V |
| MS | 5.7V | 4.9V |
| MG | 9.5V | 11V |
| CG | 0.9V | 0.9V |
| Well | 0V | 0V |

FIG. 13

| PULSE NUMBER | N=1 | N>1 |
|---|---|---|
| MD | 0.3V | 0.3V |
| MS | 5.7V | 4.9V |
| MG | 9.5V | 11V |
| CG | 1.5V | 1.5V |
| Well | −1V | −1V |

FIG. 15
(St1)
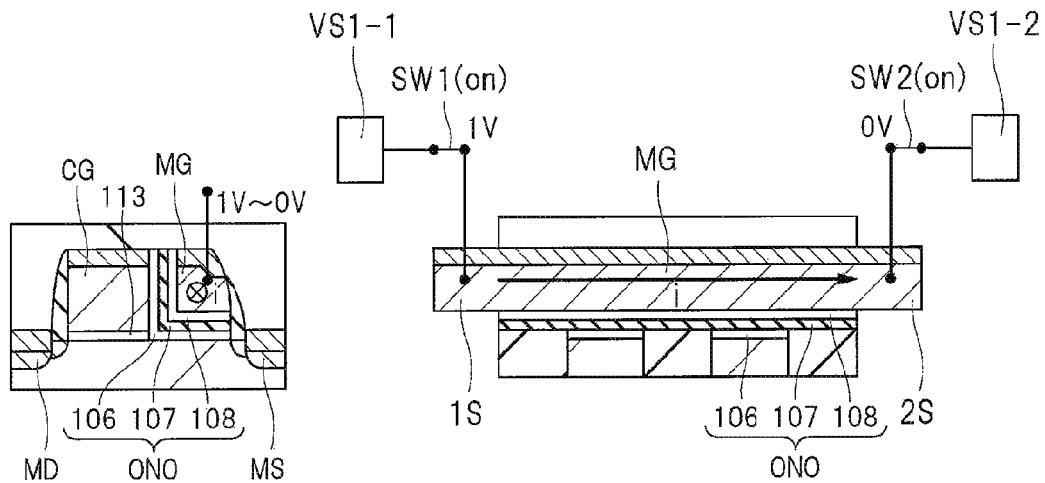
(St2)
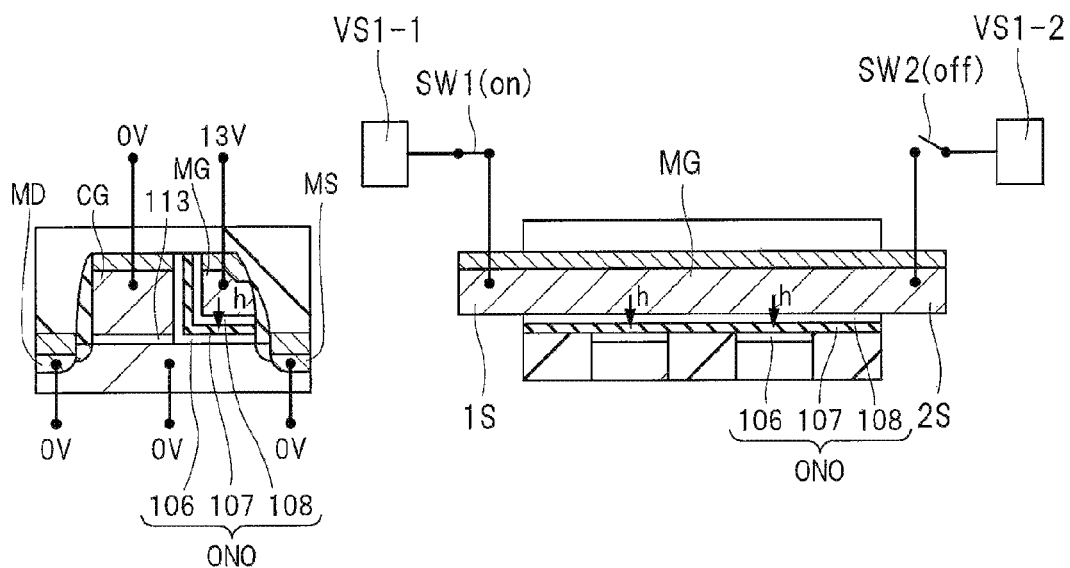

FIG. 16

| PULSE NUMBER | N=1 | N>1 |
|---|---|---|
| MS | 0V | 0V |
| MD | 0V | 0V |
| MG | 13V | 14V |
| CG | 0V | 0V |
| Well | 0V | 0V |

FIG. 17

| PULSE NUMBER | N=1 | N>1 |
|---|---|---|
| MS | −1V | −1V |
| MD | −1V | −1V |
| MG | 11V | 13V |
| CG | 0V | 0V |
| Well | −1V | −1V |

FIG. 24
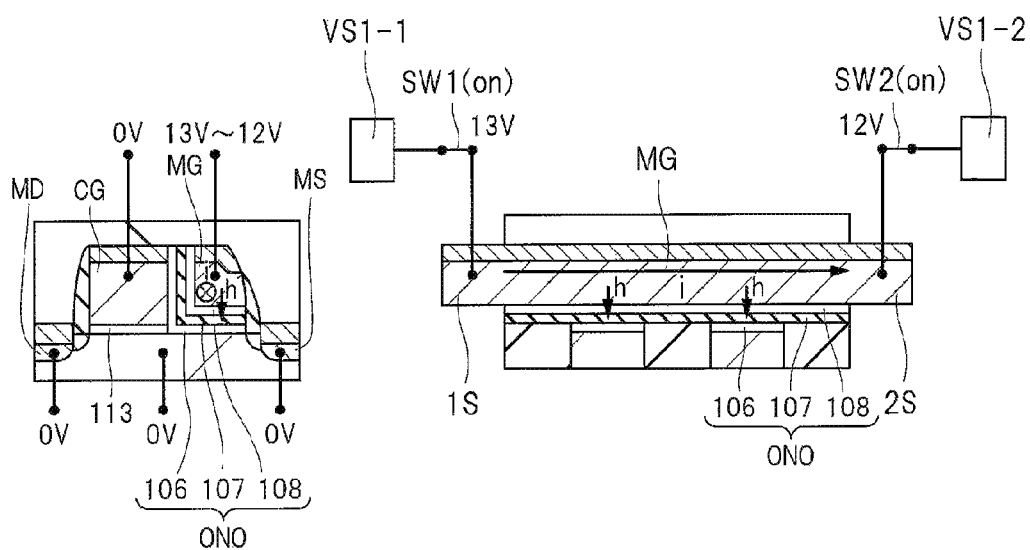
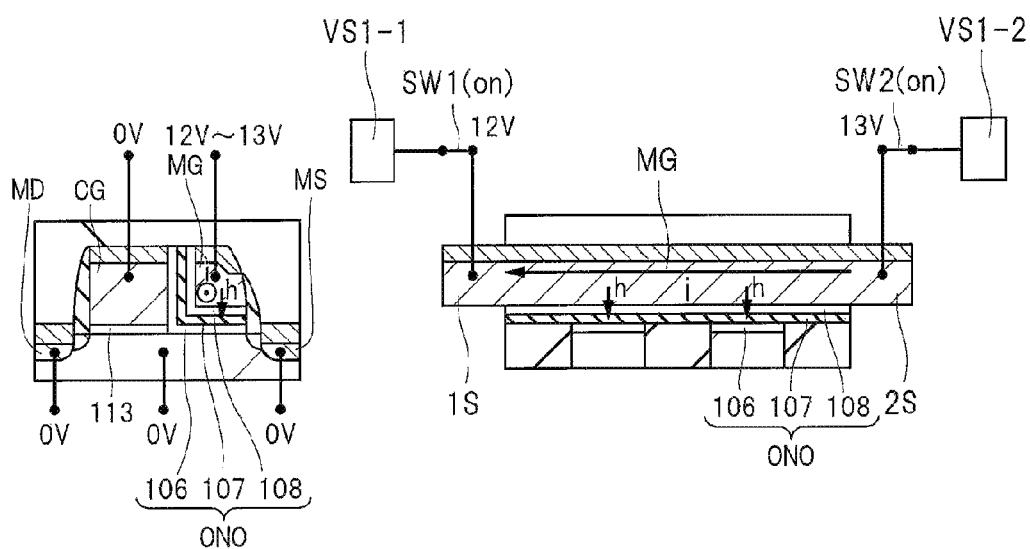

FIG. 46
(St1)
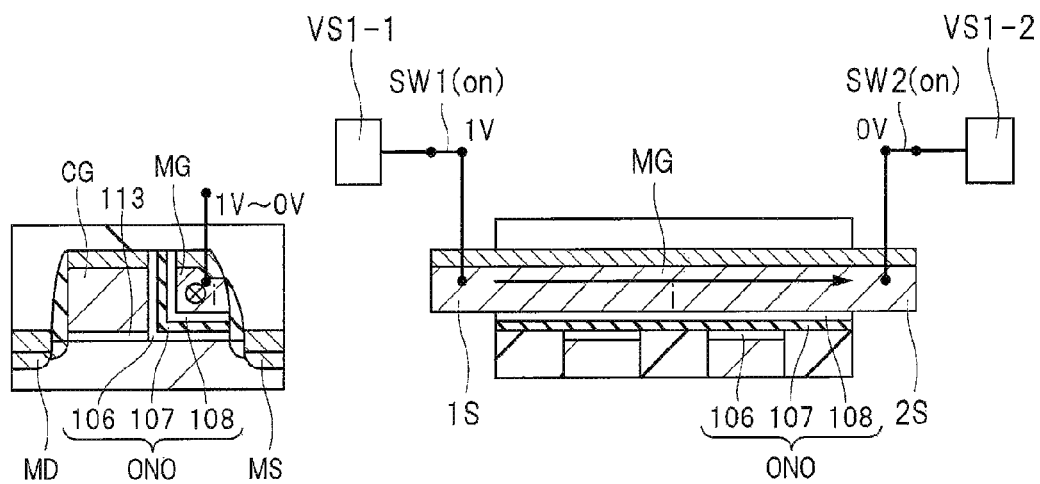
(St2)
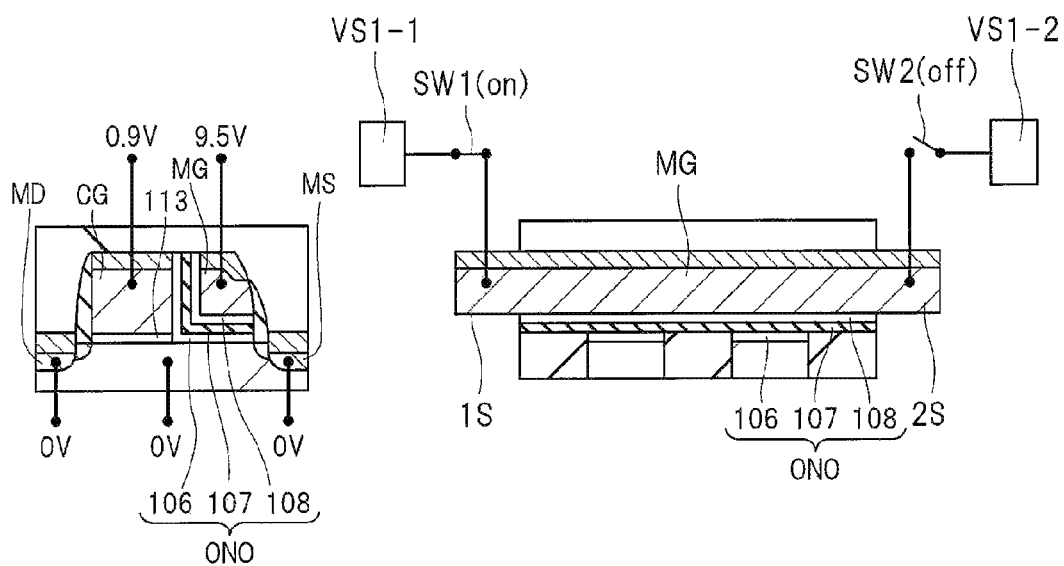

SEMICONDUCTOR DEVICE AND METHOD OF DRIVING SEMICONDUCTOR DEVICE

CROSS-REFERENCE TO RELATED APPLICATION

The present application claims priority from Japanese Patent Application No. 2015-125716 filed on Jun. 23, 2015, the content of which is hereby incorporated by reference into this application.

TECHNICAL FIELD OF THE INVENTION

The present invention relates to a semiconductor device and a method of driving the semiconductor device. For example, the present invention is suitably used for a semiconductor device having a nonvolatile memory cell.

BACKGROUND OF THE INVENTION

A memory cell including a split-gate-type cell using a metal-oxide-nitride-oxide-semiconductor (MONOS) film is used as a type of a nonvolatile memory, in some cases. At this time, the memory cell includes two MISFETs of a control transistor having a control gate electrode and a memory transistor having a memory gate electrode.

For example, Japanese Patent Application Laid-Open Publication No. 2005-277032 (Patent Document 1) discloses a charge injection method for a nonvolatile semiconductor memory device. More specifically, the document discloses a charge injection method including: an erasing step of erasing data by inducing a second charge, having reverse polarity to that of a first charge, between a semiconductor substrate and either one of source/drain region and injecting the second charge into a charge accumulating layer; and a heating step of rearranging the charge accumulated in the charge accumulating layer by heating the charge accumulating layer by causing a current to flow through a conductive layer in the vicinity of the charge accumulating layer.

Japanese Patent Application Laid-Open Publication No. 2013-93546 (Patent Document 2) discloses a nonvolatile memory including: an insulating film formed between a control gate electrode and a semiconductor substrate; and an insulating film formed between a memory gate electrode and the semiconductor substrate and also between the control gate electrode and the memory gate, the insulating film having a charge accumulating portion inside.

SUMMARY OF THE INVENTION

The present inventors research and develop a semiconductor device having a nonvolatile memory cell as described above, and study a Fowler-Nordheim (FN) type erasing method that erases the accumulated charge by injecting a hole from a memory gate (MG). In this case, it has been found that the injected-hole conduction mechanism (PF (Poole-Frenkel) conduction) has such temperature characteristics that erasing characteristics are degraded at a low temperature.

Accordingly, it is desirable to develop a semiconductor device having a nonvolatile memory cell that is excellent in the erasing characteristics even at a low temperature.

The above and other object and novel characteristics of the present invention will be apparent from the description of the present specification and the accompanying drawings.

The typical ones of the inventions disclosed in the present application will be briefly described as follows.

In a semiconductor device described in an embodiment disclosed in the present application, an electron having accumulated in a charge accumulating part is erased by injecting a hole from a gate electrode part into a charge accumulating part located below the gate electrode part while or after causing a current to flow in an extension direction of the gate electrode part by application of a first potential to a first end of the gate electrode part and application of a second potential, which is lower than the first potential, to a second end of the gate electrode part.

A method of driving a semiconductor device described in an embodiment disclosed in the present application includes: (a) a step of causing a current to flow in an extension direction of the gate electrode part by applying a first potential to a first end of a gate electrode part and applying a second potential which is lower than the first potential to a second end of the gate electrode part; and (b) a step of erasing an electron having accumulated in the charge accumulating part by injecting a hole from the gate electrode part into a charge accumulating part. The steps (a) and (b) may be performed at the same time.

According to a semiconductor device described in a typical embodiment disclosed in the present application, a property of the semiconductor device can be improved.

According to a method of driving a semiconductor device described in a typical embodiment disclosed in the present application, a driving property of the semiconductor device can be improved.

BRIEF DESCRIPTIONS OF THE DRAWINGS

FIG. 12 is a diagram showing a first example of a writing pulse;

FIG. 13 is a diagram showing a second example of a writing pulse;

FIG. 15 is a cross-sectional view showing schematically an erasing operation according to the first embodiment;

FIG. 16 is a diagram showing a first example of an erasing pulse;

FIG. 17 is a diagram showing a second example of an erasing pulse;

FIG. 24 is a cross-sectional view showing schematically an erasing operation according to the third embodiment;

FIG. 46 is a cross-sectional view showing schematically an erasing operation according to a ninth embodiment.

DESCRIPTIONS OF THE PREFERRED EMBODIMENTS

Figure 1:
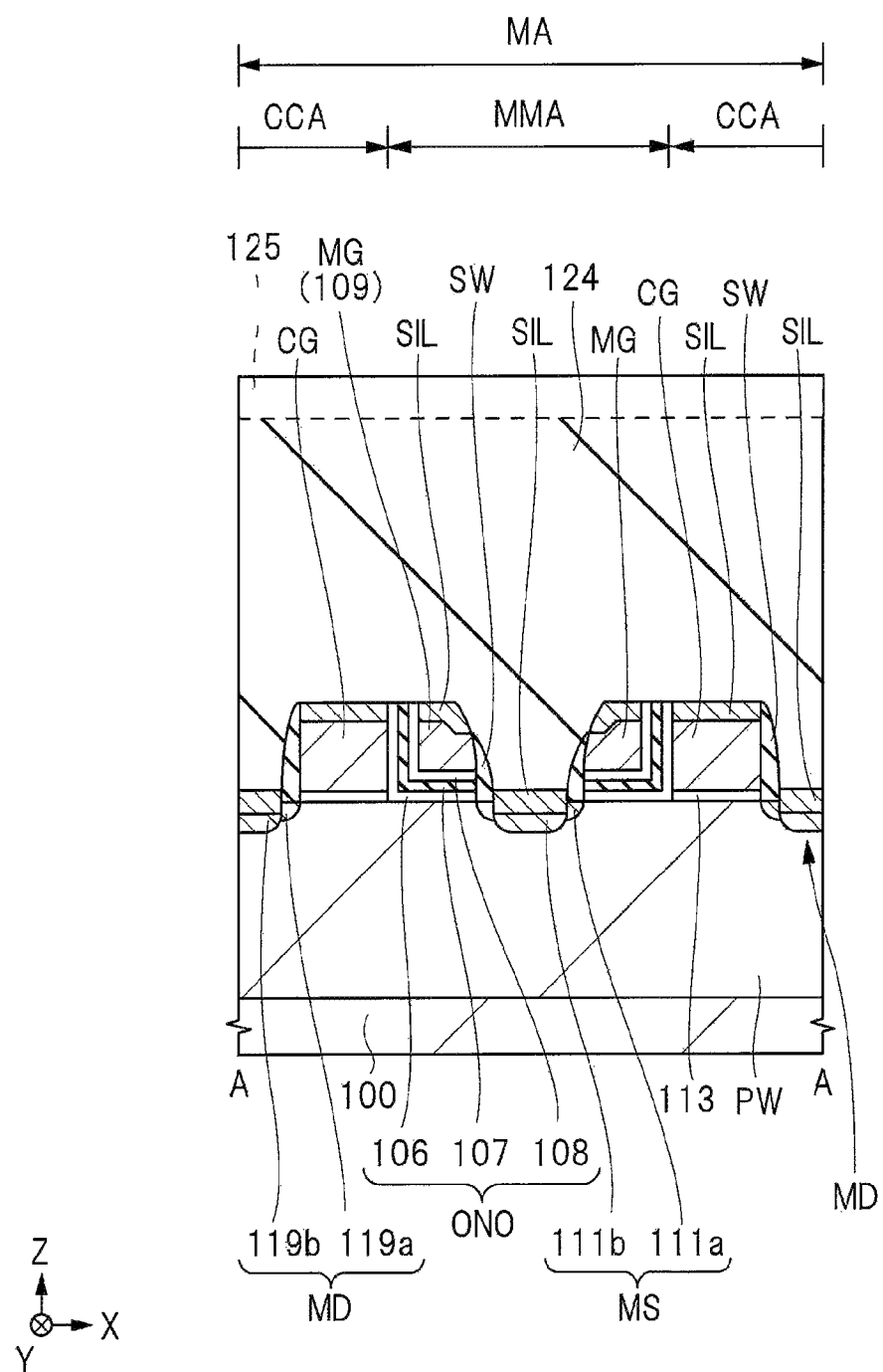
FIG. 1 is a cross-sectional view showing a semiconductor device according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and others), the number of the elements is not limited to a specific number unless otherwise stated or except the case where the number is apparently limited to a specific number in principle. The number larger or smaller than the specified number is also applicable.

Further, in the embodiments described below, the components (including element steps) are not always indispensable unless otherwise stated or except the case where the components are apparently indispensable in principle. Similarly, in the embodiments described below, when the shape of the components, positional relation thereof, and others are mentioned, the substantially approximate and similar shapes and others are included therein unless otherwise stated or except the case where it is conceivable that they are apparently excluded in principle. The same goes for the numerical value (including the number of pieces, numerical values, the amount, the range, and others) described above.

Hereinafter, the embodiments are described in detail based on the drawings. Note that components having the same function are denoted by the same or relative reference characters throughout all the drawings for describing the embodiments, and the repetitive description thereof is omitted. Also, when there are a plurality of similar units (portions), a symbol is added to a reference character of a generic name to indicate an individual or a specific portion in some cases. Also, in the following embodiments, the description of the same or similar portions is not repeated in principle unless otherwise required.

Also, in some drawings used in the embodiments, hatching is omitted even in a cross-sectional view so as to make the drawings easy to see. Also, hatching is used even in a plan view so as to make the drawings easy to see.

Also, in the cross-sectional view and the plan views, a size of each portion does not correspond to that of a practical device, and a specific portion is shown to be relatively large so as to make the drawings easy to see in some cases. Also, even when the cross-sectional views and the plan views correspond to each other, a specific portion is shown to be relatively large so as to make the drawings easy to see in some cases.

First Embodiment

A configuration of a semiconductor device according to the present embodiment is described below, with reference to the drawings. The semiconductor device according to the present embodiment has a memory cell (a memory transistor, and a control transistor) formed in a memory cell region MA. The transistor mentioned herein is also called a metal insulator semiconductor field effect transistor (MISFET).

(Description of Configuration of Memory Cell)

Figure 2:
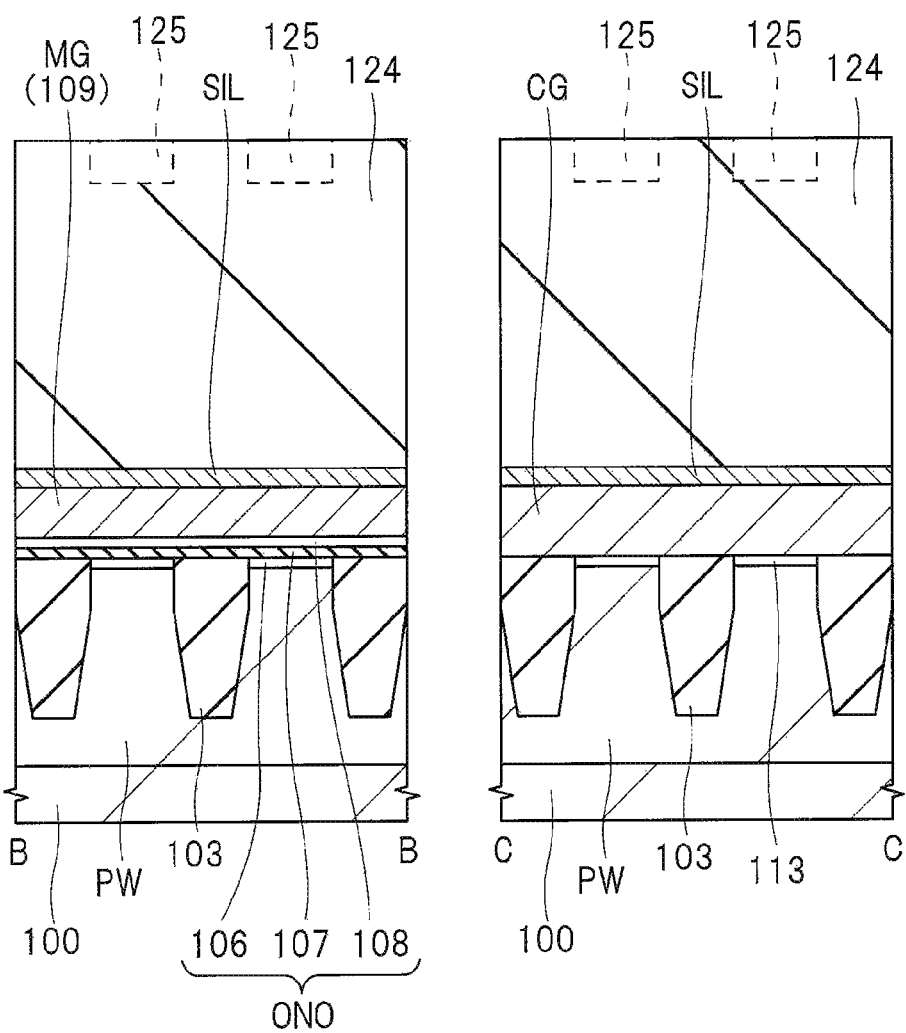
FIG. 2 is a cross-sectional view showing the semiconductor device according to the first embodiment.
Figure 3:
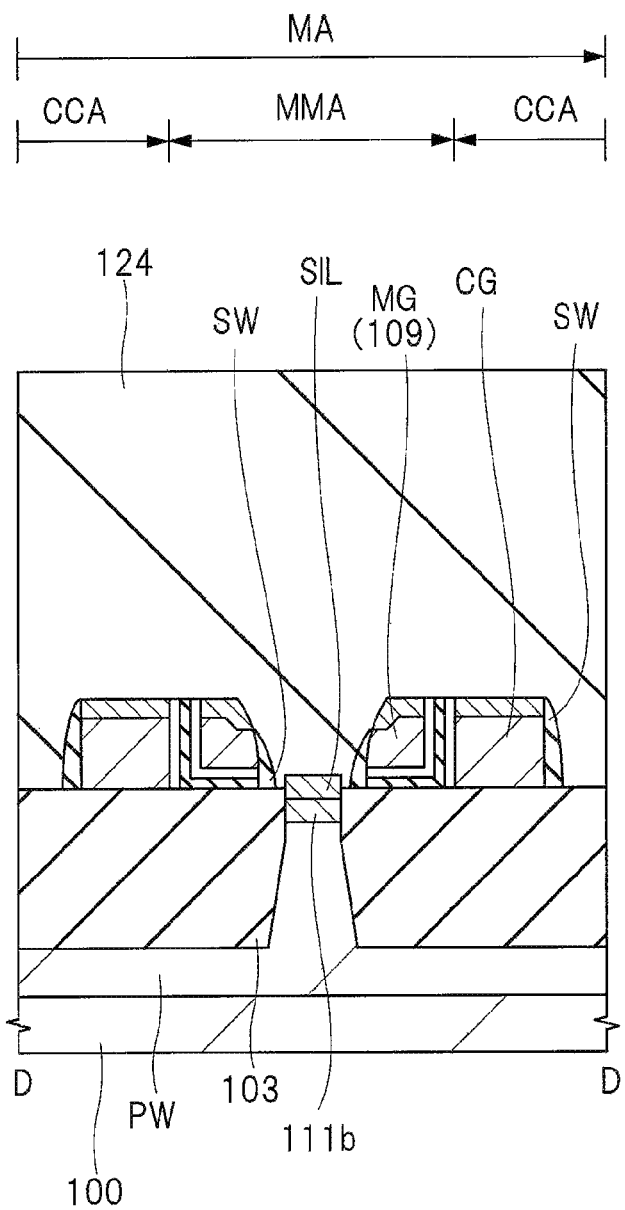
FIG. 3 is a cross-sectional view showing the semiconductor device according to the first embodiment.
Figure 4:
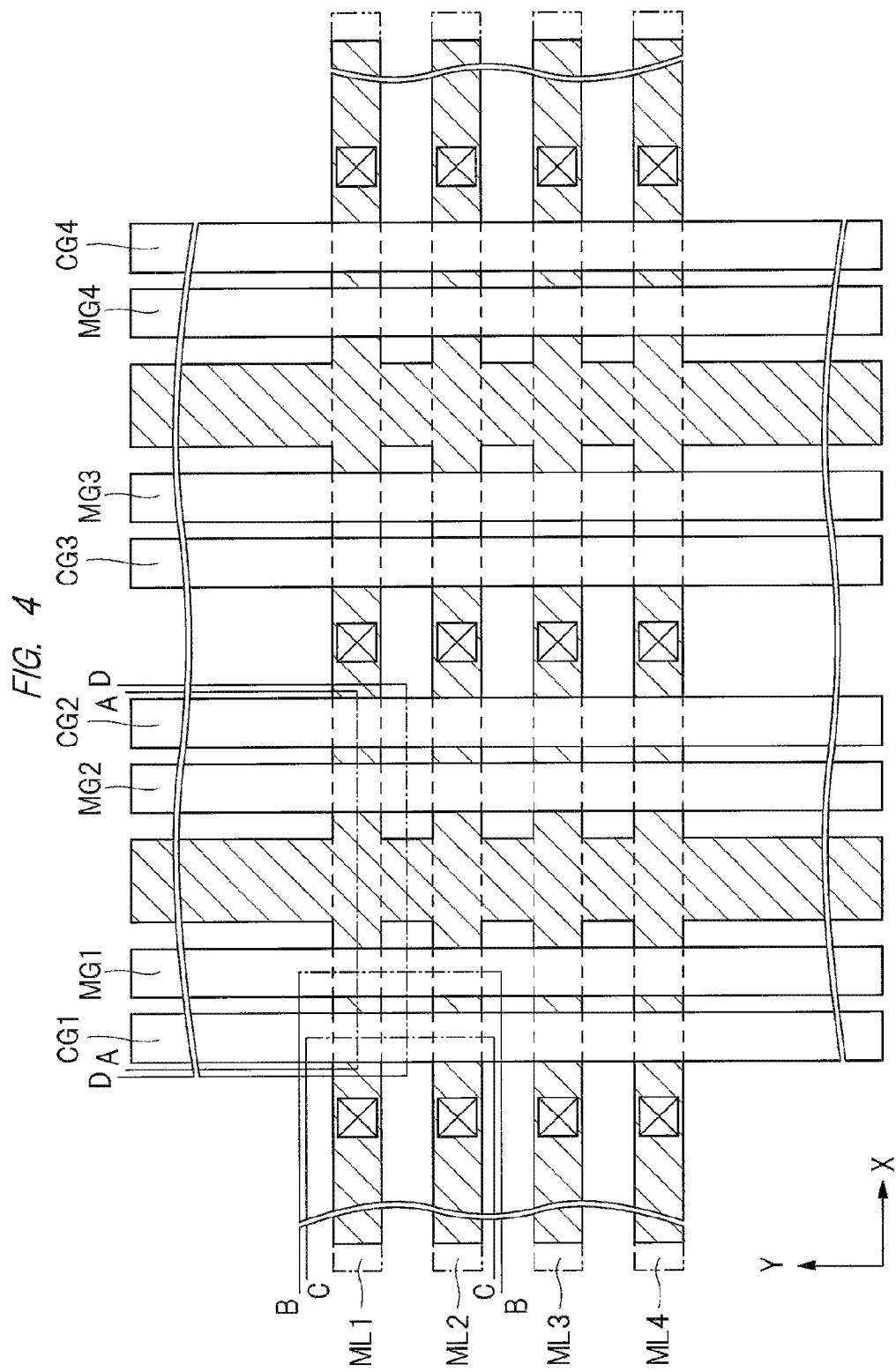
FIG. 4 is a plan view showing a memory array of the semiconductor device according to the first embodiment.
Figure 5:
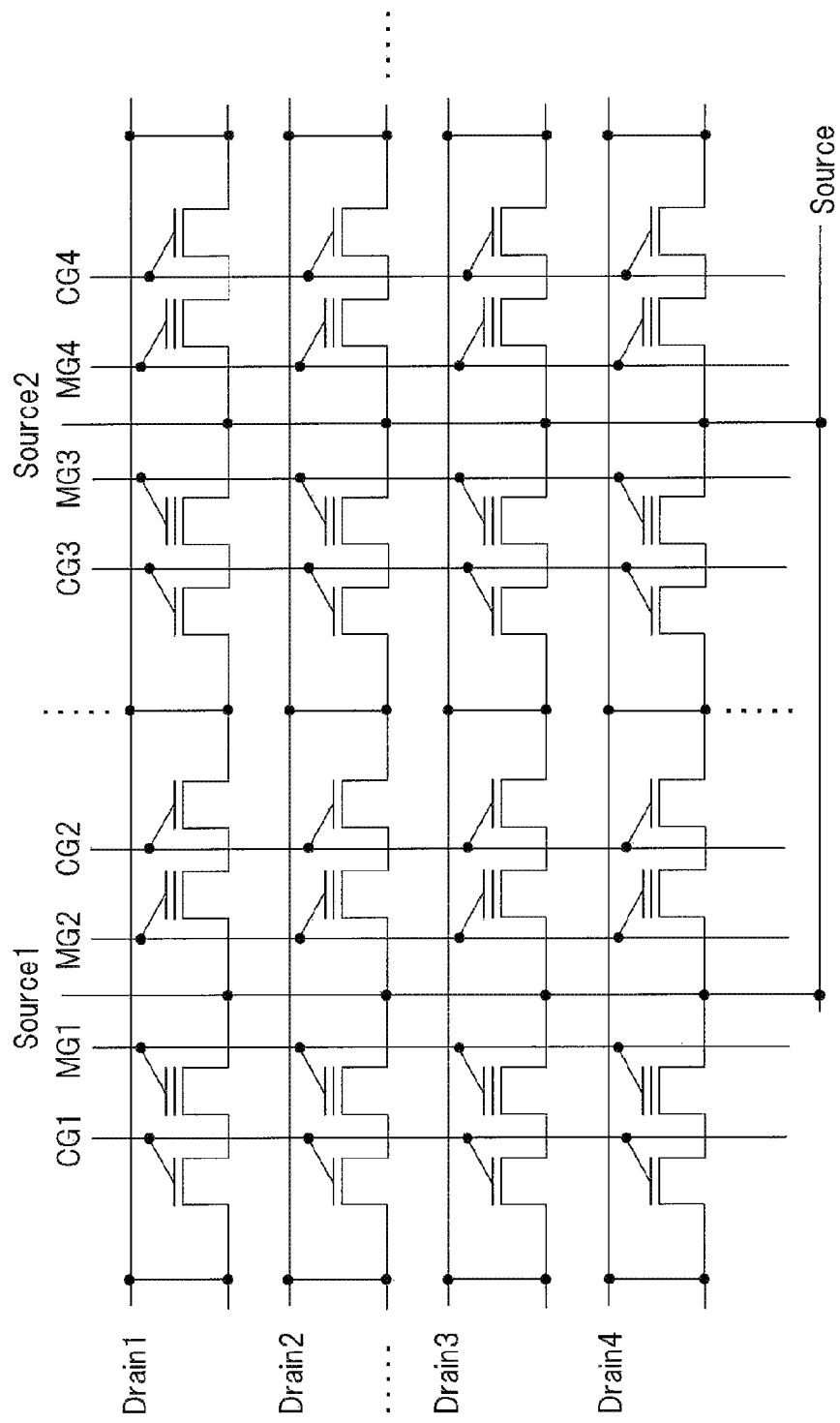
FIG. 5 is a circuit diagram showing a memory array of the semiconductor device according to the first embodiment.
Figure 6:
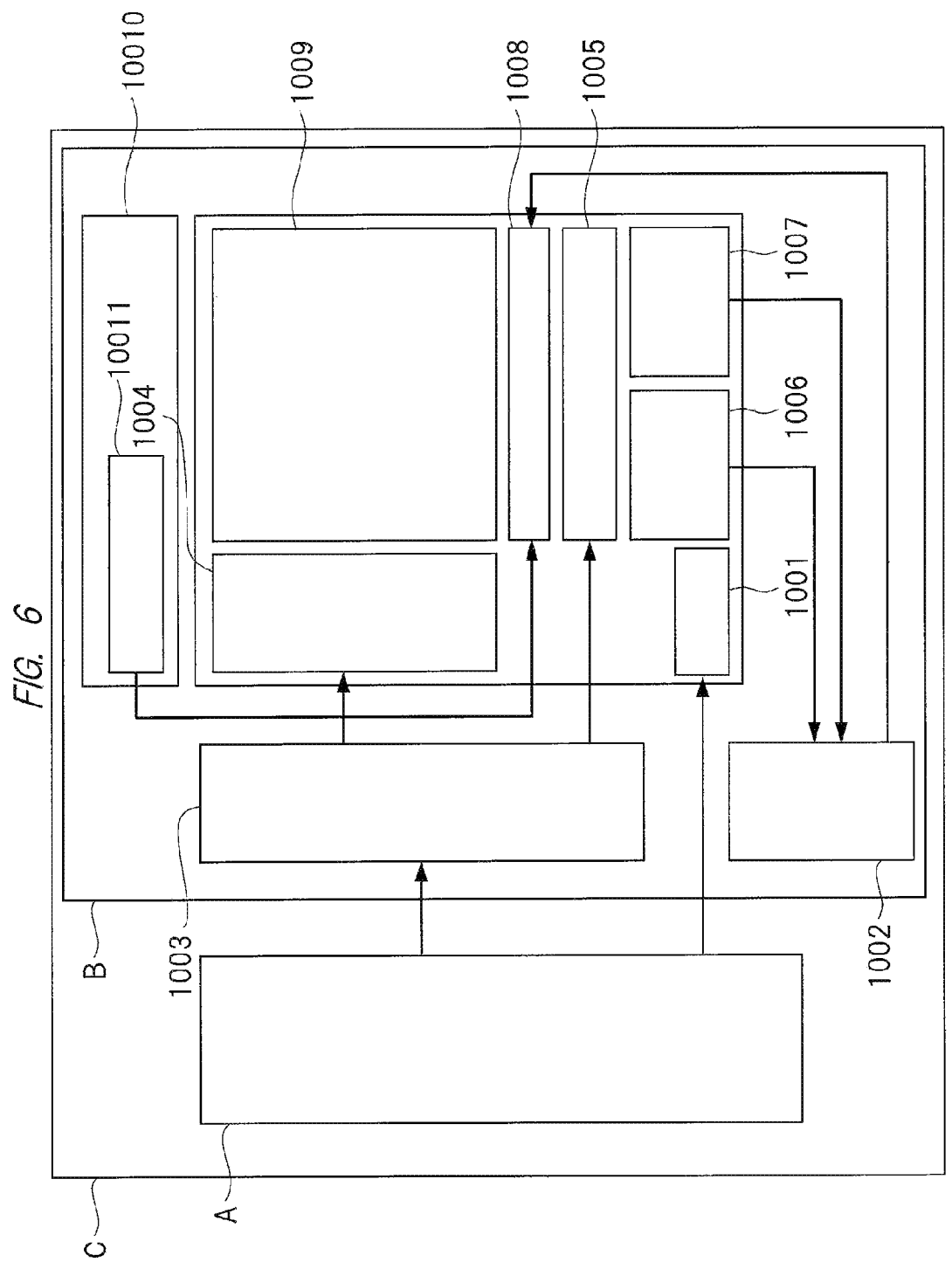
FIG. 6 is a block diagram showing a configuration example of the semiconductor device according to the first embodiment.

FIGS. 1 to 3 are cross-sectional views showing the semiconductor device according to the present embodiment. FIG. 4 is a plan view showing a memory array of the semiconductor device according to the present embodiment. For example, FIG. 1 corresponds to a cross-sectional view taken along line A-A of FIG. 4, FIG. 2 corresponds to cross-sectional views taken along lines B-B and C-C of FIG. 4, FIG. 3 corresponds to a cross-sectional view taken along line D-D of FIG. 4. FIG. 5 is a circuit diagram showing the memory array of the semiconductor device according to the present embodiment. FIG. 6 is a block diagram showing an example of a configuration of the semiconductor device according to the present embodiment.

As shown in FIGS. 1 to 3, the memory cell (a memory element) includes a control transistor having a control gate electrode part CG, and a memory transistor having a memory gate electrode part MG.

More specifically, the memory cell has the control gate electrode part CG placed above a semiconductor substrate 100 (a p-type well PW), and the memory gate electrode part MG placed above the semiconductor substrate 100 (the p-type well PW) and next to the control gate electrode part CG. Each of the control gate electrode part CG and the memory gate electrode part MG is made of, for example, a silicon film. A metal silicide film SIL is formed on the upper side of the silicon film.

The memory cell further has an insulating film 113 placed between the control gate electrode part CG and the semiconductor substrate 100 (the p-type well PW). The insulating film 113 is made of, for example, a silicon oxide film.

The memory cell further has an insulating film ONO (106, 107, 108) placed between the memory gate electrode part MG and the semiconductor substrate 100 (the p-type well PW). The insulating film ONO is formed of, for example, a lower layer insulating film 106, a middle layer insulating film 107 placed on the lower layer insulating film 106, and an upper layer insulating film 108 placed on the middle layer insulating film 107. The middle layer insulating film 107 becomes a charge accumulating part. The lower layer insulating film 106 is made of, for example, a silicon oxide film.

The middle layer insulating film 107 is made of, for example, a silicon nitride film. The upper layer insulating film 108 is made of, for example, a laminated film of a silicon oxynitride film (108a) formed on the middle layer insulating film 107, a silicon nitride film (108b) formed on the silicon oxynitride film (108a), and a silicon oxide film (108c) formed on the silicon nitride film (108b) (see FIG. 36). Note that the upper layer insulating film 108 may be a single layer film (for example, a silicon oxynitride film). However, by using the above-described laminated film as the upper layer insulating film 108, a barrier against hole injection into the memory gate electrode part MG can be decreased, so that the hole is more efficiently injected at the time of the erasing operation described later. The lower layer insulating film 106 may also be a laminated film (for example, a silicon oxide film/a silicon nitride film/a silicon oxide film).

The insulating film ONO (106, 107, 108) is placed between the memory gate electrode part MG and the semiconductor substrate 100 (the p-type well PW), and between the control gate electrode part CG and the memory gate electrode part MG.

The memory cell further has a drain region MD and a source region MS which are formed in the p-type well PW of the semiconductor substrate 100. A side wall insulating film (a sidewall, a side wall spacer) SW made of an insulating film is formed on a side wall part of a composite pattern of the memory gate electrode part MG and the control gate electrode part CG.

The drain region MD is made of an $n^+$-type semiconductor region 119b, and an $n^-$-type semiconductor region 119a. The $n^-$-type semiconductor region 119a is formed to be self aligned with respect to the side wall of the control gate electrode part CG. The $n^+$-type semiconductor region 119b is formed to be self aligned with respect to a side surface of the side wall insulating film SW on the control gate electrode part CG side, and has a deeper junction depth and a higher impurity concentration than those of the $n^-$-type semiconductor region 119a.

The source region MS is made of an $n^+$-type semiconductor region 111b, and an $n^-$-type semiconductor region 111a. The $n^-$-type semiconductor region 111a is formed to be self aligned with respect to the side wall of the memory gate electrode part MG. The $n^+$-type semiconductor region 111b is formed to be self aligned with respect to a side surface of the side wall insulating film SW on the memory gate electrode part MG side, and has a deeper junction depth and a higher impurity concentration than those of the $n^-$-type semiconductor region 111a.

Such a source region (or drain region) formed of a low-concentration semiconductor region and a high-concentration semiconductor region is called a lightly doped drain (LDD) structure.

In the present specification, note that the drain region MD and the source region MS are defined on the basis of an operation time. It is collectively assumed that a semiconductor region to which a low voltage is applied at the time of a reading operation described later is called a source region MS, and that a semiconductor region to which a high voltage is applied at the time of the reading operation is called a drain region MD.

A metal silicide film SIL is formed on the upper side of the drain region MD ($n^+$-type semiconductor region 119b) and of the source region MS ($n^+$-type semiconductor region 111b).

On the memory cell, a silicon oxide film 124 is formed as an interlayer insulating film. On the silicon oxide film 124, a wiring line 125 and others are formed.

Here, the two memory cells shown in FIG. 1 are placed almost symmetric with respect to the source region MS. As described later, note that a plurality of memory cells are further placed in the memory cell region MA. For example, on the left of the memory cell on the left side of the memory cell region MA shown in FIG. 1, a memory cell (not shown) which shares the drain region MD is placed.

A region between the control gate electrode parts CG which sandwich the drain region MD therebetween is assumed to be a region CCA. A region between the memory gate electrode parts MG which sandwich the source region MS therebetween is assumed to be a region MMA. In FIG. 1, the regions CCA are located on both sides of the region MMA. The region MMA includes a region in which the insulating film ONO (106, 107, 108) placed along the side wall of the memory gate electrode part MG is formed.

As described above, a memory cell group (row) is configured by arranging a plurality of memory cells in the right-left direction of FIG. 1 (in the gate length direction) so that the shared source region MS and the shared drain region MD are placed alternately. Also, a memory cell group (column) is formed by arranging a plurality of memory cells in a direction perpendicular to the plane of the sheet of FIG. 1 (in the gate width direction). In this manner, the plurality of the memory cells are formed in an array form. The memory array is described below with reference to FIGS. 4 to 6.

(Memory Array)

As shown in FIG. 4, the control gate electrode part CG (CG1, CG2, CG3, CG4) and the memory gate electrode part MG (MG1, MG2, MG3, MG4) of the memory cell extend in the Y direction (in a direction crossing the A-A cross section, or in a longitudinal direction of FIG. 4).

A plurality of active regions (hatched parts) are provided so as to be lines extending in the X direction, and the lines extending in the X direction are connected to each other by connecting parts extending in the Y direction, respectively. The active region is partitioned by an element isolation region 103, and becomes an exposed region of the p-type well PW (see FIGS. 2 and 3).

The control gate electrode part CG and the memory gate electrode part MG are symmetric with respect to the connecting part described above. A contact part is provided on the active region on the control gate electrode part CG (CG1, CG2, CG3, CG4) side. A wiring line (ML1, ML2, ML3, ML4) is placed in the X direction so as to connect the contact parts placed in line in the X direction. The source region MS is provided in the connecting part and between the connecting parts. Therefore, the region (in the connecting part and between the connecting parts) becomes a source line (Source1, Source2, see FIG. 5) to be described later. The drain region MD is provided below the contact part. Therefore, the wiring line (ML1, ML2, ML3, ML4) is a drain line (Drain1, Drain2, Drain3, Drain4, see FIG. 5) to be described later.

As shown in FIG. 5, the memory cell (the memory transistor, the control transistor) is placed in an array form at the intersection of the source line (Source1, Source2) and the drain line (Drain1, Drain2, Drain3, Drain4).

As shown in FIG. 6, a memory cell array 1009 is provided in a memory section B. The semiconductor device C according to the present embodiment is formed of, for example, the memory section B and a logic section A.

The memory section B is configured of, for example, a control circuit 1001, an input/output circuit 1002, an address buffer 1003, a row decoder 1004, a column decoder 1005, a verification sense amplifier circuit 1006, a high-speed read sense amplifier circuit 1007, a writing circuit 1008, a memory cell array 1009, and a power supply circuit 1010. The control circuit 1001 stores temporarily and controls a control signal which is input from the logic section A. The control circuit 1001 also controls potentials of the control gate electrode part CG and the memory gate electrode part MG of the memory cell in the memory cell array 1009. Various types of data such as data read from the memory cell array 1009 or written to the memory cell array 1009, and program data, are input to and output from the input/output circuit 1002. The address buffer 1003 stores temporarily an address which is input from the logic section A. The row decoder 1004 and the column decoder 1005 are each connected to the address buffer 1003. The row decoder 1004 performs decoding based on a row address output from the address buffer 1003, and the column decoder 1005 performs decoding based on a column address output from the address buffer 1003. The verification sense amplifier circuit 1006 is a sense amplifier used for verification of erasing and writing, and the high-speed read sense amplifier circuit 1007 is a sense amplifier for reading, which is used at the time of data reading. The writing circuit 1008 controls the data writing by latching the written data which is input via the input/output circuit 1002. The power supply circuit 1010 is configured of a voltage generating circuit which generates various voltages used at the time of data writing, erasing, and verification, a current trimming circuit 10011 which generates a voltage of a certain value and which supplies the voltage to the writing circuit, and others.

Note that configurations shown in FIGS. 4 to 6 are examples, and the configuration of the semiconductor device according to the present embodiment is not limited to these examples.

Figure 7:
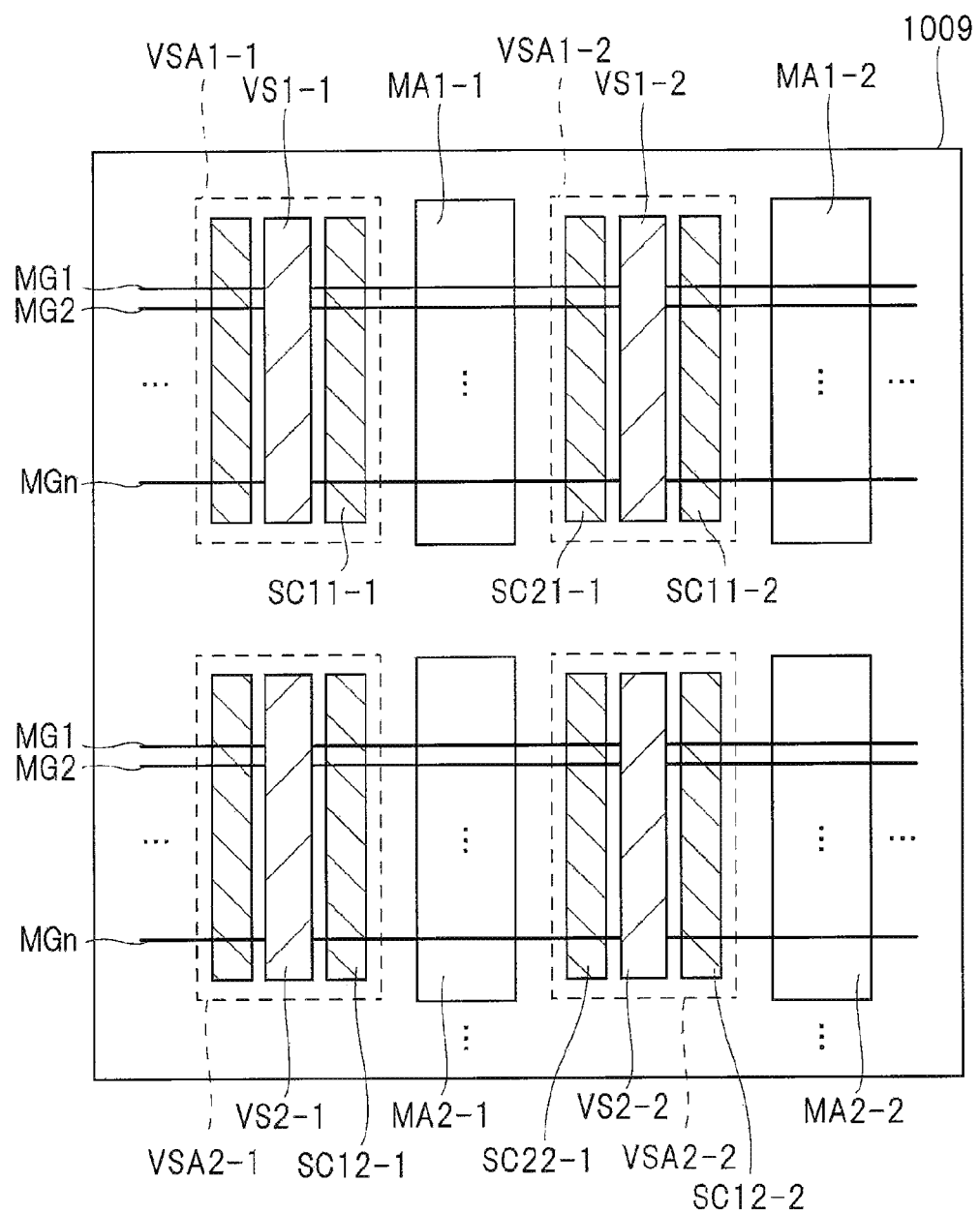
FIG. 7 is a block diagram showing a configuration of a memory array of the semiconductor device according to the first embodiment.
Figure 8:
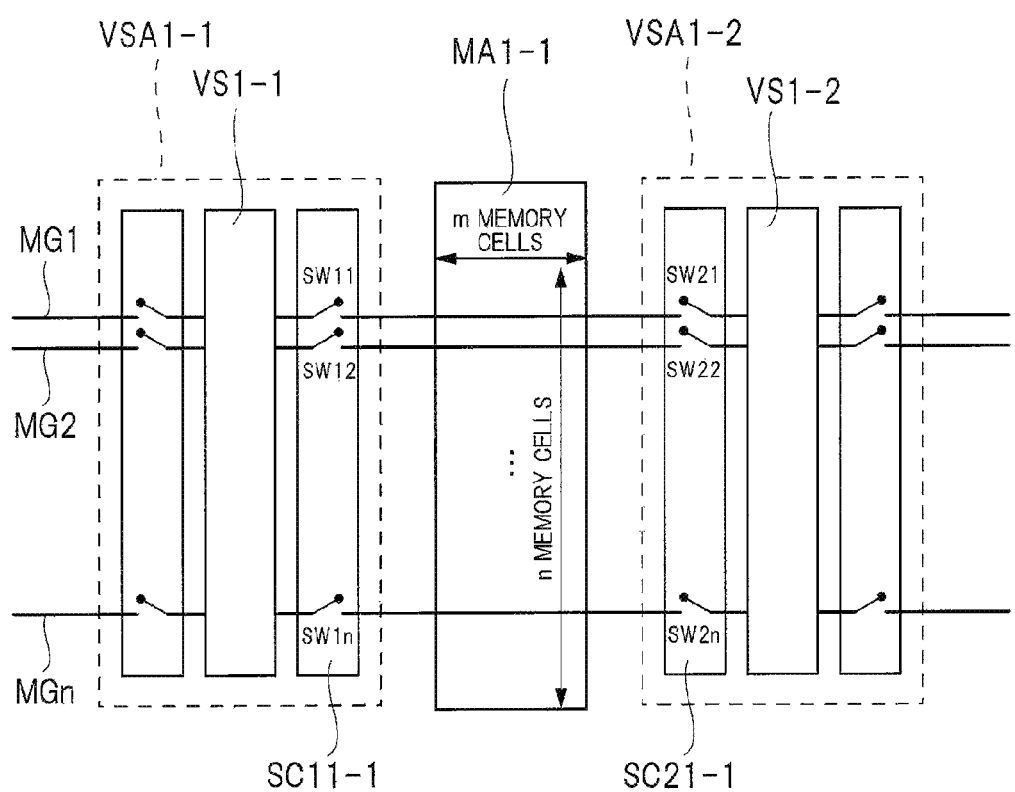
FIG. 8 is a block diagram showing a configuration of a part of a memory array of the semiconductor device according to the first embodiment.

FIG. 7 is a block diagram showing a configuration of the memory array of the semiconductor device according to the present embodiment. FIG. 8 is a block diagram showing a configuration of a part of the memory array of the semiconductor device according to the present embodiment. As shown in FIGS. 7 and 8, the memory cell array (1009) includes a plurality of the memory cell regions MA. In other words, the memory cell array (1009) can be divided into a plurality of the memory cell regions (sub-block regions) MA. FIG. 7 shows four memory cell regions MA (MA1-1, MA1-2, MA2-1, MA2-2). Each memory cell region MA is made of, for example, m×n memory cells. Note that a symbol following the reference character "MA" denotes an individual memory cell region. The same goes for other reference characters such as VSA, VS, SW1, and SW2.

A voltage supply circuit region VSA is provided on both sides of the memory cell region MA. In other viewpoint, the voltage supply circuit region VSA is provided between the memory cell regions MA.

A voltage supply circuit VS and switch circuits SC1, SC2 are provided in the voltage supply circuit region VSA. The voltage supply circuit VS is a circuit which supplies a predetermined voltage to the memory cell. A plurality of switch elements (SW11 to SW1n) are provided in the switch circuit SC1. Also, a plurality of switch elements (SW21 to SW2n) are provided in the switch circuit SC2 (FIG. 8). The switch element is made of, for example, a MISFET. Note that a combination (a circuit) of a plurality of elements may be used as the switch element.

FIG. 7 shows four voltage supply circuit regions VSA (VSA 1-1, VSA 1-2, VSA 2-1, VSA 2-2).

The switch circuit SC1 is provided on one side (on the left side in FIG. 7) of the memory cell region MA. In other words, the switch circuit SC1 is provided between the memory cell region MA and the voltage supply circuit VS. For example, the switch circuit SC11-1 is provided between the memory cell region MA1-1 and the voltage supply circuit VS1-1. A plurality of switch elements SW11 to SW1n are provided in the switch circuit SC11-1. More specifically, the switch elements SW11 to SW1n are provided between the memory gate electrode part MG1, MG2, . . . MGn of the memory cell region MA1-1 and the voltage supply circuit VS1-1 (FIG. 8). By selectively turning on the switch element SW11 to SW1n, a voltage can be supplied to only a selected memory gate electrode part among the memory gate electrode parts MG1, MG2, . . . MGn. Of course, all the switch elements SW11 to SW1n can be turned on so that a voltage can be supplied to all the memory gate electrode parts MG1, MG2, . . . MGn in the memory cell region MA. The address buffer 1003, the row decoder 1004, and the column decoder 1005 control turning on and off the switch element SW11 to SW1n.

The switch circuit SC2 is provided on the other side (on the right side in FIG. 7) of the memory cell region MA. In other words, the switch circuit SC2 is provided between the memory cell region MA and the voltage supply circuit VS next thereto. For example, the switch circuit SC21-1 is provided between the memory cell region MA1-1 and the voltage supply circuit VS1-2. A plurality of switch elements SW21 to SW2n are provided in the switch circuit SC21-1. More specifically, the switch elements SW21 to SW2n are provided between the memory gate electrode part MG1, MG2, . . . MGn of the memory cell region MA1-1 and the voltage supply circuit VS1-2 next thereto (FIG. 8). By selectively turning on the switch element SW21 to SW2n, a voltage can be supplied to only a selected memory gate electrode part among the memory gate electrode parts MG1, MG2, . . . MGn. Of course, all the switch elements SW21 to SW2n can be turned on so that a voltage can be supplied to all the memory gate electrode parts MG1, MG2, . . . MGn in the memory cell region MA. The address buffer 1003, the row decoder 1004, the column decoder 1005, and others control turning on and off the switch element SW21 to SW2n.

As described above, the switch circuits SC1, SC2 is provided on both sides of the memory cell region MA. The switch elements SW11 to SW1n are connected to an end portion (1S) on one side (on the left side in FIGS. 7 and 8) of the memory gate electrode parts MG1, MG2, . . . MGn of the memory cell region MA. The switch elements SW21 to SW2n are connected to an end portion (2S) on the other side (on the right side in FIGS. 7 and 8) of the memory gate electrode parts MG1, MG2, . . . MGn of the memory cell region MA.

In other words, the memory gate electrode parts MG1, MG2, MGn of the memory cell region MA are connected to one voltage supply circuit VS1-1 via the switch element SW11 to SW1n in one end portion (1S), and the memory gate electrode parts MG1, MG2, . . . MGn of the memory cell region MA are connected to another voltage supply circuit VS1-2 via the switch element SW21 to SW2n in the other end portion (2S) (FIG. 8).

Different potentials can be applied to both end portions (1S and 2S) of the linear-arranged memory gate electrode part MG by providing the voltage supply circuit VS on both sides of the memory gate electrode part MG1, MG2, . . . MGn so as to provide connection via the switch elements (SW11 to SW1n, SW21 to SW2n) as described above, so that a current can flow through the memory gate electrode part MG. In other words, a potential gradient is provided to the memory gate electrode part MG, so that a current can flow through the memory gate electrode part MG. As a result, the memory gate electrode part MG can be heated.

(Operation)

Figure 9:
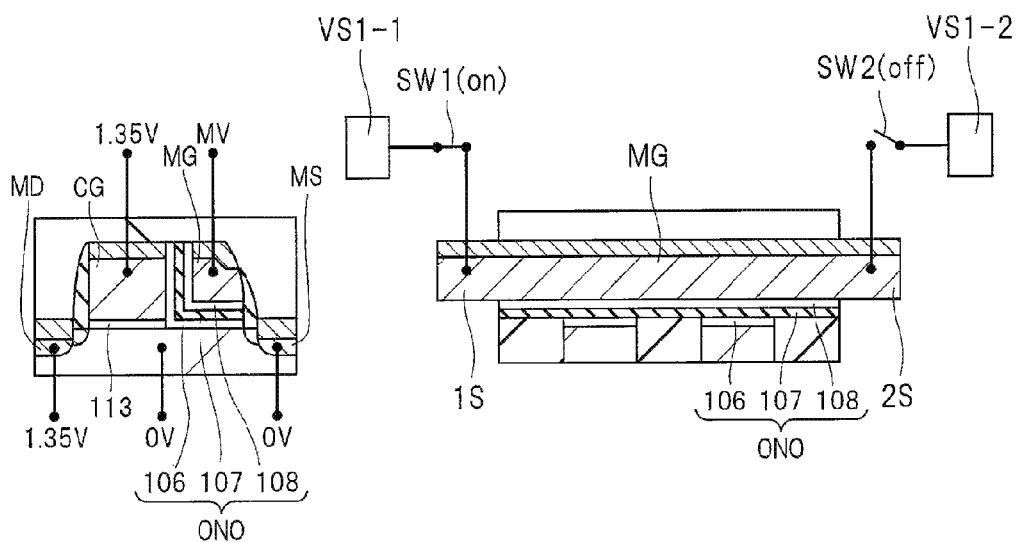
FIG. 9 is a cross-sectional view showing schematically a reading operation according to the first embodiment.
Figure 10:
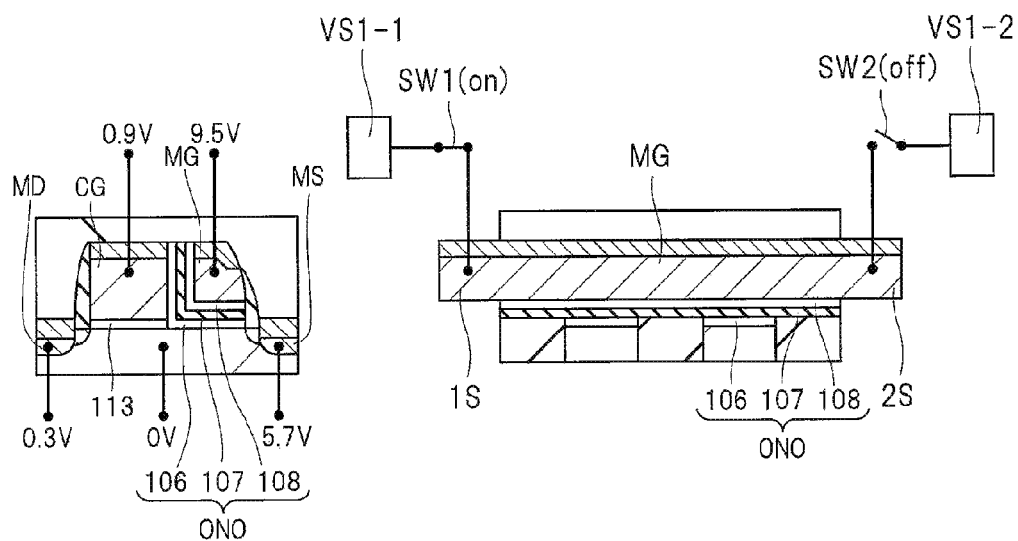
FIG. 10 is a cross-sectional view showing schematically a writing operation according to the first embodiment.

Next, an example of a basic operation (a driving method) of the memory cell is described. As the operations of the memory cell, three operations of the memory cell (1) reading operation, (2) writing operation, and (3) erasing operation are described. However, these operations have various definitions, and, particular, the erasing operation and the writing operation may be defined to be opposite to each other. FIG. 9 is a cross-sectional view showing schematically a reading operation according to the present embodiment. FIG. 10 is a cross-sectional view showing schematically a writing operation according to the present embodiment.

(1) Reading Operation

A case of reading stored information (data) of one cell (selected cell) of the memory cell region MA (for example, MA1-1) is described.

When the stored information of the selected cell of the memory cell region MA (for example, MA1-1) is read, the switch circuit SC11-1 is activated (enabled) while the switch circuit SC21-1 is inactivated (disenabled, see FIGS. 7 and 8). Here, the activation of the switch circuit SC11-1 means a state that all or a (some) switch element(s) SW11 to SW1n can be turned on. In other words, the activation thereof means a state that the switch elements SW11 to SW1n can be selectively turned on. The inactivation of the switch circuit SC21-1 means a state that none of the switch elements SW21 to SW2n can be turned on. In other words, the inactivation thereof means a state that all the switch elements SW21 to SW2n are off.

As shown in the right drawing of FIG. 9, the switch element SW1 connected to the memory gate electrode part MG of the selected cell is turned on, while the switch element SW2 is turned off. In other words, a potential is supplied to the memory gate electrode part MG of the selected cell from only the voltage supply circuit VS1-1 on one side (on the left side in FIGS. 7, 8, and 9) of the memory cell region MA1-1, while a potential is not supplied to the memory gate electrode part MG of the selected cell from the voltage supply circuit VS1-2 on the other side (on the right side in FIGS. 7, 8, and 9) of the memory cell region MA1-1.

Then, for example, as shown in the left drawing of FIG. 9, a positive potential of about 1.35 V is applied to the drain region MD on the control gate electrode part CG side of the selected cell, while a potential of 0 V is applied to the source region MS on the memory gate electrode part MG side, and to the semiconductor substrate (100, the p-type well PW). And, a positive potential of about 1.35 V is applied to the control gate electrode part CG, so that a channel below the control gate electrode part CG is turned on. The accumulated charge information is read as a current by setting the memory gate electrode part MG to a predetermined potential (that is, an intermediate potential between thresholds of a writing state and an erasing state). Here, by setting the intermediate potential between thresholds of the writing state and the erasing state to 0 V, it is not required to boost a voltage applied to the memory gate electrode part MG in the power supply circuit, so that the reading speed can be increased.

(2) Writing Operation

A case of writing information (data) to be stored in one cell (selected cell) of the memory cell region MA (for example, MA1-1) is described.

When the stored information (data) is written in a selected cell of the memory cell region MA (for example, MA1-1), the switch circuit SC11-1 is activated (enabled), while the switch circuit SC21-1 is inactivated (disenabled, see FIGS. 7 and 8).

As shown in the right drawing of FIG. 10, the switch element SW1 connected to the memory gate electrode part MG of the selected cell is turned on, while the switch element SW2 is turned off. In other words, a potential is supplied to the memory gate electrode part MG of the selected cell from only the voltage supply circuit VS1-1 on one side (on the left side in FIGS. 7, 8, and 9) of the memory cell region MA1-1, while a potential is not supplied to the memory gate electrode part MG of the selected cell from the voltage supply circuit VS1-2 on the other side (on the right side in FIGS. 7, 8, and 9) of the memory cell region MA1-1.

Then, for example, as shown in the left drawing of FIG. 10, a voltage of 9.5 V is applied to the memory gate electrode part MG, a voltage of 0.9 V is applied to the control gate electrode part CG, a voltage of 5.7 V is applied to the source region MS on the memory gate electrode part MG side, and a potential such as 0.3 V lower than that of the source region is applied to the drain region MD on the control gate electrode part CG side. The semiconductor substrate (100, the p-type well PW) is at 0 V. In this manner, electrons are injected intensively into the end portion of the memory gate electrode part MG, the end portion being on the control gate electrode part CG side. This method of injection is called a source side hot electron injection (SSI) method.

Figure 11:
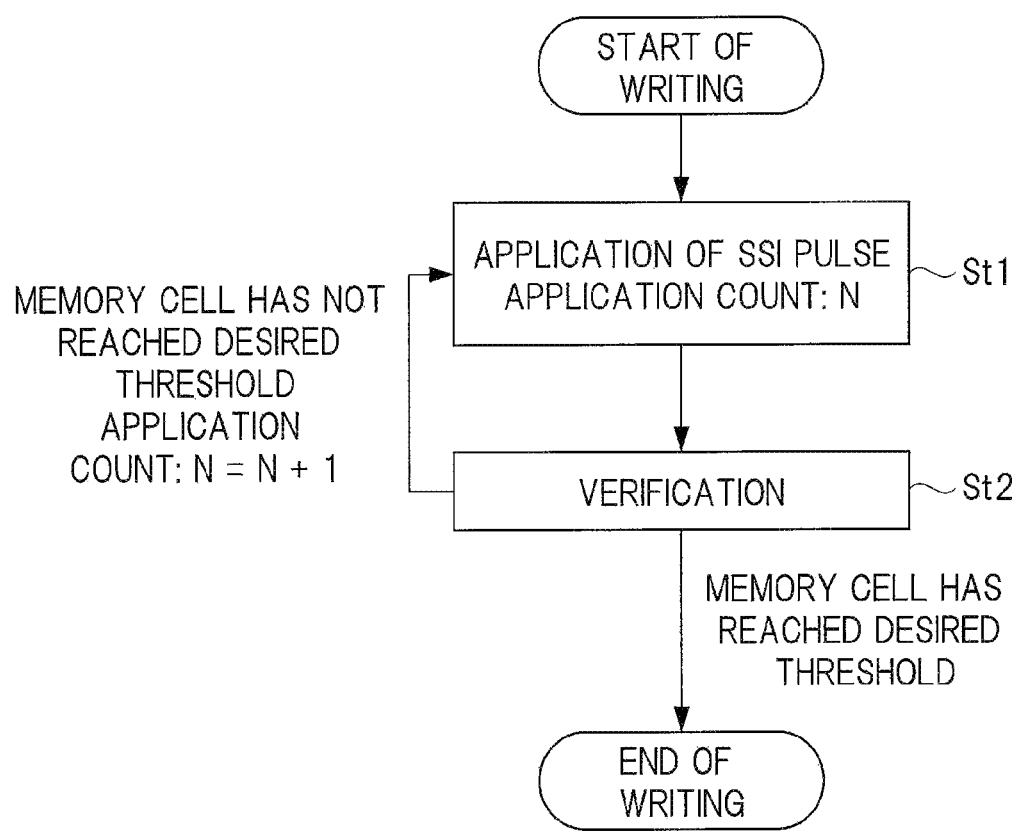
FIG. 11 is a diagram showing a flow from a start to an end of writing.

FIG. 11 is a diagram showing a flow from a start to an end of writing. In the drawing showing the flow, note that a reference character "St" denotes a step (a process, a period). As shown in FIG. 11, the writing is performed by (St1) applying an SSI pulse so as to inject an electron into the charge accumulating part (107), and then, it is verified whether or not the memory cell has reached a desired threshold by (St2) a verification operation. When the memory cell has not reached the desired threshold, the SSI pulse is applied again. As described above, the operation of verification and the application of the SSI pulse are repeated until the memory cell has reached the desired threshold. When the memory cell has reached the desired threshold, the writing ends. A reference character "N" in FIG. 11 denotes the pulse number.

A writing condition used when the writing is further performed (N>1) after the verification subsequent to the first writing (N=1) is not necessarily the same as that of the first writing. A first example of a writing pulse is shown in FIG. 12. As shown in FIG. 12, in the first writing (N=1), the memory gate electrode part MG is at 9.5 V, the control gate electrode part CG is at 0.9 V, the source region MS is at 5.7 V, the drain region MD is at 0.3 V, and the p-type well PW (Well) is at 0 V. In the second and following writing (N>1), the memory gate electrode part MG is at 11 V, the control gate electrode part CG is at 0.9 V, the source region MS is at 4.9 V, the drain region MD is at 0.3 V, and the p-type well PW (Well) is at 0 V.

A second example of a writing pulse is shown in FIG. 13. As shown in FIG. 13, a negative potential may be applied to the p-type well PW (Well). As shown in FIG. 13, in the first writing (N=1), the memory gate electrode part MG is at 9.5 V, the control gate electrode part CG is at 1.5 V, the source region MS is at 5.7 V, the drain region MD is at 0.3 V, and the p-type well PW (Well) is at −1 V. In the second and following writing (N>1), the memory gate electrode part MG is at 11 V, the control gate electrode part CG is at 1.5 V, the source region MS is at 4.9 V, the drain region MD is at 0.3 V, and the p-type well PW (Well) is at −1 V. In this case, potential differences between the source region MS and the p-type well PW (Well), and between the memory gate electrode part MG and the p-type well PW (Well) can be increased, and therefore, the writing speed can be increased.

(3) Erasing Operation

A case of erasing stored information (data) of a plurality of cells (selected cells) connected to one memory gate electrode part MG of the memory cell region MA (for example, MA1-1) is described. For example, in FIG. 4, the term "the plurality of the cells connected to one memory gate electrode part MG" means a group of a plurality of memory cells (a memory cell column) arranged in the Y direction, and means a plurality of cells connected to one memory gate electrode part (a memory gate line such as MG1) shown in FIG. 5.

The erasing operation according to the present embodiment includes a step of causing a current to flow through the memory gate electrode part MG to heat the memory gate electrode part MG. That is, as described above, the memory gate electrode part MG is heated by applying different potentials to the both end portions (1S and 2S) of the linearly-arranged memory gate electrode part MG by using the voltage supply circuit VS provided on both sides of the memory cell region MA.

Figure 14:
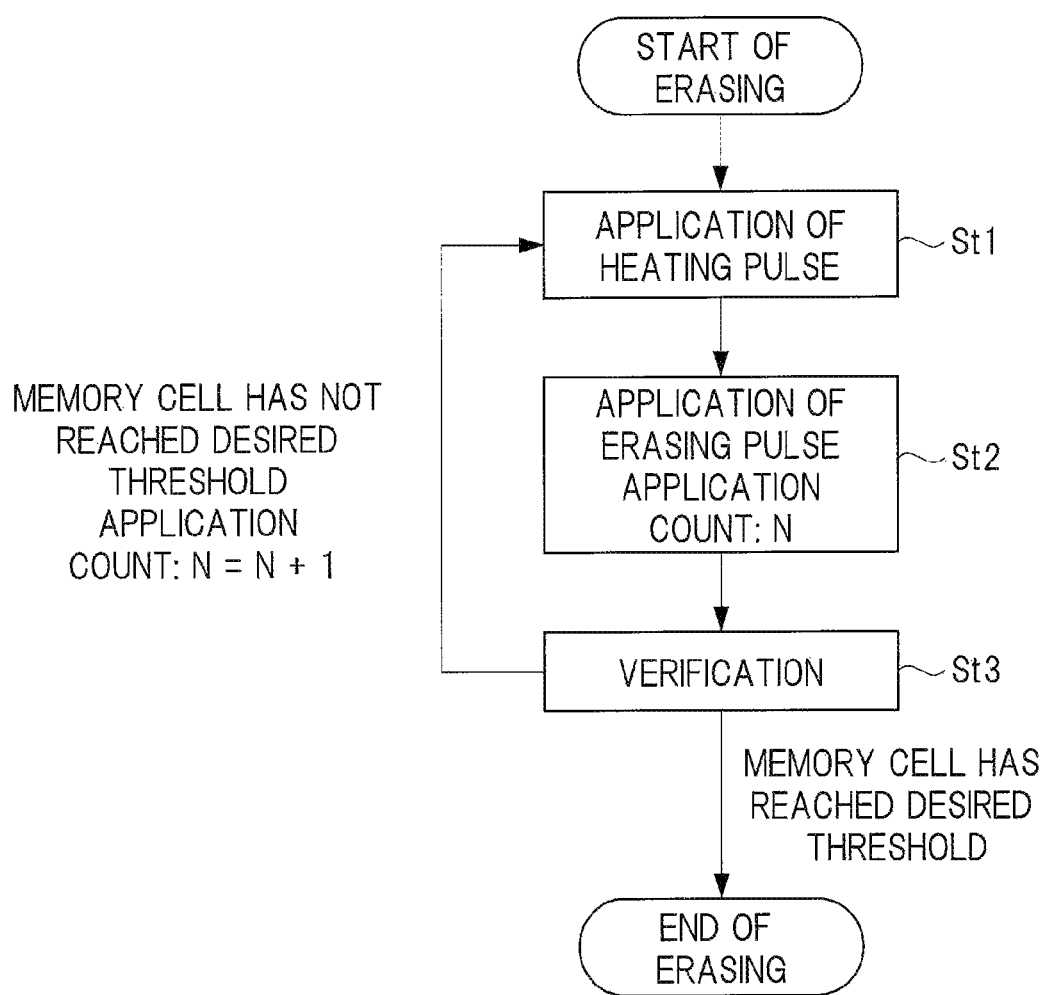
FIG. 14 is a diagram showing a flow from a start to an end of erasing according to the first embodiment.

FIG. 14 is a diagram showing a flow from a start to an end of erasing according to the present embodiment. FIG. 15 is a cross-sectional view showing schematically an erasing operation according to the present embodiment.

As shown in FIG. 14, a heating pulse is applied to the memory gate electrode part MG (St1). That is, the switch circuit SC11-1 is activated (enabled), and also the switch circuit SC21-1 is activated (enabled, see FIGS. 7 and 8). Subsequently, an erasing pulse is applied to the memory gate electrode part MG (St2) to inject a hole into the charge accumulating part (107), so that the erasing operation is performed, and then, it is verified by a verification operation (St3) whether or not the memory cell has reached a desired threshold.

For example, as shown in the right and left drawings of FIG. 15 (St1), the switch elements SW1 and SW2 connected to the memory gate electrode part MG of the selected cell are turned on. In other words, a potential is supplied to the end portion 1S of the memory gate electrode part MG of the selected cell from the voltage supply circuit VS1-1 on one side (on the left side of the drawing) of the memory cell region MA1-1, and a potential is supplied to the end portion 2S of the memory gate electrode part MG of the selected cell from the voltage supply circuit VS1-2 on the other side (on the right side of the drawing) of the memory cell region MA1-1. More specifically, a voltage of a first potential (for example, 1 V) is applied to the end portion 1S of the memory gate electrode part MG of the memory cell region MA, and a voltage of a second potential (for example, 0 V) lower than the first potential is applied to the second end portion 2S of the memory gate electrode part MG. In this manner, a current "i" is caused to flow through the selected memory gate electrode part MG of the memory cell region MA, so that Joule heat can be generated. In this manner, the selected cell of the memory cell region MA can be heated.

Next, as shown in the right drawing of FIG. 15 (St2), the switch element SW1 connected to the memory gate electrode part MG of the selected cell is turned on, while the switch element SW2 connected thereto is turned off. In other words, a potential is supplied to the memory gate electrode part MG of the selected cell from only the voltage supply circuit VS1-1 on one side (on the left side of the drawing) of the memory cell region MA1-1, while a potential is not supplied to the memory gate electrode part MG of the selected cell from the voltage supply circuit VS1-2 on the other side (on the right side of the drawing) of the memory cell region MA1-1.

Then, for example, as shown in the left drawing of FIG. 15 (St2), a voltage of 1.3 V is applied to the memory gate electrode part MG, a voltage of 0 V is applied to the control gate electrode part CG, a voltage of 0 V is applied to the source region MS on the memory gate electrode part MG side, and a voltage of 0 V is applied to the drain region MD on the control gate electrode part CG side. In this manner, a hole "h" is injected by the FN tunneling phenomena from the memory gate electrode part MG side into a silicon nitride film 107 (the charge accumulating part), so that the erasing operation is performed (FN tunnel method). However, the drain region MD on the control gate electrode part CG side may be electrically opened. Also, a potential of about 1 V may be applied to the control gate electrode part CG. As described above, a hole "h" is injected from the memory gate electrode part MG into a silicon nitride film 107 (the charge accumulating part), so that the data of the plurality of cells (selected cells) connected to the memory gate electrode part MG can be collectively erased.

Then, as shown in FIG. 14, by the verification operation (St3), it is verified whether or not the memory cell has reached a desired threshold. When the memory cell has not reached the desired threshold, the heating pulse (St1) and the erasing pulse (St2) are applied again. As described above, the application of the heating pulse (St1), the application of the erasing pulse (St2), and the verification operation (St3) are repeated until the memory cell has reached the desired threshold. When the memory cell has reached the desired threshold, the erasing operation ends.

An erasing condition used when the erasing is further performed (N>1) after the verification subsequent to the first erasing (N=1) is not necessarily the same as that of the first erasing. A first example of an erasing pulse is shown in FIG. 16. As shown in FIG. 16, in the first erasing (N=1), the memory gate electrode part MG is at 13 V, the control gate electrode part CG is at 0 V, the source region MS is at 0 V, the drain region MD is at 0 V, and the p-type well PW (Well) is at 0 V. In the second and following erasing (N>1), the memory gate electrode part MG is at 14 V, the control gate electrode part CG is at 0 V, the source region MS is at 0 V, the drain region MD is at 0 V, and the p-type well PW (Well) is at 0 V.

A second example of an erasing pulse is shown in FIG. 17. As shown in FIG. 17, a negative potential may be applied to the p-type well PW (Well). As shown in FIG. 17, in the first erasing (N=1), the memory gate electrode part MG is at 11 V, the control gate electrode part CG is at 0 V, the source region MS is at −1 V, the drain region MD is at −1 V, and the p-type well PW (Well) is at −1 V. In the second and following erasing (N>1), the memory gate electrode part MG is at 13 V, the control gate electrode part CG is at 0 V, the source region MS is at −1 V, the drain region MD is at −1 V, and the p-type well PW (Well) is at −1 V. In this case, a potential difference between the memory gate electrode part MG and the p-type well PW (Well) is larger than a potential difference between the memory gate electrode part MG and the control gate electrode part CG. Therefore, a hole is easily injected into the charge accumulating part (107) below the memory gate electrode part MG, and therefore, electrons in the charge accumulating part (107) are efficiently erased.

In the present embodiment, the erasing operation is performed for each single line of the memory gate electrode part MG. However, of course, the data of the memory cells in the memory cell region MA may be collectively erased by selecting all the memory gate electrode parts MG of the memory cell region MA. Furthermore, a plurality of the memory cell regions MA may be collectively erased.

As described above, in the present embodiment, the step (St1) of applying the heating pulse to the memory gate electrode part MG is provided in the erasing operation to heat the memory gate electrode part MG, and therefore, the erasing speed can be improved. That is, by heating the memory cell by applying the heating pulse, the rate of hole conduction of a hole injected from the memory gate electrode part MG is accelerated. In this manner, the erasing speed can be improved.

By heating the memory gate electrode part MG in the configuration of the memory cell according to the present embodiment, the film which contributes to the hole conduction such as the upper layer insulating film 108 and the middle layer insulating film 107 (the charge accumulating part) of the insulating film ONO positioned below the memory gate electrode part MG can be efficiently heated. For example, when a silicon film is used as the memory gate electrode part MG and a silicon oxide film is used as the insulating film 113, the silicon oxide film has a lower thermal conductivity than that of the silicon film. When such an insulating film 113 having the low thermal conductivity is in contact with the memory gate electrode part MG, heat conduction is decreased by causing a current to flow through the semiconductor substrate 100 and heating from the semiconductor substrate 100.

On the other hand, in the present embodiment, the film which contributes to the hole conduction can be efficiently heated by heating the memory gate electrode part MG. In addition, the memory gate electrode part MG can be efficiently heated since the memory gate electrode part MG is surrounded by a silicon oxide film 124 having a relatively low thermal conductivity.

The erasing process using the FN tunneling method has opposite temperature characteristics to the erasing process using a BTBT method. That is, the erasing characteristics in the FN tunneling method deteriorate at a low temperature, while the erasing characteristics in the BTBT method deteriorate at a high temperature. Therefore, when the FN tunneling method is used, it is preferred to apply the heating of the memory gate electrode part MG. Note that the BTBT method is a method of performing the erasing by generating a hot hole on the p-type well PW (Well) side by band-to-band tunneling, and then, injecting the hot hole into the charge accumulating part (107).

When a film containing nitrogen (a nitride film or an oxynitride film) is included in the insulating film ONO, the erasing characteristics tends to be affected by temperature. Therefore, when the upper layer insulating film 108 and the middle layer insulating film 107 (the charge accumulating part) includes a film containing nitrogen, it is preferred to apply the heating of the memory gate electrode part MG.

Figure 18:
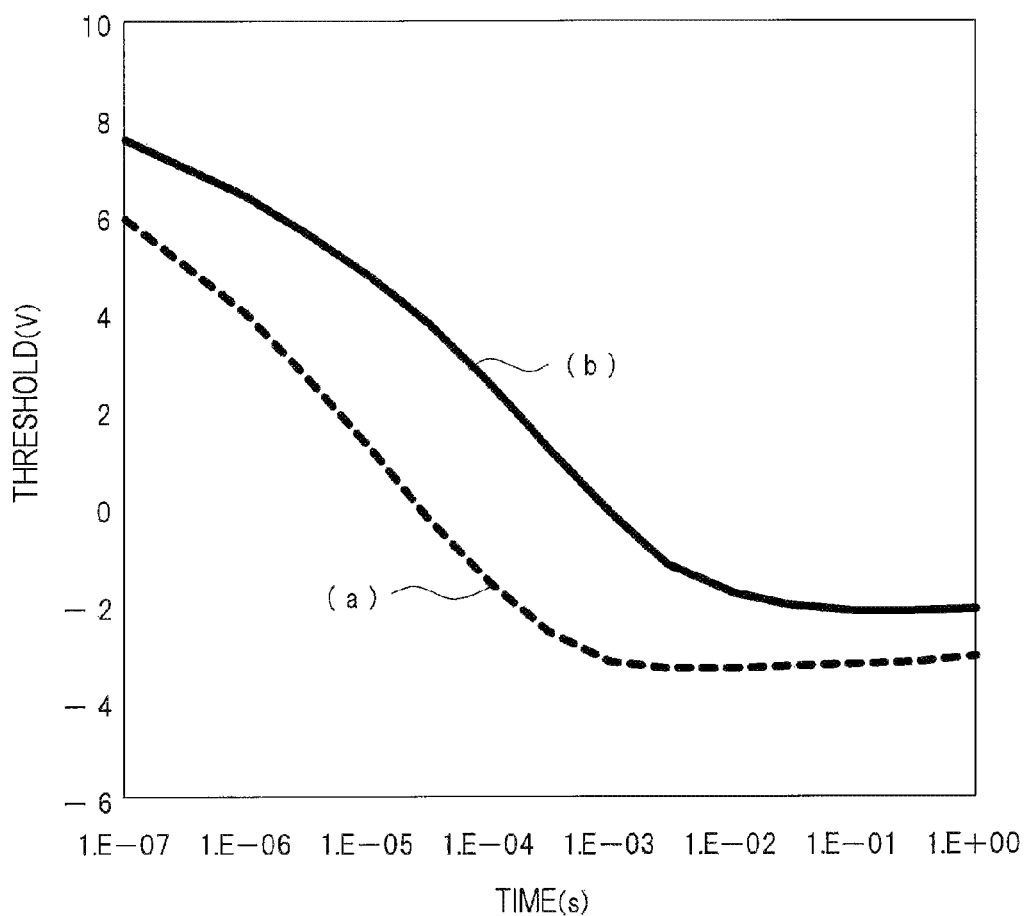
FIG. 18 is a graph showing erasing characteristics of a memory cell at in a case of application of a step of applying a heating pulse.

FIG. 18 is a graph showing erasing characteristics of a memory cell at the time of using a step of applying a heating pulse. A vertical axis shows a threshold [V] of the memory cell, and a horizontal axis shows time [s]. A line (a) represents a graph obtained when the step of applying the heating pulse is applied. A line (b) represents a graph obtained when a conventional erasing operation is performed without applying the step of applying the heating pulse. As shown in the drawing, in the graph (a) obtained when the step of applying the heating pulse is applied, the decrease rate of the threshold, i.e. the erasing speed, is improved more than that in the case of the graph (b).

Figure 19:
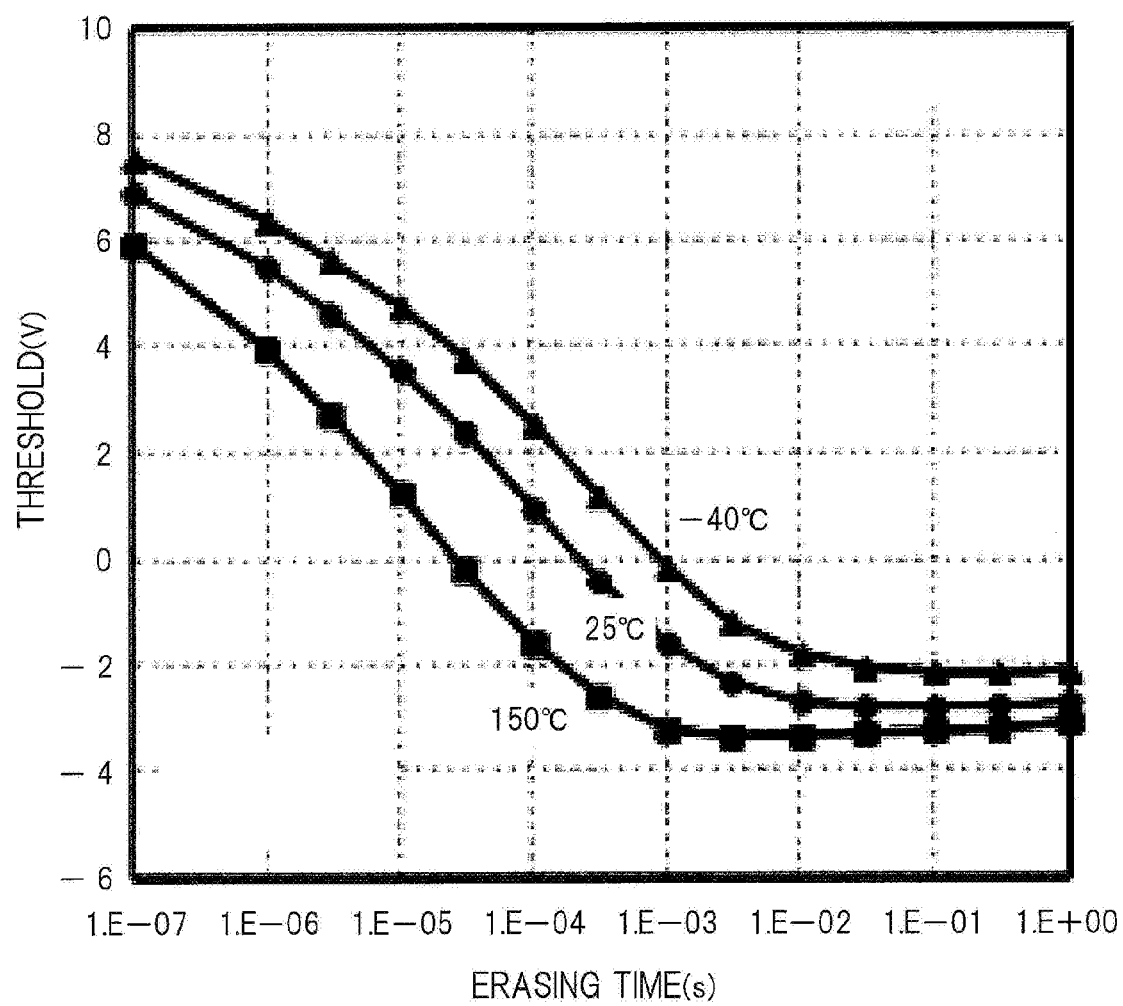
FIG. 19 is a graph showing a temperature change of the erasing characteristics in the FN tunneling method.

FIG. 19 is a graph showing a temperature change of the erasing characteristics in the FN tunneling method. A vertical axis shows a threshold [V] of the memory cell, and a horizontal axis shows erasing time [s]. As shown in the drawing, when a conventional erasing operation is performed without applying the heating pule, using the semiconductor device shown in FIG. 1, the erasing time is longer as the temperature is lower to be 150° C., 25° C., and −40° C. On the other hand, by heating the memory cell by applying the heating pulse as described in the present embodiment, the erasing time can be improved even at a low temperature.

Moreover, according to the present embodiment, the deterioration of the insulating film ONO (the lower layer insulating film 106, the middle layer insulating film 107, and the upper layer insulating film 108) can be thermally recovered by heating. Particularly, by the thermal recovery of the deterioration of the lower layer insulating film 106, an interface state caused by the deterioration of the lower layer insulating film 106 can be decreased. In addition, this manner can reduce a leak amount of charges (here, electrons) having been accumulated in the middle layer insulating film (the charge accumulating part 107) to the memory gate electrode part MG side through the upper layer insulating film 108. In this manner, the retention characteristics of the memory cell can be improved.

Further, by the heating at the time of the erasing operation, the localization of the electrons accumulated in the middle layer insulating film (the charge accumulating part 107) and of the injected holes is canceled, so that the distribution of the charges (the electrons, and the holes) can be equalized. Each of the electrons and the holes is diffused as described above to cause the pair annihilation, so that the erasing characteristics can be improved.

When injection positions of the electrons and the holes are mismatched with each other, there is a risk of recoupling of the remaining electrons and holes after the mismatch (for example, at the time of or after rewriting), which results in degradation of the writing characteristics and the retention characteristics. On the other hand, in the present embodiment, each of the electrons and the holes is diffused to cause the pair annihilation by the heating at the time of the erasing operation, so that the mismatch of injection positions of the electrons and the holes can be resolved. Therefore, the writing characteristics and the retention characteristics can be improved.

Figure 20A:
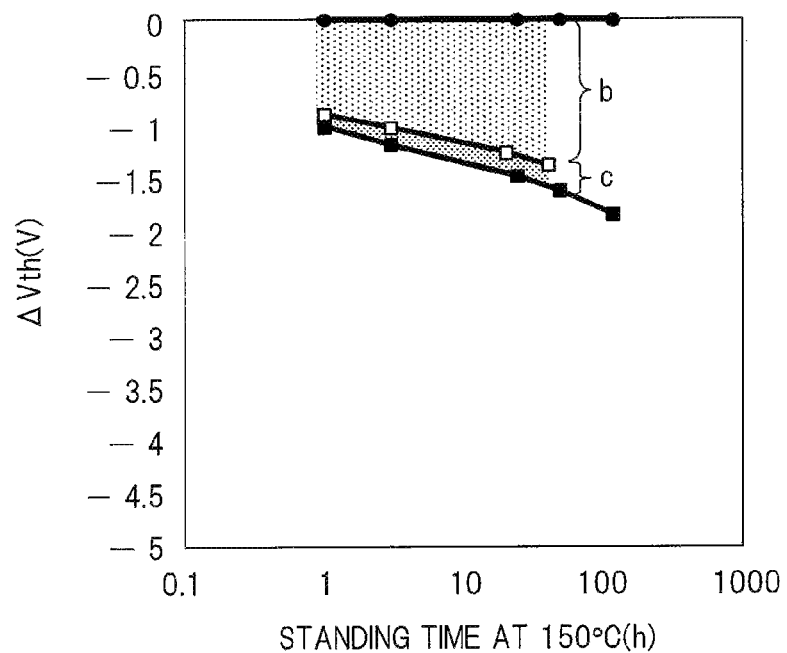
FIGS. 20A and 20B are graphs showing degradation of retention characteristics resulting from rewriting.
Figure 20B:
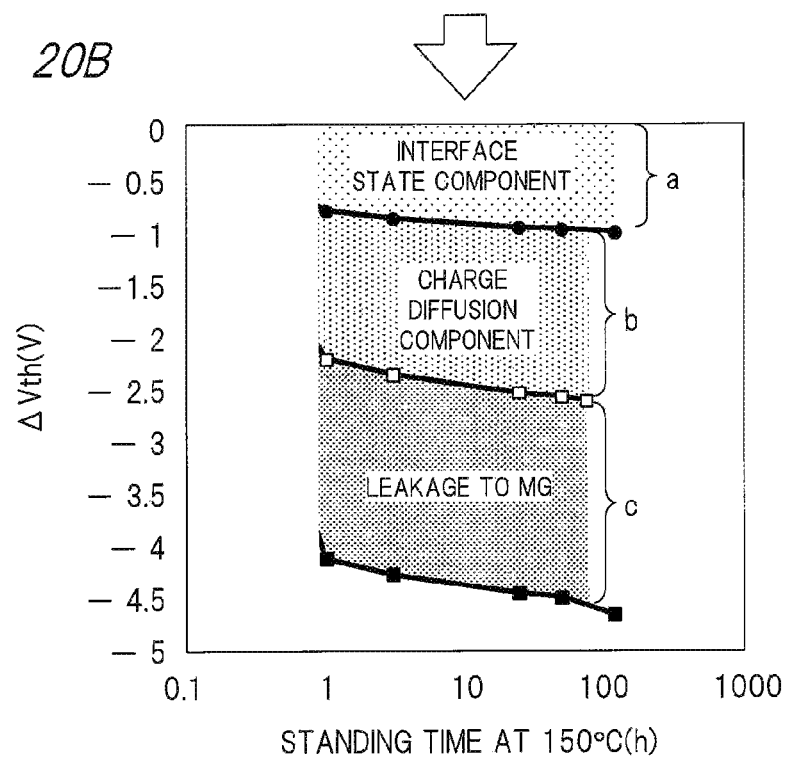

FIGS. 20A and 20B are graphs showing degradation of the retention characteristics resulting from rewriting. FIG. 20A shows a change in the retention characteristics in an initial stage at which the number of rewriting operations is relatively small, and FIG. 20B shows a change in the retention characteristics after a large number of rewriting operations. In both of FIGS. 20A and 20B, a vertical axis shows a difference (ΔVth, [V]) of a threshold potential, and a horizontal axis shows a standing time [h] at a temperature of 150° C.

In FIG. 20B, a reference character "a" indicates the degradation of retention characteristics derived from an interface state component, a reference character "b" indicates the degradation of retention characteristics derived from a charge diffusion component, and a reference character "c" indicates the degradation of retention characteristics derived from a charge leakage component to the memory gate electrode part MG. As shown in FIGS. 20A and 20B, in the rewriting initial stage (A), there is no component "a", and the components "b" and "c" are small. Meanwhile, after a large number of rewriting operations, all the components "a", "b", and "c" increase, which results in the degradation of the retention characteristics.

On the other hand, in the present embodiment, the component "c" can be decreased since the charge leakage amount to the memory gate electrode part MG side is reduced by the improvement of the upper layer insulating film 108 as described above. And, the component "a" can be also decreased since the interface state caused by the deterioration of the lower layer insulating film 106 can be decreased. Furthermore, the component "b" can be decreased since the problem of localization of the electrons and the holes can be solved. Consequently, the retention characteristics can be improved even after a large number of rewriting operations.

In addition, in the present embodiment, the switch circuits SC1, SC2 are provided on both sides of one voltage supply circuit VS, and one voltage supply circuit VS is shared between two memory cell regions MA via the switch circuits SC1 and SC2, so that the semiconductor device can be downsized. And, the semiconductor elements are highly integrated. In other words, one memory cell region MA1-1 has such a configuration as applying different potentials to both ends of the memory gate electrode part MG of one memory cell region MA1-1 by using the voltage supply circuit VS1-1 for the memory cell region MA1-1 (on the left of MA1-1 in FIG. 7) and the voltage supply circuit VS1-2 for the memory cell region MA1-2 (on the left of MA1-2 in FIG. 7) next thereto. In this manner, the semiconductor device can be downsized. And, the semiconductor elements can be highly integrated.

In the present embodiment, note that the n-MOS type memory cell has been described in detail. However, even in a p-MOS type memory cell, almost the same effect as that of the n-MOS type memory cell can be obtained by the configuration of the present embodiment.

Second Embodiment

In the semiconductor device according to the first embodiment, the erasing of the memory cell is performed after heating the memory gate electrode part MG. However, the erasing of the memory cell may be performed while heating the memory gate electrode part MG.

A semiconductor device according to the present embodiment is described below, with reference to the drawings. Note that a configuration of the semiconductor device and reading and writing operations of some operations are the same as those of the first embodiment, and therefore, the description thereof is omitted. Therefore, the erasing operation is described below.

Figure 21:
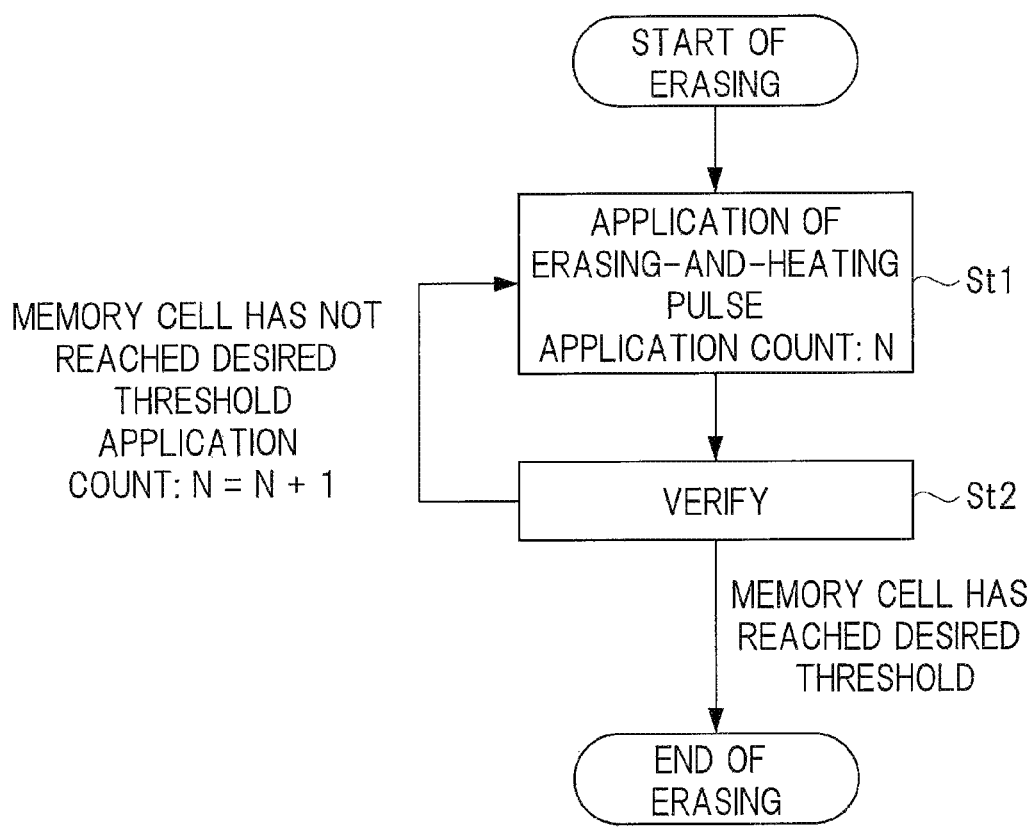
FIG. 21 is a diagram showing a flow from a start to an end of erasing according to a second embodiment.
Figure 22:
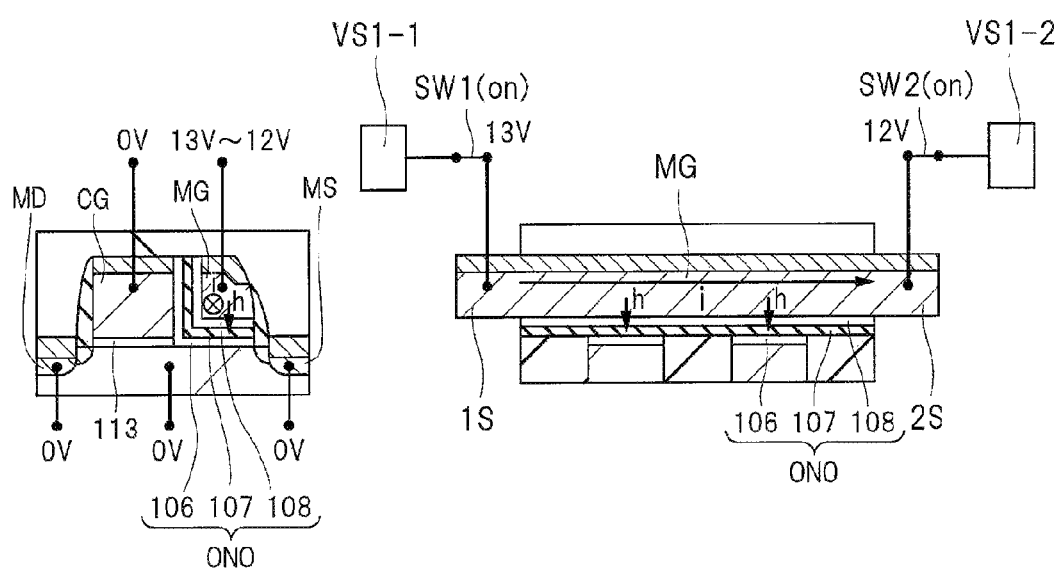
FIG. 22 is a cross-sectional view showing schematically an erasing operation according to the second embodiment.

FIG. 21 is a diagram showing a flow from a start to an end of erasing, according to the present embodiment. FIG. 22 is a cross-sectional view showing schematically an erasing operation according to the present embodiment.

As shown in FIG. 21, first, an erasing-and-heating pulse is applied (St1). In this manner, switch circuits SC11-1 is activated (enabled), and the switch circuit SC21-1 is activated (enabled, see FIGS. 7 and 8).

As shown in the right drawing of FIG. 22, the switch elements SW1 and SW2 connected to the memory gate electrode part MG of the selected cell are turned on. In other words, a potential is supplied to the end portion 1S of the memory gate electrode part MG of the selected cell from the voltage supply circuit VS1-1 on one side (on the left side of the drawing) of the memory cell region MA1-1, and a potential is supplied to the end portion 2S of the memory gate electrode part MG of the selected cell from the voltage supply circuit VS1-2 on the other side (on the right side of the drawing) of the memory cell region MA1-1. More specifically, a voltage of a first potential (for example, 13 V) is applied to the end portion 1S of the memory gate electrode part MG of the memory cell region MA, and a voltage of a second potential (for example, 12 V) lower than the first potential is applied to the second end portion 2S of the memory gate electrode part MG. In this manner, a current is caused to flow through the selected memory gate electrode part MG of the memory cell region MA, so that Joule heat can be generated. In this manner, the selected cell of the memory cell region MA can be heated.

Further, as shown in the left drawing of FIG. 22, a voltage of 0 V is applied to a control gate electrode part CG, a voltage of 0 V is applied to a source region MS on the memory gate electrode part MG side, and a voltage of 0 V is applied to a drain region MD on the control gate electrode part CG side. Here, the first potential (for example, 13V) and the second potential (for example, 12 V) which are applied to the end portion of the memory gate electrode part MG are higher than the erasing potential, that is, the potential of the memory gate electrode part MG required for the erasing operation. Therefore, a hole is injected from the memory gate electrode part MG side into a silicon nitride film (a charge accumulating part, 107) by the FN tunneling phenomena. As described above, the erasing is performed while the heating. The data of a plurality of cells (selected cells) connected to the memory gate electrode part MG can be collectively erased by injecting the hole "h" from the memory gate electrode part MG side into the silicon nitride film 107 (the charge accumulating part, 107) while causing a current "i" to flow through the memory gate electrode part MG between the voltage supply circuits VS1-1 and VS1-2 as described above. However, the drain region MD on the control gate electrode part CG side may be electrically opened. Also, a potential of about 1 V may be applied to the control gate electrode part CG. Note that the injection of the hole "h" from the memory gate electrode part MG side into the silicon nitride film 107 (the charge accumulating part, 107) corresponds to a current flow from the memory gate electrode part MG side to the silicon nitride film 107 (the charge accumulating part, 107).

Then, as shown in FIG. 21, by the verification operation (St2), it is verified whether or not the memory cell has reached a desired threshold. When the memory cell has not reached the desired threshold, the erasing-and-heating pulse (St1) is applied again. As described above, the application of the erasing-and-heating pulse (St1) and the verification operation (St2) are repeated until the memory cell has reached the desired threshold. When the memory cell has reached the desired threshold, the erasing operation ends.

In the present embodiment, the erasing operation is performed for each single line of the memory gate electrode part MG. However, of course, the data of the memory cells in the memory cell region MA may be collectively erased by selecting all the memory gate electrode parts MG of the memory cell region MA. Furthermore, a plurality of the memory cell regions MA may be collectively erased.

As described above, in the present embodiment, the step (St1) of applying the erasing-and-heating pulse is provided in the erasing operation, and therefore, the erasing speed can be improved. That is, by performing the erasing operation while heating the memory gate electrode part MG, the rate of hole conduction of a hole injected from the memory gate electrode part MG is accelerated. In this manner, the erasing speed can be improved.

In addition, by heating the memory gate electrode part MG, the deterioration of the upper and lower layer insulating films is thermally recovered, and the problem of localization of the electrons and the holes is solved, so that the erasing characteristics, the writing characteristics, and the retention characteristics can be improved as similar to the case of the first embodiment.

Furthermore, in the present embodiment, the erasing time can be shortened since the heating pulse and the erasing pulse are applied simultaneously.

Third Embodiment

In the present embodiment, the heating is performed while changing the direction of a current flowing through the memory gate electrode part MG for each pulse.

A semiconductor device according to the present embodiment is described below with reference to the drawings. Note that a configuration of the semiconductor device and reading and writing operations of operations are the same as those of the first embodiment, and therefore, the description thereof will be omitted. Therefore, an erasing operation is described below.

Figure 23:
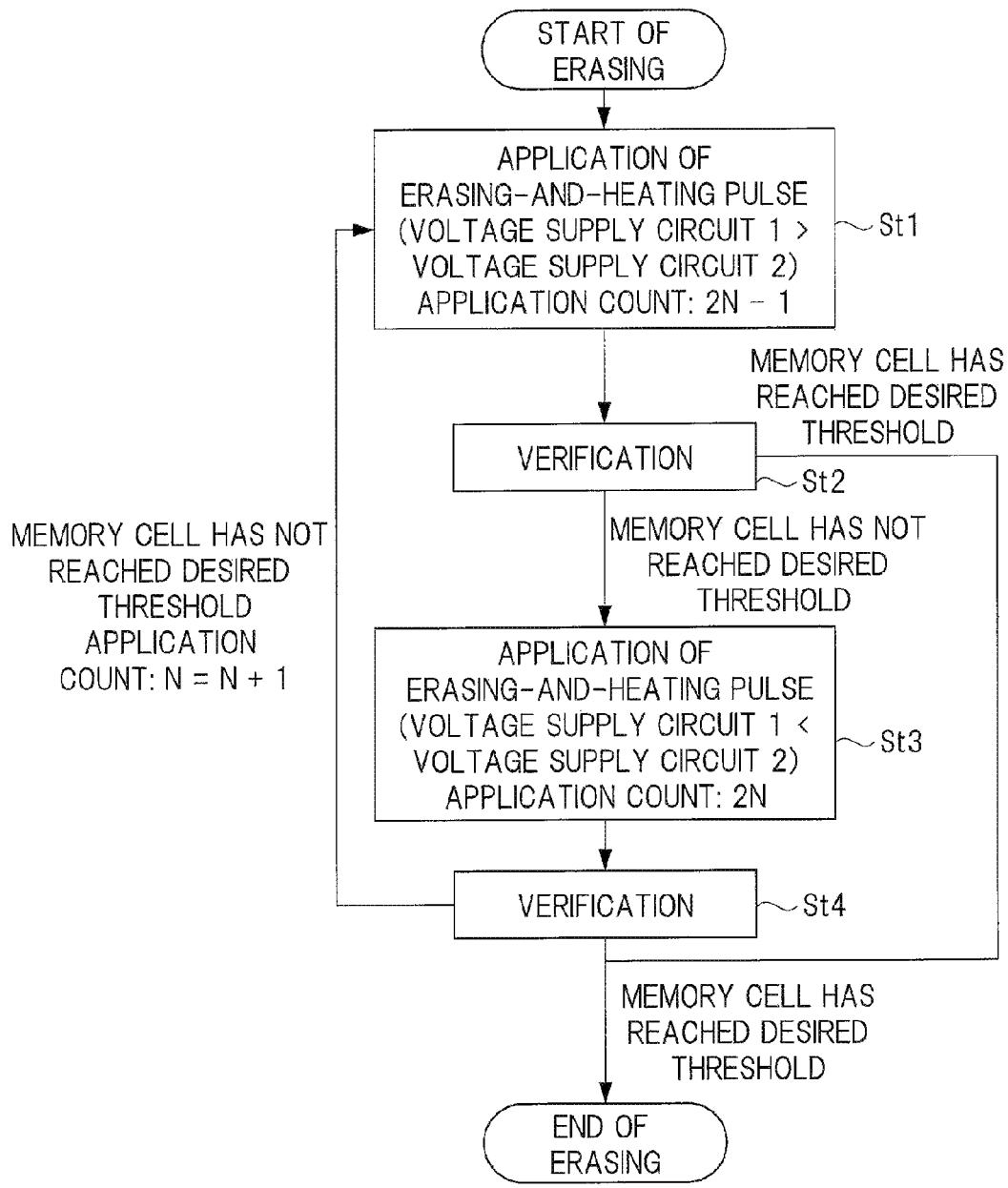
FIG. 23 is a diagram showing a flow from a start to an end of erasing according to a third embodiment.

FIG. 23 is a diagram showing a flow from a start to an end of erasing, according to the present embodiment. FIG. 24 is a cross-sectional view showing schematically an erasing operation according to the present embodiment.

As shown in FIG. 23, first, a first erasing-and-heating pulse is applied (St1). In this manner, switch circuits SC11-1 is activated (enabled), and the switch circuit SC21-1 is activated (enabled, see FIGS. 7 and 8).

As shown in the right drawing of FIG. 24 (St1), the switch elements SW1 and SW2 connected to the memory gate electrode part MG of the selected cell are turned on. In other words, a potential is supplied to the end portion 1S of the memory gate electrode part MG of the selected cell from the voltage supply circuit VS1-1 on one side (on the left side of the drawing) of the memory cell region MA1-1, and a potential is supplied to the end portion 2S of the memory gate electrode part MG of the selected cell from the voltage supply circuit VS1-2 on the other side (on the right side of the drawing) of the memory cell region MA1-1. More specifically, a voltage of a first potential (for example, 13 V) is applied to the end portion 1S of the memory gate electrode part MG of the memory cell region MA, and a voltage of a second potential (for example, 12 V) lower than the first potential is applied to the second end portion 2S of the memory gate electrode part MG. In this manner, a current "i" is caused to flow in a first direction (from left to right in the right drawing of FIG. 24 (St1)) through the selected memory gate electrode part MG of the memory cell region MA, so that Joule heat can be generated. In this manner, the selected cell of the memory cell region MA can be heated.

Further, as shown in the left drawing of FIG. 24 (St1), a voltage of 0 V is applied to a control gate electrode part CG, a voltage of 0 V is applied to a source region MS on the memory gate electrode part MG side, and a voltage of 0 V is applied to a drain region MD on the control gate electrode part CG side. Here, the first potential (for example, 13 V)

and the second potential (for example, 12 V) which are applied to the end portion of the memory gate electrode part MG are higher than the erasing potential, that is, the potential of the memory gate electrode part MG required for the erasing operation. Therefore, a hole "h" is injected from the memory gate electrode part MG side into a silicon nitride film (a charge accumulating part, 107) by the FN tunneling phenomena. As described above, the erasing is performed while the heating and causing a current "i" to flow in the first direction (a direction from VS1-1 to VS1-2) through the memory gate electrode part MG between the voltage supply circuits VS1-1 and VS1-2. Also at this time, note that the drain region MD on the control gate electrode part CG side may be electrically opened. Also, a potential of about 1 V may be applied to the control gate electrode part CG.

Then, as shown in FIG. 23, by the verification operation (St2), it is verified whether or not the memory cell has reached a desired threshold. When the memory cell has reached the desired threshold, the erasing operation ends. When the memory cell has not reached the desired threshold, a second erasing-and-heating pulse (St3) is applied. In this manner, switch circuits SC11-1 is activated (enabled), and the switch circuit SC21-1 is activated (enabled, see FIGS. 7 and 8).

As shown in the right drawing of FIG. 24 (St3), the switch elements SW1 and SW2 connected to the memory gate electrode part MG of the selected cell are turned on. In other words, a potential is supplied to the end portion 1S of the memory gate electrode part MG of the selected cell from the voltage supply circuit VS1-1 on one side (on the left side of the drawing) of the memory cell region MA1-1, and a potential is supplied to the end portion 2S of the memory gate electrode part MG of the selected cell from the voltage supply circuit VS1-2 on the other side (on the right side of the drawing) of the memory cell region MA1-1. More specifically, a voltage of a second potential (for example, 12 V) is applied to the end portion 1S of the memory gate electrode part MG of the memory cell region MA, and a voltage of a first potential (for example, 13 V) higher than the second potential is applied to the second end portion 2S of the memory gate electrode part MG. In this manner, a current "i" is caused to flow in a second direction (from right to left in the right drawing of FIG. 24 (St3)) through the selected memory gate electrode part MG of the memory cell region MA, so that Joule heat can be generated. In this manner, the selected cell of the memory cell region MA can be heated.

Further, as shown in the left drawing of FIG. 24 (St3), a voltage of 0 V is applied to a control gate electrode part CG, a voltage of 0 V is applied to a source region MS on the memory gate electrode part MG side, and a voltage of 0 V is applied to a drain region MD on the control gate electrode part CG side. Here, the first potential (for example, 13 V) and the second potential (for example, 12 V) which are applied to the end portion of the memory gate electrode part MG are higher than the erasing potential, that is, the potential of the memory gate electrode part MG required for the erasing operation. Therefore, a hole "h" is injected from the memory gate electrode part MG side into a silicon nitride film (a charge accumulating part, 107) by the FN tunneling phenomena. As described above, the erasing is performed while the heating and causing a current "i" to flow in the second direction (a direction from VS1-2 to VS1-1) through the memory gate electrode part MG between the voltage supply circuits VS1-1 and VS1-2. Also at this time, note that the drain region MD on the control gate electrode part CG side may be electrically opened. Also, a potential of about 1 V may be applied to the control gate electrode part CG.

Then, as shown in FIG. 22, by the verification operation (St4), it is verified whether or not the memory cell has reached a desired threshold. When the memory cell has reached the desired threshold, the erasing operation ends. When the memory cell has not reached the desired threshold, the process returns to the first step (St1), and the first erasing-and-heating pulse is applied. The steps (St1 to St4) are repeated until the memory cell reaches the desired threshold. When the memory cell has reached the desired threshold, the erasing operation ends.

As described above, the memory cells connected to the memory gate electrode part MG can be collectively erased by injecting a hole into the silicon nitride film 107 (the charge accumulating part, 107) from the memory gate electrode part MG.

In the present embodiment, the erasing operation is performed for each single line of the memory gate electrode part MG. However, of course, the data of the memory cells in the memory cell region MA may be collectively erased by selecting all the memory gate electrode parts MG of the memory cell region MA. Furthermore, a plurality of the memory cell regions MA may be collectively erased.

As described above, in the present embodiment, the step (St1) of applying the erasing-and-heating pulse is provided in the erasing operation, and therefore, the erasing speed can be improved. That is, by performing the erasing operation while heating the memory gate electrode part MG, the rate of hole conduction of a hole injected from the memory gate electrode part MG is accelerated. In this manner, the erasing speed can be improved.

In addition, by heating the memory gate electrode part MG, the deterioration of the upper and lower layer insulating films is thermally recovered, and the problem of localization of the electrons and the holes is solved, so that the erasing characteristics, the writing characteristics, and the retention characteristics can be improved as similar to the case of the first embodiment.

Furthermore, in the present embodiment, the erasing time can be shortened since the heating pulse and the erasing pulse are applied simultaneously.

Furthermore, in the present embodiment, the temperature distribution in the memory gate electrode part MG can be uniformed by alternately changing the directions of the current flowing through the memory gate electrode part MG.

In the present embodiment, note that the verification operation (St2) is provided between the application of the first erasing-and-heating pulse (St1) and the application of the second erasing-and-heating pulse (St3). However, the verification operation (St2) may be omitted.

Fourth Embodiment

In the present embodiment, a memory cell is heated by causing a current to flow through a control gate electrode part CG.

A semiconductor device according to the present embodiment is described below with reference to the drawings. For a configuration of the semiconductor device and operations thereof, the description of the same configuration and operations as those of the first embodiment will not be omitted. Therefore, the relation between the control gate electrode part CG and a voltage supply circuit VS, the relation between the control gate electrode part CG and a switch circuit SC1, SC2, and the erasing operation are described below.

Figure 25:
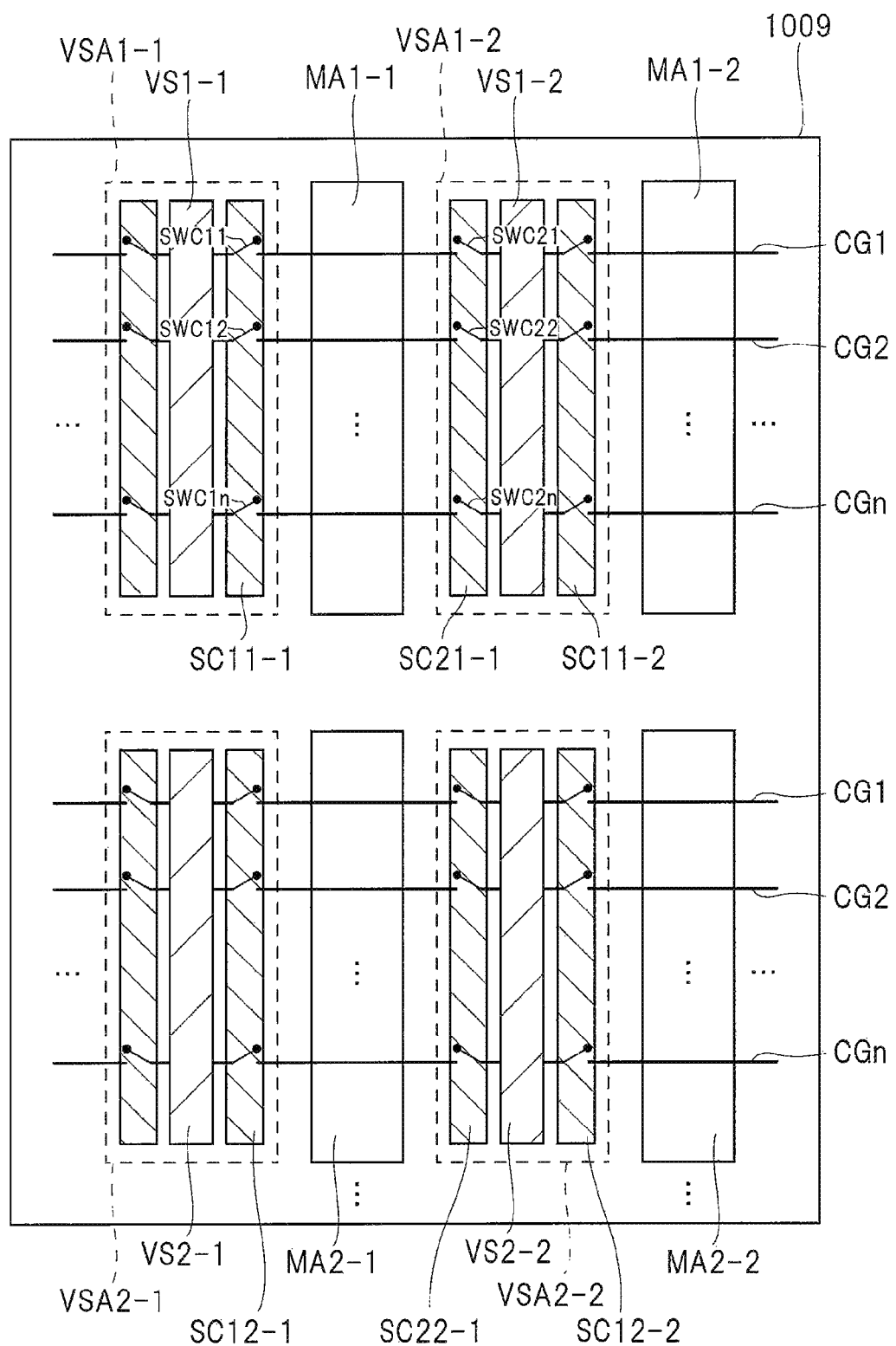
FIG. 25 is a block diagram showing a configuration of a memory array of a semiconductor device according to a fourth embodiment.

FIG. 25 is a block diagram showing a configuration of a memory array of the semiconductor device according to the present embodiment. As shown in FIG. 25, the memory cell array (1009) includes a plurality of memory cell regions MA. FIG. 25 shows four memory cell regions MA (MA1-1, MA1-2, MA2-1, MA2-2). Each memory cell region MA is formed of, for example, m×n memory cells.

A voltage supply circuit region VSA is provided on both sides of the memory cell region MA. In other viewpoint, the voltage supply circuit region VSA is provided between the memory cell regions MA.

A voltage supply circuit VS and a switch circuit SC1, SC2 are provided in the voltage supply circuit region VSA. The voltage supply circuit VS is a circuit which supplies a predetermined voltage to the memory cell. A plurality of switch elements (SWC11 to SWC1$n$) are provided in the switch circuit SC1. Also, a plurality of switch elements (SWC21 to SWC2$n$) are provided in the switch circuit SC2. The switch element is formed of, for example, a MISFET. Note that a combination of a plurality of elements (circuit) may be used as the switch element.

Specifically, the switch elements SWC11 to SWC1$n$ are provided between the control gate electrode parts CG1, CG2 ... CGn of the memory cell region MA1-1 and the voltage supply circuit VS1-1, respectively. By selectively turning on the switch element SWC11 to SWC1$n$, a voltage can be supplied to only a selected control gate electrode part among the control gate electrode parts CG1, CG2 ... CGn. Of course, by turning on all the switch elements SWC11 to SWC1$n$, a voltage can be also supplied to all the control gate electrode parts CG1, CG2 ... CGn in the memory cell region MA. The turning on and off of the switch element SWC11 to SWC1$n$ are controlled by an address buffer 1003, a row decoder 1004, and a column decoder 1005, or others.

Also, the switch elements SWC21 to SWC2$n$ are provided between the control gate electrode parts CG1, CG2 ... CGn of the memory cell region MA1-1 and the voltage supply circuit VS1-2 next thereto, respectively. By selectively turning on the switch element SWC21 to SWC2$n$, a voltage can be supplied to only a selected control gate electrode part among the control gate electrode parts CG1, CG2 ... CGn. Of course, by turning on all the switch elements SWC21 to SWC2$n$, a voltage can be also supplied to all the control gate electrode parts CG1, CG2 ... CGn in the memory cell region MA. The turning on and off of the switch element SWC21 to SWC2$n$ are controlled by an address buffer 1003, a row decoder 1004, and a column decoder 1005, or others.

As described above, each of the switch circuits SC1, SC2 is provided on both sides of the memory cell region MA. The switch elements SWC11 to SWC1$n$ are connected to an end portion (1S) of the control gate electrode part CG1, CG2 ... CGn on one side (on the left side in FIG. 25) in the memory cell region MA, respectively. The switch elements SWC21 ... SWC2$n$ are connected to an end portion (2S) of the control gate electrode part CG1, CG2 ... CGn on the other side (on the right side in FIG. 25) in the memory cell region MA, respectively.

In other words, the control gate electrode parts CG1, CG2 ... CGn of the memory cell region MA are connected to one voltage supply circuit VS1-1 via the switch element SWC11 to SWC1$n$ on one end portion (1S), and the control gate electrode parts CG1, CG2 ... CGn of the memory cell region MA are connected to the other voltage supply circuit VS1-2 via the switch elements SWC21 to SWC2$n$ on the other end portion (2S).

By providing the voltage supply circuit VS on both sides of the control gate electrode part CG1, CG2 ... CGn for the connection via the switch elements (SWC11 to SWC1$n$, SWC21 to SWC2$n$) as described above, different potentials can be applied to the both end portions (1S and 2S) of the linearly-formed control gate electrode part CG, so that a current can flow through the control gate electrode part CG. As a result, the control gate electrode part CG can be heated, so that a plurality of the cells (the selected cells) connected to one selected control gate electrode part CG can be heated.

Figure 26:
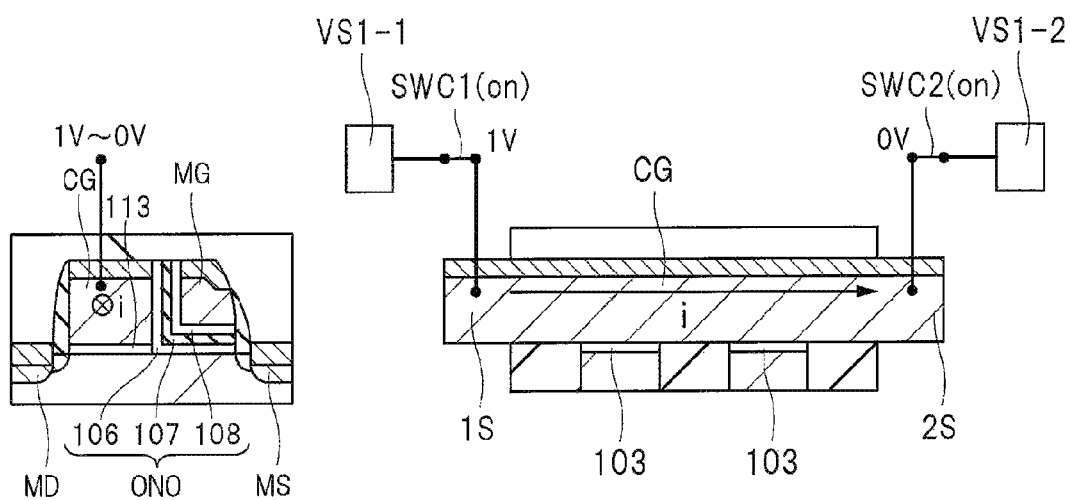
FIG. 26 is a cross-sectional view showing schematically an erasing operation according to the fourth embodiment.
Figure 27:
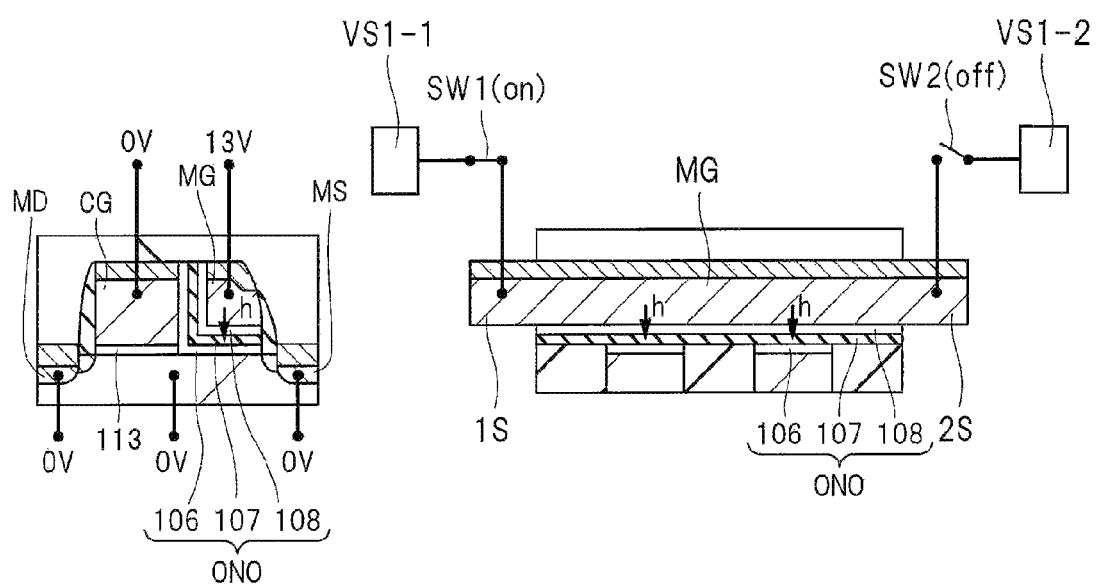
FIG. 27 is a cross-sectional view showing schematically an erasing operation according to the fourth embodiment.

FIGS. 26 and 27 are cross-sectional views showing schematically an erasing operation according to the present embodiment. First, a heating pulse is applied to the control gate electrode part CG (St1). That is, the switch circuit SC11-1 is activated (enabled), and the switch circuit SC21-1 is activated (enabled) (see FIG. 25).

For example, as shown in the right and left drawings of FIG. 26, the switch elements SW1 and SW2 connected to the control gate electrode part CG of the selected cell are turned on. In other words, a potential is supplied to the end portion 1S of the control gate electrode part CG of the selected cell from the voltage supply circuit VS1-1 on one side (on the left side in FIG. 25) of the memory cell region MA1-1, and a potential is supplied to the end portion 2S of the control gate electrode part CG of the selected cell from the voltage supply circuit VS1-2 on the other side (on the right side in FIG. 25) of the memory cell region MA1-1. More specifically, a voltage of a first potential (for example, 1 V) is applied to the end portion 1S of the control gate electrode part CG of the memory cell region MA, and a voltage of a second potential (for example, 0 V) lower than the first potential is applied to the second end portion 2S of the control gate electrode part CG.

Next, an erasing pulse is applied (St2). As shown in the right drawing of FIG. 27, for example, the switch element SW1 connected to the memory gate electrode part MG of the selected cell is turned on, while the switch element SW2 is turned off. In other words, a potential is supplied to the memory gate electrode part MG of the selected cell from only the voltage supply circuit VS1-1 on one side of the memory cell region MA1-1, while a potential is not supplied to the memory gate electrode part MG of the selected cell from the voltage supply circuit VS1-2 on the other side of the memory cell region MA1-1.

A voltage of 13 V is applied to the memory gate electrode part MG, a voltage of 0 V is applied to the control gate electrode part CG, a voltage of 0 V is applied to a source region MS on the memory gate electrode part MG side, a voltage of 0 V is applied to a drain region MD on the control gate electrode part CG side, and a voltage of 0 V is applied to the semiconductor substrate (100, p-type well PW). In this manner, the erasing operation is performed by injecting a hole "h" from the memory gate electrode part MG side into a silicon nitride film (a charge accumulating part, 107) by the FN tunneling phenomena. However, the drain region MD on the control gate electrode part CG side may be electrically opened. Also, a potential of about 1 V may be applied to the control gate electrode part CG. Note that an erasing-and-heating pulse may be applied as the application of the erasing pulse to the memory gate electrode part MG or others as described in St1 in the second embodiment.

By injecting a hole "h" from the memory gate electrode part MG into the silicon nitride film (the charge accumulating part, 107) as described above, the memory cells connected to the memory gate electrode part MG can be collectively erased.

After that, by the verification operation, it is verified whether or not the memory cell has reached a desired threshold. When the memory cell has not reached the desired threshold, the application of the heating pulse (St1) and the application of the erasing pulse (St2) are repeated. When the memory cell has reached the desired threshold, the erasing operation ends.

In the present embodiment, the erasing operation is performed for each single line of the memory gate electrode part MG. However, of course, the data of the memory cells in the memory cell region MA may be collectively erased by selecting all the memory gate electrode parts MG of the memory cell region MA. Furthermore, a plurality of the memory cell regions MA may be collectively erased.

As described above, in the present embodiment, the heating pulse is applied to the control gate electrode part CG in the erasing operation, and therefore, the memory gate electrode part MG is heated by heat conduction. In this manner, the erasing speed can be improved as similar to the case of the first embodiment. That is, the memory gate electrode part MG is heated by heating the control gate electrode part CG, so that the conduction rate of a hole injected from the memory gate electrode part MG is accelerated. In this manner, the erasing speed can be improved.

In addition, by heating the memory gate electrode part MG because of the heat conduction from the control gate electrode part CG, the deterioration of the upper and lower layer insulating films is thermally recovered, and the problem of localization of the electrons and the holes is solved, so that the erasing characteristics, the writing characteristics, and the retention characteristics can be improved as similar to the case of the first embodiment.

In the present embodiment, note that the directions of the current flowing through the control gate electrode part CG may be alternately changed (see the third embodiment).

In the present embodiment, the application of the heating pulse to the control gate electrode part CG and the application of the erasing pulse to the memory gate electrode part MG may be performed at the same time. In this manner, the erasing time can be shortened.

Fifth Embodiment

In the present embodiment, a memory cell is heated by causing a current to flow through a control gate electrode part CG and a memory gate electrode part MG.

A semiconductor device according to the present embodiment is described below with reference to the drawings. For a configuration of the semiconductor device and operations thereof, the description of the same configuration and operations as similar to those of the first and fourth embodiments will be omitted. Therefore, the relation between the control gate electrode part CG and the memory gate electrode part MG, and a voltage supply circuit VS and a switch circuit SC1, SC2, and the erasing operation are described below.

Figure 28:
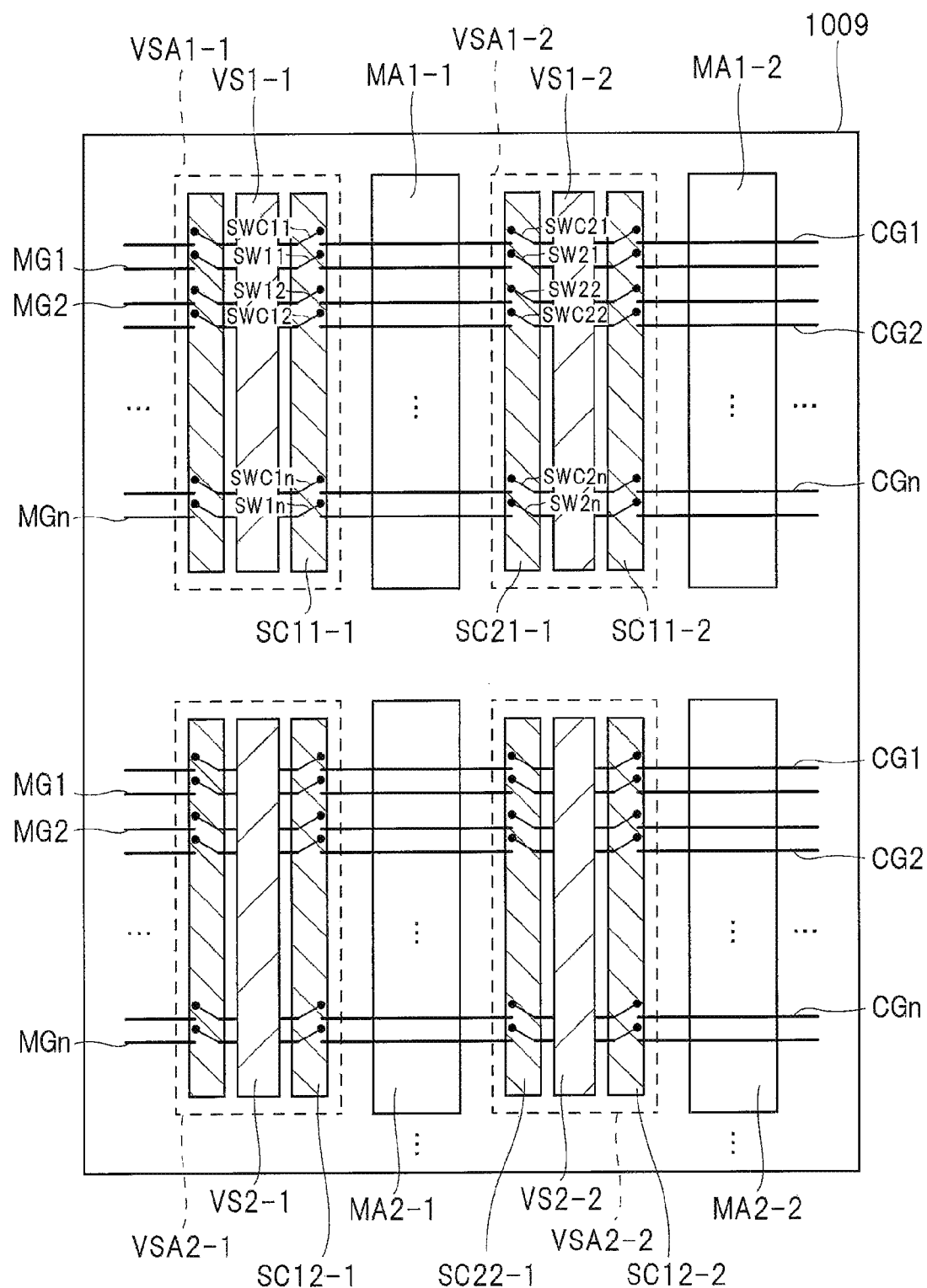
FIG. 28 is a block diagram showing a configuration of a memory array of a semiconductor device according to a fifth embodiment.

FIG. 28 is a block diagram showing a configuration of a memory array of the semiconductor device according to the present embodiment. As shown in FIG. 28, the memory cell array (1009) includes a plurality of memory cell regions MA. FIG. 28 shows four memory cell regions MA (MA1-1, MA1-2, MA2-1, MA2-2). Each memory cell region MA is formed of, for example, m×n memory cells.

A voltage supply circuit region VSA is provided on both sides of the memory cell region MA. In other viewpoint, the voltage supply circuit region VSA is provided between the memory cell regions MA.

A voltage supply circuit VS and a switch circuit SC1, SC2 are provided in the voltage supply circuit region VSA. The voltage supply circuit VS is a circuit which supplies a predetermined voltage to the memory cell. A plurality of switch elements (SW11 to SW1$n$, SWC11 to SWC1$n$) are provided in the switch circuit SC1. Also, a plurality of switch elements (SW21 to SW2$n$, SWC21 to SWC2$n$) are provided in the switch circuit SC2. The switch element is formed of, for example, a MISFET. Note that a combination of a plurality of elements (circuit) may be used as the switch element.

Specifically, the switch elements SW11 to SW1$n$ are provided between the memory gate electrode parts MG1, MG2 . . . MG$n$ of the memory cell region MA1-1 and the voltage supply circuit VS1-1, respectively. By selectively turning on the switch element SW11 to SW1$n$, a voltage can be supplied to only a selected memory gate electrode part among the memory gate electrode parts MG1, MG2 . . . MG$n$. Of course, by turning on all the switch elements SW11 to SW1$n$, a voltage can be also supplied to all the memory gate electrode parts MG1, MG2 . . . MG$n$ in the memory cell region MA. Also, the switch elements SWC11 to SWC1$n$ are provided between the control gate electrode parts CG1, CG2 . . . CG$n$ of the memory cell region MA1-1 and the voltage supply circuit VS1-1, respectively. By selectively turning on the switch element SWC11 to SWC1$n$, a voltage can be supplied to only a selected control gate electrode part among the control gate electrode parts CG1, CG2 . . . CG$n$. Of course, by turning on all the switch elements SWC11 to SWC1$n$, a voltage can be also supplied to all the control gate electrode parts CG1, CG2 . . . CG$n$ in the memory cell region MA. The turning on and off of the switch element SW11 to SW1$n$ and SWC11 to SWC1$n$ are controlled by an address buffer 1003, a row decoder 1004, and a column decoder 1005, or others.

Also, the switch elements SW21 to SW2$n$ are provided between the memory gate electrode parts MG1, MG2 MG$n$ of the memory cell region MA1-1 and the voltage supply circuit VS1-2 next thereto, respectively. By selectively turning on the switch element SW21 to SW2$n$, a voltage can be supplied to only a selected memory gate electrode part among the memory gate electrode parts MG1, MG2 MG$n$. Of course, by turning on all the switch elements SW21 to SW2$n$, a voltage can be also supplied to all the memory gate electrode parts MG1, MG2 MG$n$ in the memory cell region MA. Also, the switch elements SWC21 to SWC2$n$ are provided between the control gate electrode parts CG1, CG2 . . . CG$n$ of the memory cell region MA1-1 and the voltage supply circuit VS1-2 next thereto, respectively. By selectively turning on the switch element SWC21 to SWC2$n$, a voltage can be supplied to only a selected control gate electrode part among the control gate electrode parts CG1, CG2 . . . CG$n$. Of course, by turning on all the switch elements SWC21 to SWC2$n$, a voltage can be also supplied to all the control gate electrode parts CG1, CG2 . . . CG$n$ in the memory cell region MA. The turning on and off of the switch element SW21 to SW2$n$ and SWC21 to SWC2$n$ are controlled by an address buffer 1003, a row decoder 1004, and a column decoder 1005, or others.

By providing the voltage supply circuit VS on both sides of the memory cell region MA for the connection via the switch elements (SWC11 to SWC1$n$, SWC11 to SWC1$n$, SW21 to SW2$n$, SWC21 to SWC2$n$) as described above, different potentials can be applied to the both end portions (1S and 2S) of the linearly-formed memory gate electrode part MG and the both end portions (1S and 2S) of the linearly-formed control gate electrode part CG. In this manner, a current can flow through the memory gate electrode MG and the control gate electrode part CG, so that the memory gate electrode MG and the control gate electrode part CG can be heated.

Figure 29:
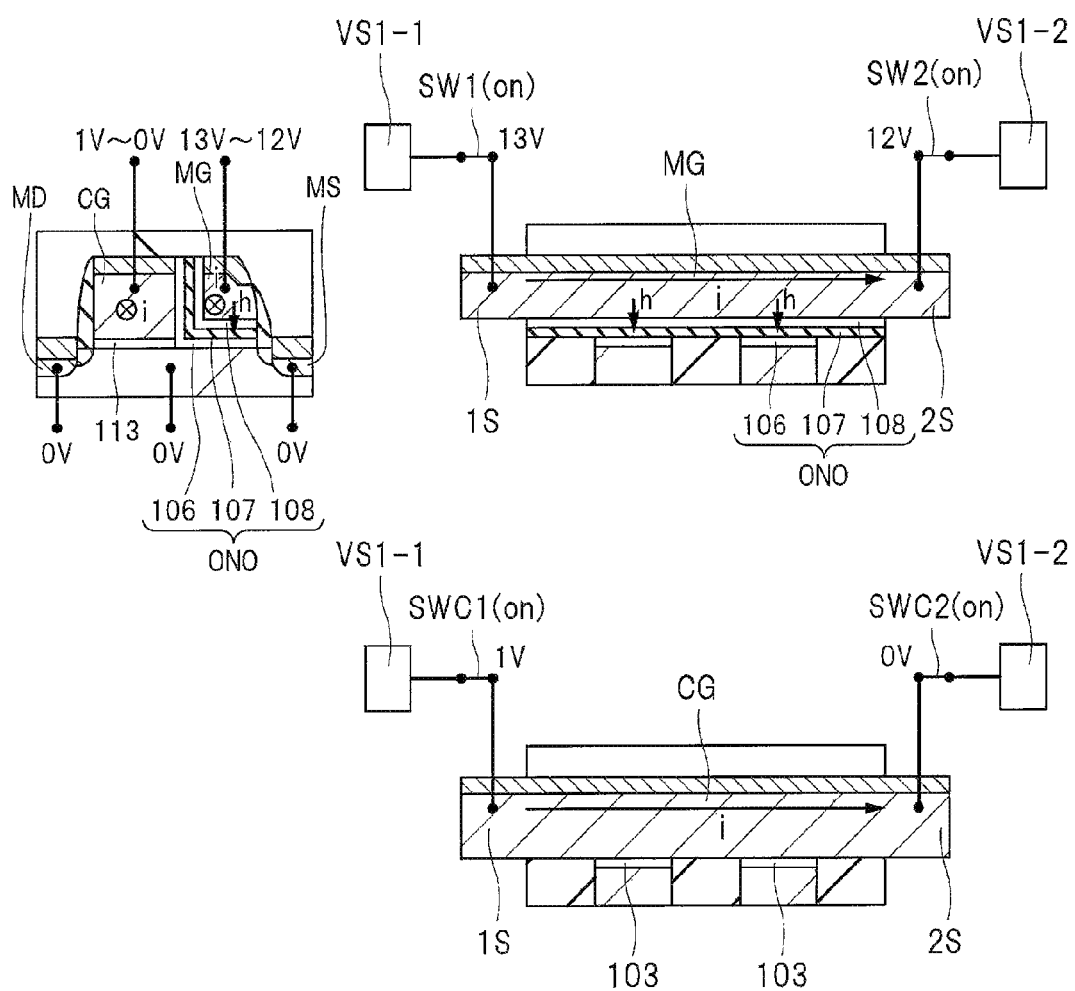
FIG. 29 is a cross-sectional view showing schematically an erasing operation according to the fifth embodiment.

FIG. 29 is a cross-sectional view showing schematically an erasing operation according to the present embodiment. First, a heating pulse is applied to the control gate electrode part CG, and an erasing-and-heating pulse is applied to the memory gate electrode part MG. That is, the switch circuit SC11-1 is activated (enabled), and the switch circuit SC21-1 is activated (enabled, see FIG. 28). That is, all or a part (some) of the switch elements SW11 to SW1$n$ and SWC11 to SWC1$n$ can be turned on. Also, all or a part (some) of the switch elements SW21 to SW2$n$ and SWC21 to SWC2$n$ can be turned on.

And, for example, as shown in FIG. 29, the switch elements SW1 and SW2 connected to the control gate electrode part CG of the selected cell are turned on. In other words, a potential is supplied to the end portion 1S of the control gate electrode part CG of the selected cell from the voltage supply circuit VS1-1 on one side (on the left side in FIG. 29) of the memory cell region MA1-1, and a potential is supplied to the end portion 2S of the control gate electrode part CG of the selected cell from the voltage supply circuit VS1-2 on the other side (on the right side in FIG. 29) of the memory cell region MA1-1. More specifically, a voltage of a first potential (for example, 1 V) is applied to the end portion 1S of the control gate electrode part CG of the memory cell region MA, and a voltage of a second potential (for example, 0 V) lower than the first potential is applied to the second end portion 2S of the control gate electrode part CG.

In addition, an erasing-and-heating pulse is applied. For example, as shown in FIG. 29, the switch elements SW1 and SW2 connected to the memory gate electrode part MG of the selected cell are turned on. In other words, a potential is supplied to the end portion 1S of the memory gate electrode part MG of the selected cell from the voltage supply circuit VS1-1 on one side of the memory cell region MA1-1, and a potential is supplied to the end portion 2S of the memory gate electrode part MG of the selected cell from the voltage supply circuit VS1-2 on the other side of the memory cell region MA1-1. More specifically, a voltage of a first potential (for example, 13 V) is applied to the end portion 1S of the memory gate electrode part MG of the memory cell region MA, and a voltage of a second potential (for example, 12 V) lower than the first potential is applied to the second end portion 2S of the memory gate electrode part MG. In this manner, a current is caused to flow through the selected memory gate electrode part MG of the memory cell region MA, so that Joule heat can be generated. In this manner, the selected cell of the memory cell region MA can be heated.

A voltage of 0 V is applied to a source region MS on the memory gate electrode part MG side, a voltage of 0 V is applied to a drain region MD on the control gate electrode part CG side, and a voltage of 0 V is applied to the semiconductor substrate (100, p-type well PW). Here, as described above, the voltage of 0 V to 1 V is applied to the control gate electrode part CG, and the first potential (for example, 13 V) and the second potential (for example, 12 V) which are applied to the end portion of the memory gate electrode part MG are potentials higher than the erasing potential, that is, the potential of the memory gate electrode part MG required for the erasing operation. Therefore, a hole "h" is injected from the memory gate electrode part MG side into a silicon nitride film (a charge accumulating part, 107) by the FN tunneling phenomena. As described above, the erasing is performed while the heating and causing a current "i" to flow through the memory gate electrode part MG and the control gate electrode part CG between the voltage supply circuits VS1-1 and VS1-2. Also at this time, note that the drain region MD on the control gate electrode part CG side may be electrically opened.

After that, by the verification operation, it is verified whether or not the memory cell has reached a desired threshold. When the memory cell has not reached the desired threshold, the application of the heating pulse to the control gate electrode part CG and the application of the erasing-and-heating pulse to the memory gate electrode part MG are repeated. When the memory cell has reached the desired threshold, the erasing operation ends.

As described above, in the present embodiment, the heating pulse is applied to the control gate electrode part and the memory gate electrode part in the erasing operation, and therefore, the memory cell is heated. In this manner, the erasing speed can be improved as similar to the case of the first embodiment. That is, the memory gate electrode part MG is heated by heating the control gate electrode part CG and the memory gate electrode part MG, so that the conduction of a hole injected from the memory gate electrode part MG is accelerated. In this manner, the erasing speed can be improved.

In addition, by heating the memory gate electrode part MG or others, the deterioration of the upper and lower layer insulating films is thermally recovered, and the problem of localization of the electrons and the holes is solved, so that the erasing characteristics, the writing characteristics, and the retention characteristics can be improved as similar to the case of the first embodiment.

In the present embodiment, note that the directions of the currents flowing through the control gate electrode part CG and the memory gate electrode part MG may be alternately changed (see the third embodiment).

In the present embodiment, the application of the heating pulse to the control gate electrode part CG and the application of the erasing-and-heating pulse to the memory gate electrode part MG may be performed at the same time, and therefore, the erasing time can be shortened. In the present embodiment, note that the application of the heating pulse to the control gate electrode part CG and the application of the erasing-and-heating pulse to the memory gate electrode part MG may be performed at different steps from each other.

As described above, in the present embodiment, the erasing operation is performed for each single line of the memory gate electrode part MG. However, of course, the data of the memory cells in the memory cell region MA may be collectively erased by selecting all the memory gate electrode parts MG of the memory cell region MA. Furthermore, a plurality of the memory cell regions MA may be collectively erased.

Sixth Embodiment

In the present embodiment, a memory gate electrode part MG in a vicinity of an erasing-target memory gate electrode part MG is heated, so that the erasing-target memory gate electrode part MG is heated by heat conduction.

A semiconductor device according to the present embodiment is described below with reference to the drawings. For a configuration of the semiconductor device and operations thereof, note that the description of the same configuration and operations as similar to those of the first and fifth embodiments will be omitted. Therefore, the relation between the erasing-target memory gate electrode part MG and the memory gate electrode part MG in the vicinity of the erasing-target memory gate electrode part MG, and the erasing operation are mainly described below.

Figure 30:
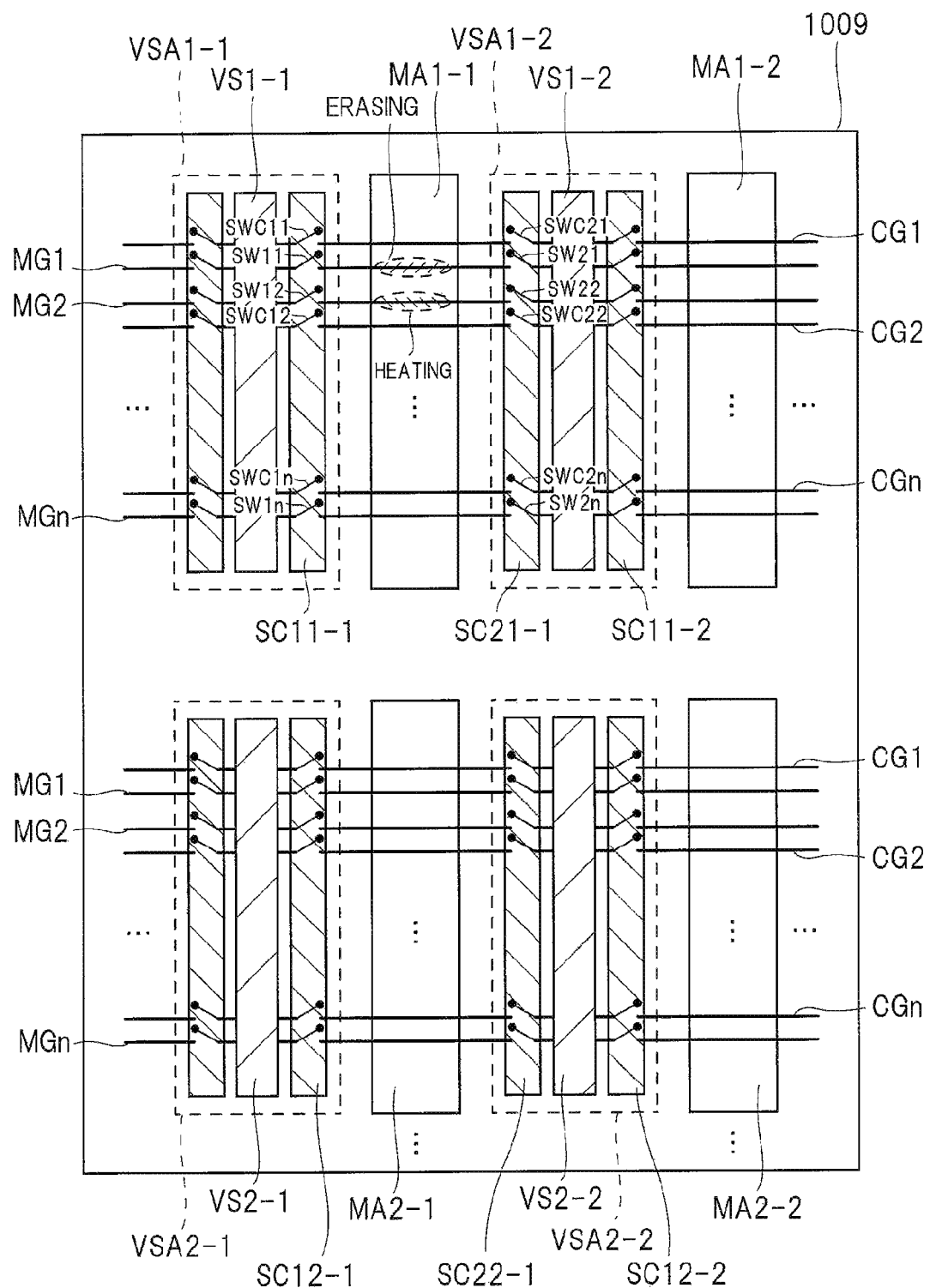
FIG. 30 is a block diagram showing a configuration of a memory array of a semiconductor device according to a sixth embodiment.
Figure 31:
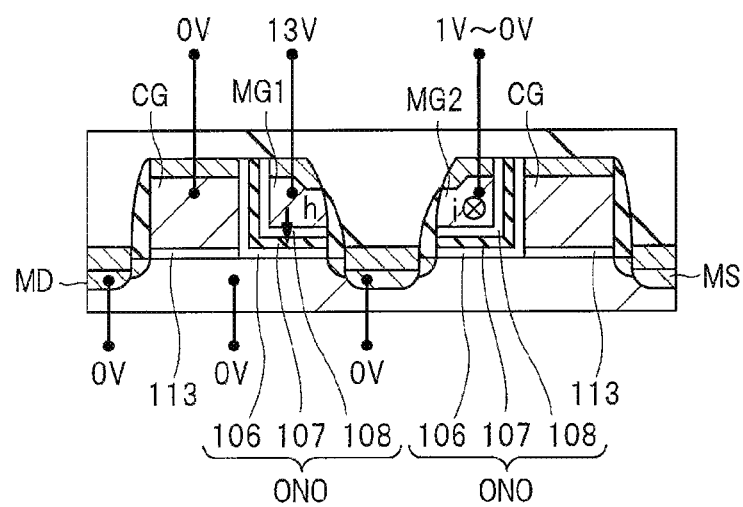
FIG. 31 is a cross-sectional view showing schematically an erasing operation according to the sixth embodiment.

FIG. 30 is a block diagram showing a configuration of a memory array of the semiconductor device according to the present embodiment. Each configuration of the block diagram shown in FIG. 30 is the same as that in the case of the fifth embodiment (FIG. 28). FIG. 31 is a cross-sectional view schematically showing the erasing operation of the present embodiment.

For example, when all the memory cells connected to the memory gate electrode part MG1 in the memory cell region MA are collectively erased as shown in FIG. 30, the memory gate electrode part MG2 may be heated. FIG. 31 is a cross-sectional view showing schematically the erasing operation according to the present embodiment.

First, a heating pulse is applied to the memory gate electrode part MG. In this manner, the switch circuit SC11-1 is activated (enabled), and the switch circuit SC21-1 is activated (enabled, see FIG. 30). And, the switch elements (SW12), (SW22) connected to the memory gate electrode part MG2 in the vicinity of the erasing target (the selected cell, MG1) are turned on.

And, for example, as shown in FIG. 31, a voltage of a first potential (for example, 1 V) is applied to the end portion (1S) of the memory gate electrode part MG2 of the memory cell region MA, and a voltage of a second potential (for example, 0 V) lower than the first potential is applied to the end portion (2S) of the memory gate electrode part MG2. In this manner, a current is caused to flow through the memory gate electrode part MG2 of the memory cell region MA, so that Joule heat can be generated. In this manner, the erasing-target memory gate electrode part MG1 can be heated by heat conduction.

In addition, an erasing pulse is applied to the memory gate electrode part MG1. That is, the erasing pulse is applied to the erasing-target (selected-cell) memory gate electrode part MG1 while the switch elements (SW12 and SW22) connected to the memory gate electrode part MG2 in the vicinity of the erasing target (selected cell) are turned on.

That is, the switch elements (SW11 and SW21) connected to the memory gate electrode part MG are turned on. And, for example, as shown in FIG. 31, a voltage of 13 V is applied to the erasing-target memory gate electrode part MG1, a voltage of 0 V is applied to the control gate electrode part CG, a voltage of 0 V is applied to a source region MS on the memory gate electrode part MG side, a voltage of 0 V is applied to a drain region MD on the control gate electrode part CG side, and a voltage of 0 V is applied to the semiconductor substrate (100, p-type well PW). In this manner, the erasing operation is performed by injecting a hole from the memory gate electrode part MG side into a silicon nitride film (a charge accumulating part, 107) by the FN tunneling phenomena. However, the drain region MD on the control gate electrode part CG side may be electrically opened. Also, a potential of about 1 V may be applied to the control gate electrode part CG. Also, a potential of about 1 V may be applied to the control gate electrode part CG. In this manner, a plurality of cells (selected cells) connected to the memory gate electrode part MG1 can be collectively erased.

After that, by the verification operation, it is verified whether or not the memory cell has reached a desired threshold. When the memory cell has not reached the desired threshold, the application of the heating pulse to the memory gate electrode part MG2 and the application of the erasing pulse to the memory gate electrode part MG1 are repeated. When the memory cell has reached the desired threshold, the erasing operation ends.

In this manner, a memory gate electrode part MG (MG2 here) in a vicinity of an erasing-target memory gate electrode part MG (MG1 here) is heated, so that the erasing-target memory gate electrode part MG may be heated by heat conduction. Also in this case, the conduction of a hole injected from the memory gate electrode part MG is accelerated, so that the erasing speed can be improved.

In addition, by heating the erasing-target memory gate electrode part MG by the heat conduction, the deterioration of the upper and lower layer insulating films is thermally recovered, and the problem of localization of the electrons and the holes is solved, so that the erasing characteristics, the writing characteristics, and the retention characteristics can be improved as similar to the case of the first embodiment.

In the present embodiment, the heating pulse and the erasing pulse are applied at the same time, and therefore, the erasing time can be shortened.

In the present embodiment, note that the erasing pulse is applied to the erasing-target memory gate electrode part MG1 while the heating pulse is applied to the memory gate electrode part MG2. However, an erasing-and-heating pulse may be applied to the erasing-target memory gate electrode part MG1 (see the second embodiment).

The application of the potential (the application of the erasing pulse, St2) to the erasing-target memory gate electrode part MG1 may be performed after the application of the potential (the application of the heating pulse, St1) to the memory gate electrode part MG2 in the vicinity of the erasing-target memory gate electrode part MG1. At this time, the application of the potential to the erasing-target memory gate electrode part MG1 may be the application of an erasing-and-heating pulse (St2).

The heating pulse may be applied to the control gate electrode part (for example, CG2) of a memory cell group in a vicinity of an erasing-target memory cell group (the memory gate electrode part MG1).

The directions of the currents flowing through the control gate electrode part CG2 and the memory gate electrode part MG1 may be alternately changed (see the third embodiment).

When a current is caused to flow through the memory gate electrode part MG1 and the control gate electrode part CG2 at the same time, the potential may be applied so that the directions of the currents flowing therethrough are opposite to each other.

In the present embodiment, the number of the erasing-target memory gate electrode part MG is one. However, the number thereof may be two. Furthermore, the number of the erasing-target memory gate electrode parts MG may be plural within such a range as the influence of the heat conduction from the memory cell for heating.

Seventh Embodiment

In the present embodiment, an example of a manufacturing process of the semiconductor device described in the first embodiment (FIGS. 1 to 6) will be described, and the configuration of the semiconductor device, which has been described in the first embodiment, will be more clarified.

FIGS. 32 to 43 are cross-sectional views showing a manufacturing process of the semiconductor device according to the present embodiment.

A manufacturing flow of the semiconductor device includes a step (PST1) of forming a well and an element isolation region, a step (PST2) of forming a control gate electrode part, a step (PST3) of forming a memory gate electrode part and a charge accumulating film, and a step (PST4) of forming a contact (a plug) and a wiring line. They will be described in detail below.

Figure 32:
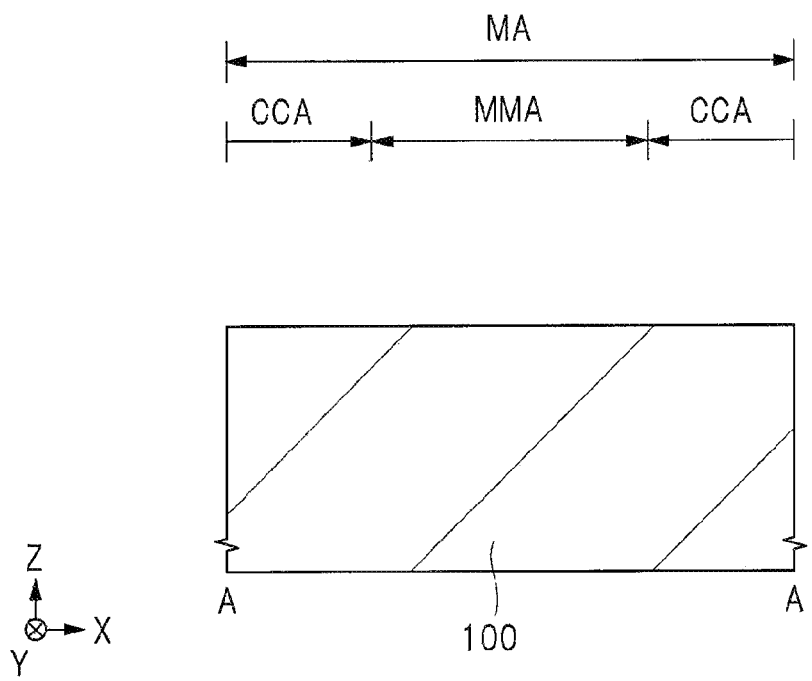
FIG. 32 is a cross-sectional view showing a manufacturing process of a semiconductor device according to a seventh embodiment.
Figure 33:
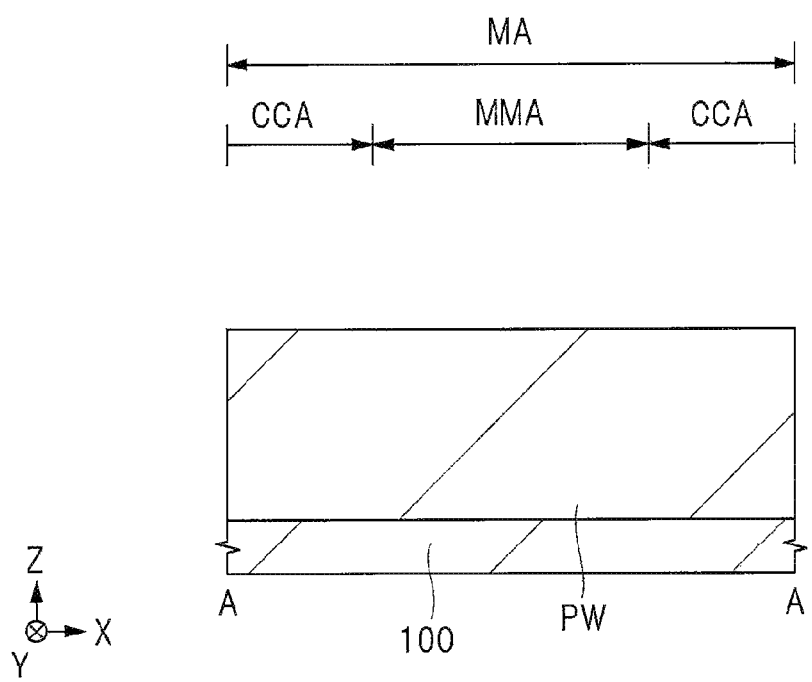
FIG. 33 is a cross-sectional view showing a manufacturing process of a semiconductor device according to a seventh embodiment, the cross-sectional view showing the manufacturing process of the semiconductor device being continued from FIG. 32.
Figure 34:
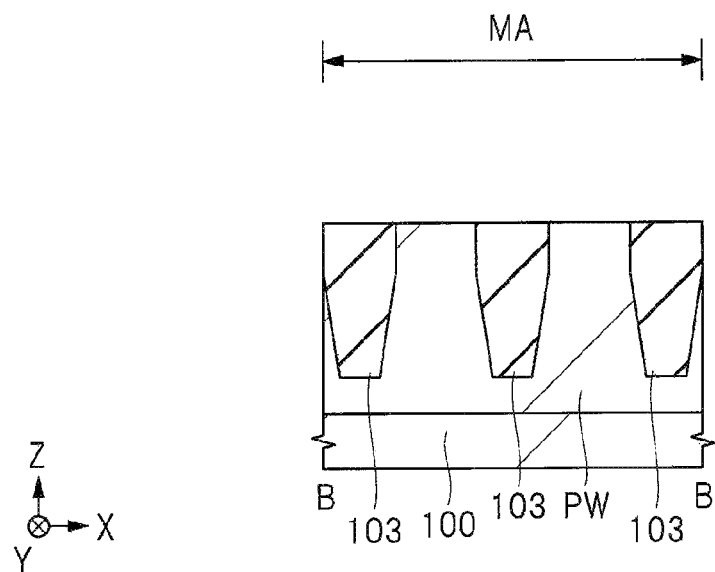
FIG. 34 is a cross-sectional view showing a manufacturing process of the semiconductor device according to the seventh embodiment.

First, as shown in FIG. 32, a semiconductor substrate of a p-type single-crystal silicon having resistivity of, for example, about 1 to 10 Ωcm is prepared as a semiconductor substrate 100. Next, as shown in FIGS. 33 and 34, an element isolation region 103 and a p-type well PW are formed. For example, an element isolation trench having a depth of about 150 nm is formed by etching the semiconductor substrate 100 by using a photolithography technique and a dry etching technique. Subsequently, an insulating film such as the silicon oxide film is buried inside the element isolation trench by depositing a silicon oxide film on the semiconductor substrate 100 including the inside of the element isolation trench by using a CVD method or others, and removing the silicon oxide film outside the element isolation trench by using a chemical mechanical polishing (CMP) method or others. Such an element isolation method as described above is called a shallow trench isolation (STI) method. Next, the p-type well PW is formed in the semiconductor substrate 100. For example, the p-type well PW is formed by ion-implanting a p-type impurity (e.g. boron (B) or others) with the silicon oxide film as a through-film. An exposed region of the p-type well PW partitioned by an element isolation region 103 becomes an active region (a hatched area in FIG. 4).

Figure 35:
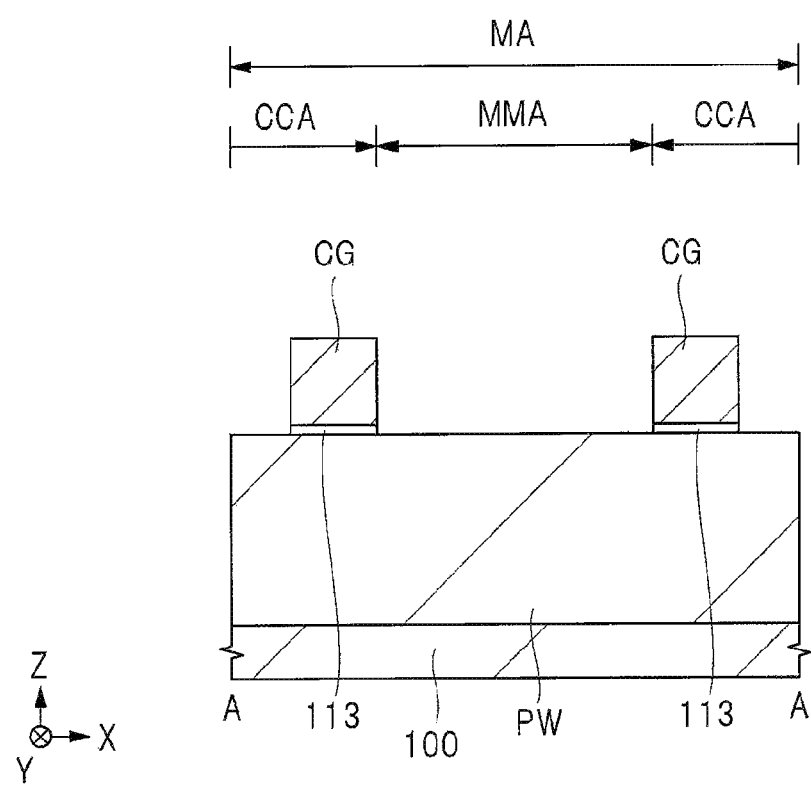
FIG. 35 is a cross-sectional view showing a manufacturing process of the semiconductor device according to the seventh embodiment, the cross-sectional view showing the manufacturing process of the semiconductor device being continued from FIG. 33.

Subsequently, as shown in FIG. 35, an insulating film 113 is formed on the semiconductor substrate 100. For example, a silicon oxide film having a thickness of about 2 nm is formed by thermal oxidation on the semiconductor substrate 100. Then, a control gate electrode part CG is formed on the insulating film 113. For example, a polysilicon film having a thickness of about 120 nm is formed by a CVD method or others on the insulating film 113 and the element isolation region 103. Then, the polysilicon film is processed to remain on both sides of a region MMA by a photolithography technique and a dry etching technique.

Figure 36:
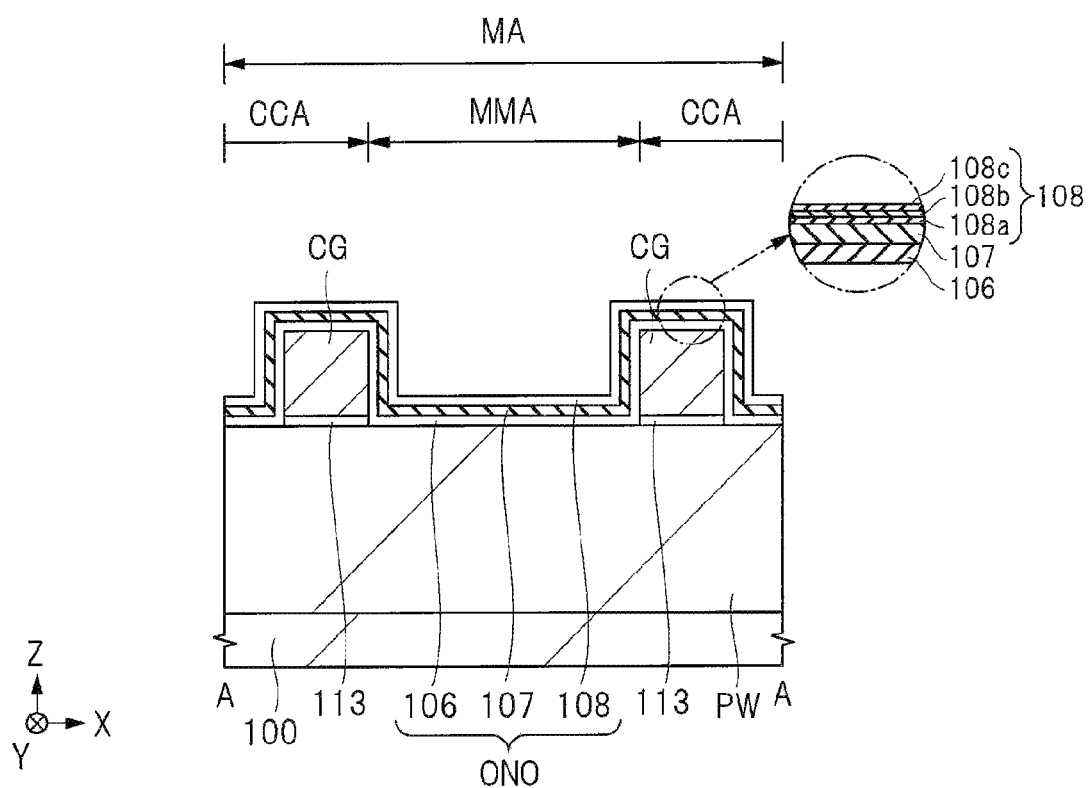
FIG. 36 is a cross-sectional view showing a manufacturing process of the semiconductor device according to the seventh embodiment, the cross-sectional view showing the manufacturing process of the semiconductor device being continued from FIG. 35.

Subsequently, as shown in FIG. 36, an insulating film ONO (106, 107, 108) is formed. First, for example, a silicon oxide film is formed as a lower layer insulating film 106 on the semiconductor substrate 100 including the control gate electrode part CG. The silicon oxide film is formed by, for example, thermal oxidation to have a thickness of about 4 nm. Note that the silicon oxide film may be formed by a CVD method or others. Then, on the lower layer insulating film 106, for example, a silicon nitride film is formed as a middle layer insulating film 107 to be deposited to have a thickness of about 6 nm by a CVD method or others. The middle layer insulating film 107 functions as a charge accumulating part of a memory cell. Then, on the middle layer insulating film 107, an upper layer insulating film 108 is formed. The upper layer insulating film 108 is, for example, a laminated film including a silicon oxynitride film 108a formed on the middle layer insulating film 107, a silicon nitride film 108b formed on the silicon oxynitride film 108a, and a silicon oxide film 108c formed on the silicon nitride film 108b. The silicon oxynitride film 108a is deposited by a CVD method to have a thickness of about 9 nm, then, the silicon nitride film 108b is deposited by a CVD method to have a thickness of about 3 nm, and then, the silicon oxide film 108c is deposited by a CVD method to have a thickness of about 1 nm. In this manner, the insulating film ONO including the lower insulating film 106, the middle insulating film 107, and the upper insulating film 108 is formed.

Figure 37:
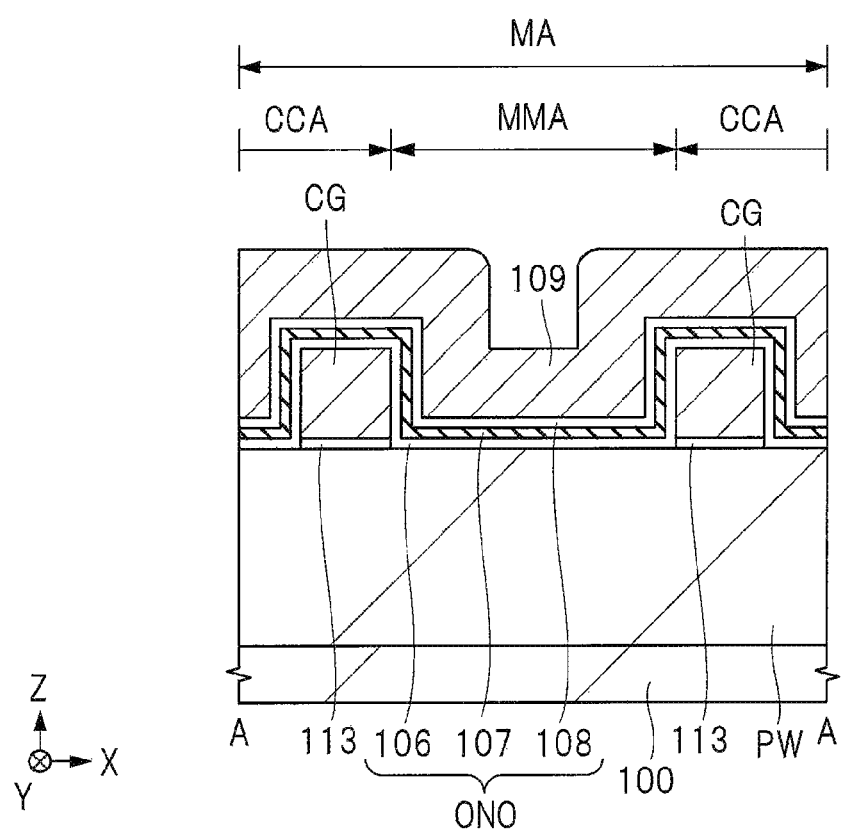
FIG. 37 is a cross-sectional view showing a manufacturing process of the semiconductor device according to the seventh embodiment, the cross-sectional view showing the manufacturing process of the semiconductor device being continued from FIG. 36.

Then, as shown in FIG. 37, on the insulating film ONO (106, 107, 108), a conductive film 109 which becomes the memory gate electrode part MG is formed. For example, on the insulating film ONO (106, 107, 108), a polysilicon film having a thickness of about 40 nm is formed as the conductive film 109 by a CVD method or others.

Figure 38:
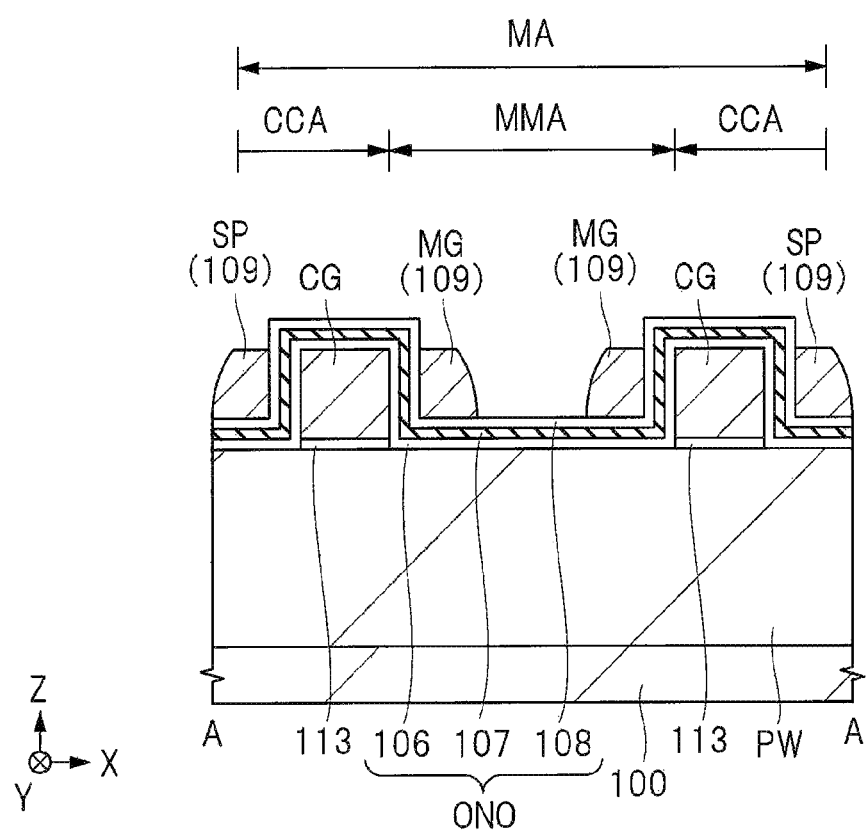
FIG. 38 is a cross-sectional view showing a manufacturing process of the semiconductor device according to the seventh embodiment, the cross-sectional view showing the manufacturing process of the semiconductor device being continued from FIG. 37.

Then, as shown in FIG. 38, a side-wall-form memory gate electrode part MG is formed along the side wall of the control gate electrode part CG.

For example, the polysilicon film is etched back. In the etch-back process, the polysilicon film is removed by a predetermined thickness from the surface thereof, by using anisotropic dry etching. By this process, the polysilicon film can remain to be the side wall form (a side wall film form) on the side wall of the control gate electrode part CG via the insulating film ONO. The polysilicon film on one side of the both sides of the control gate electrode part CG becomes the memory gate electrode part MG. Note that the side-wall-form polysilicon film on the other side is indicated by a symbol "SP".

Figure 39:
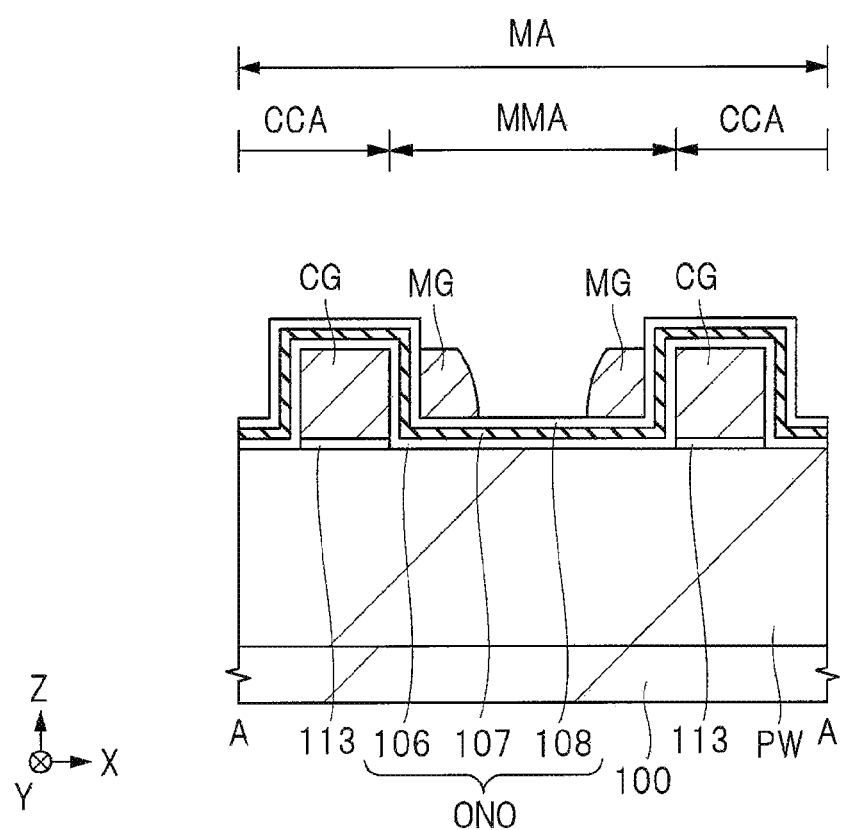
FIG. 39 is a cross-sectional view showing a manufacturing process of the semiconductor device according to the seventh embodiment, the cross-sectional view showing the manufacturing process of the semiconductor device being continued from FIG. 38.

Then, as shown in FIG. 39, the polysilicon film SP is removed by using a photolithography technique and a dry etching technique.

Figure 40:
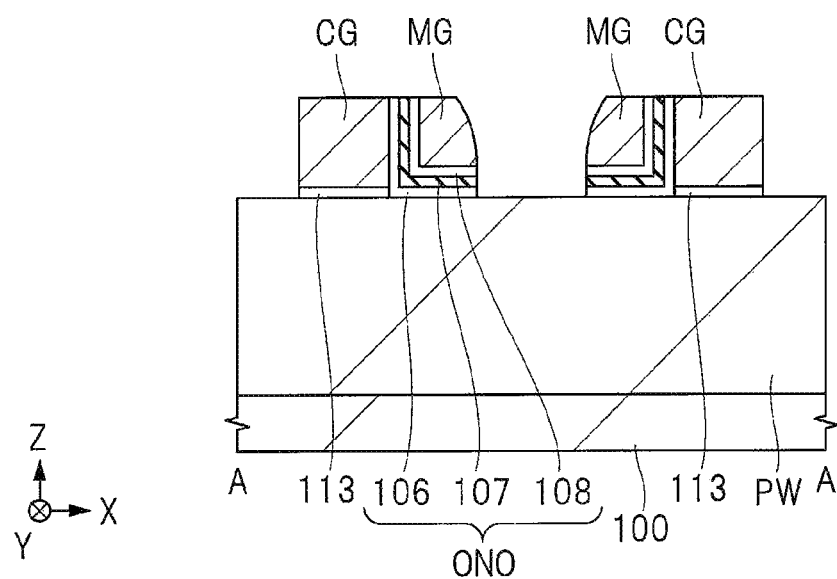
FIG. 40 is a cross-sectional view showing a manufacturing process of the semiconductor device according to the seventh embodiment, the cross-sectional view showing the manufacturing process of the semiconductor device being continued from FIG. 39.

Then, the insulating film ONO (106, 107, 108) is etched while using the memory gate electrode part MG as a mask. In this manner, the insulating film ONO (106, 107, 108) remains between the memory gate electrode part MG and the semiconductor substrate 100 (p-type well PW), and between the control gate electrode part CG and the memory gate electrode part MG (FIG. 40).

Figure 41:
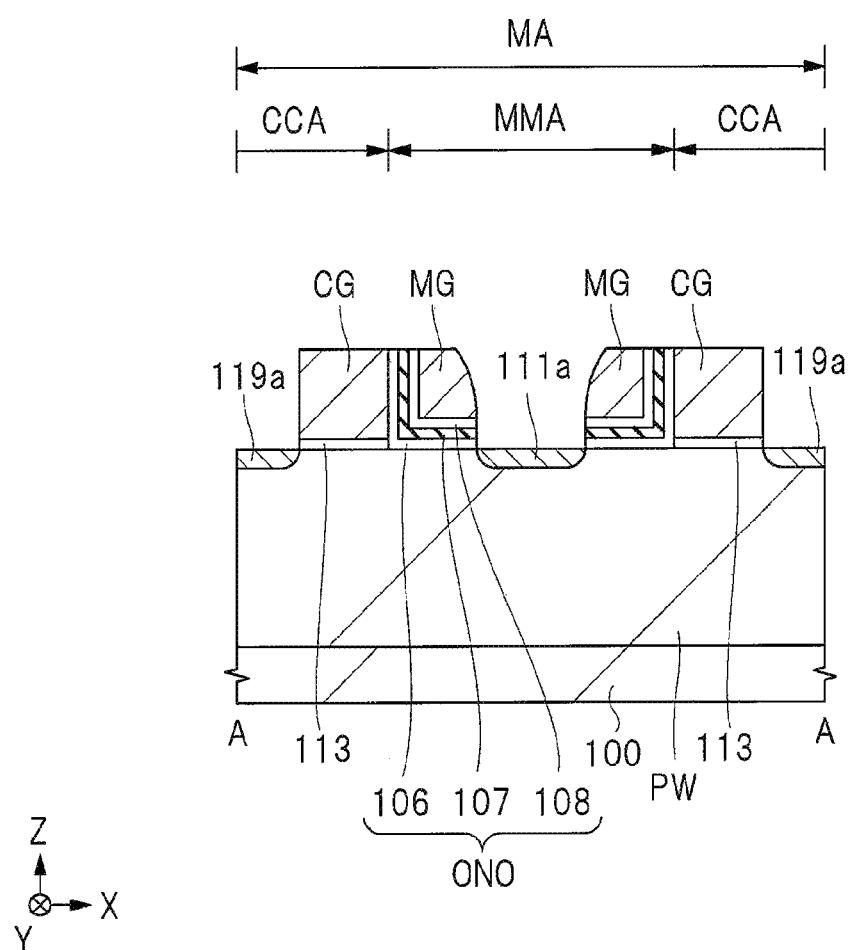
FIG. 41 is a cross-sectional view showing a manufacturing process of the semiconductor device according to the seventh embodiment, the cross-sectional view showing the manufacturing process of the semiconductor device being continued from FIG. 40.
Figure 42:
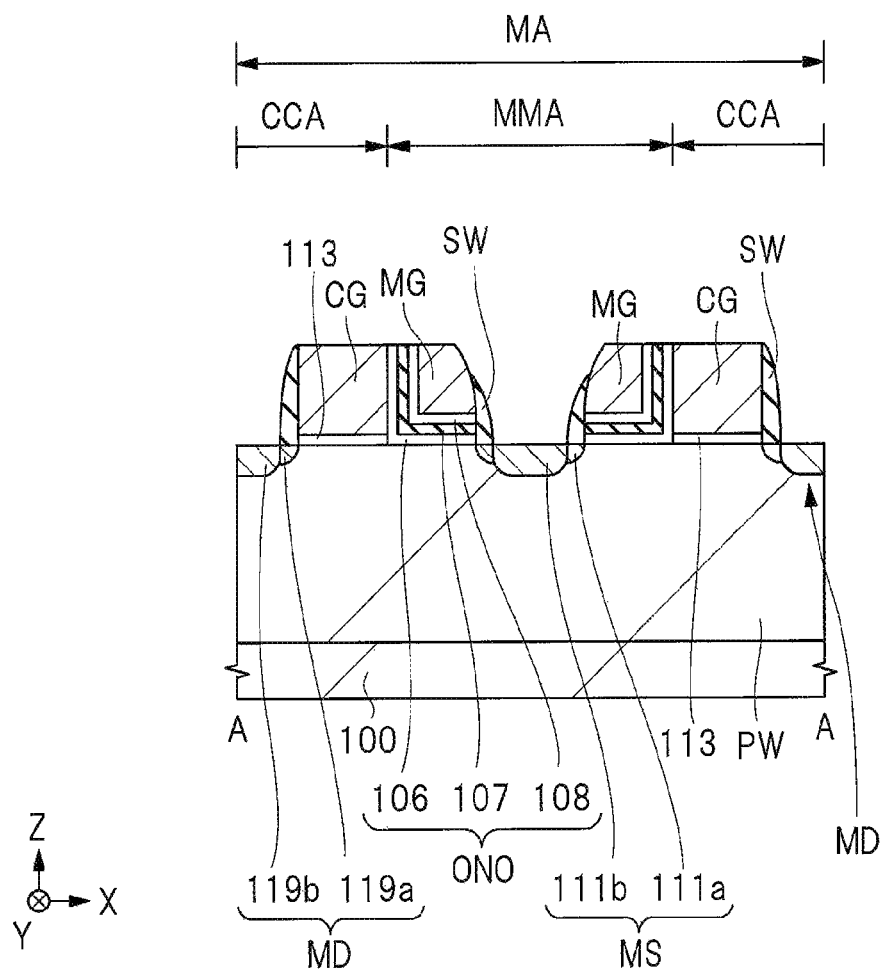
FIG. 42 is a cross-sectional view showing a manufacturing process of the semiconductor device according to the seventh embodiment, the cross-sectional view showing the manufacturing process of the semiconductor device being continued from FIG. 41.

Then, as shown in FIGS. 41 and 42, a source region MS and a drain region MD are formed.

For example, an n$^-$-type semiconductor regions 111a, 119a are formed by injecting n-type impurity such as arsenic (As) or phosphorus (P) into the semiconductor substrate 100 (p-type well PW) while using the memory gate electrode part MG and the control gate electrode part CG as masks. At this time, the n$^-$-type semiconductor region 111a is formed to be self aligned with respect to the side wall of the memory gate electrode part MG. And, the n$^-$-type semiconductor region 119a is formed to be self aligned with respect to the side wall of the control gate electrode part CG (FIG. 41).

Then, a side wall film (a side wall insulating film) SW is formed on the side wall of each of the memory gate electrode part MG and the control gate electrode part CG. For example, a silicon oxide film is deposited on the semiconductor substrate 100 including the memory gate electrode part MG and the control gate electrode part CG by a CVD method or others. The side wall film SW is formed by removing the silicon oxide film by a predetermined thickness from the surface thereof by using anisotropic dry etching. Then, n$^+$-type semiconductor regions 111b, 119b are formed by injecting n-type impurity such as arsenic (As) or phosphorus (P) into the semiconductor substrate 100 (p-type well PW) while using the memory gate electrode part MG, the control gate electrode part CG, and the side wall insulating film SW as masks. At this time, the n$^+$-type semiconductor regions 111b, 119b are formed to be self aligned with respect to the side wall insulating film SW. The n$^+$-type semiconductor region 111b has a higher impurity concentration and a deeper junction depth than those of the n$^-$-type semiconductor region 111a. The n$^+$-type semiconductor region 119b has a higher impurity concentration and a deeper junction depth than those of the n$^-$-type semiconductor region 119a. By this process, the source region MS including the n⁻-type semiconductor region 111a and the n⁺-type semiconductor region 111b is formed, and the drain region MD including the n⁻-type semiconductor region 119a and the n⁺-type semiconductor region 119b is formed (FIG. 42).

Figure 43:
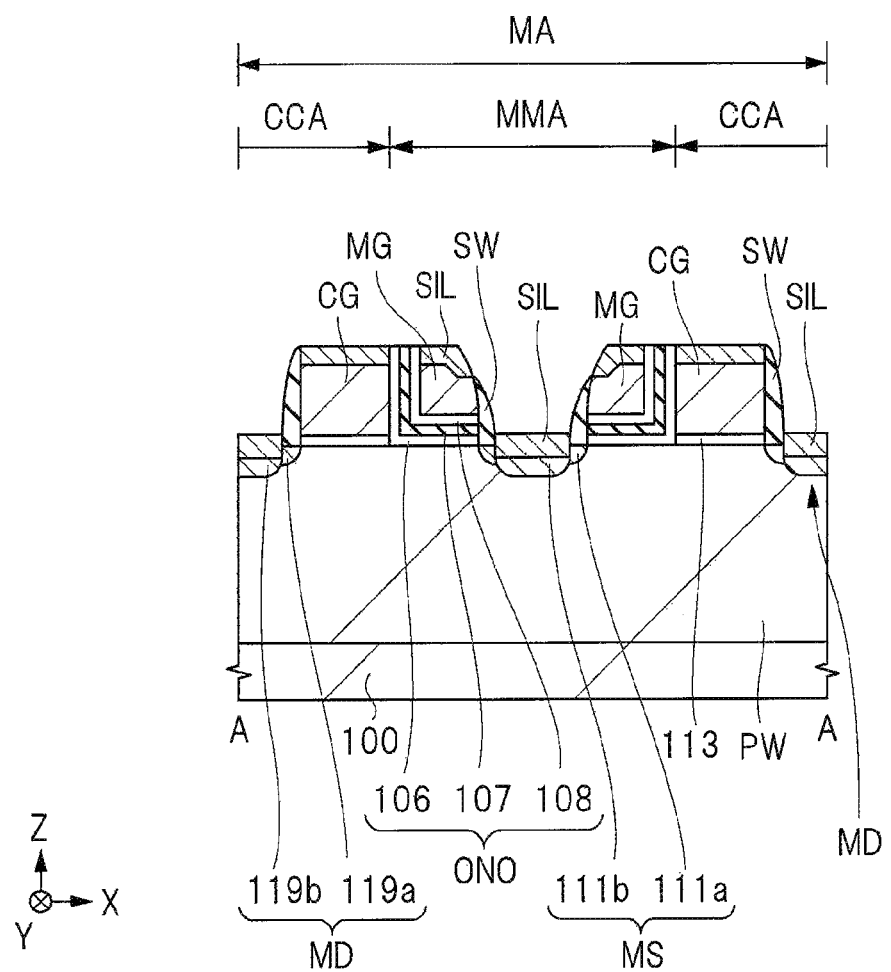
FIG. 43 is a cross-sectional view showing a manufacturing process of the semiconductor device according to the seventh embodiment, the cross-sectional view showing the manufacturing process of the semiconductor device being continued from FIG. 42.

Then, as shown in FIG. 43, a metal silicide film SIL is formed on the control gate electrode part CG, the memory gate electrode part MG, the source region MS, and the drain region MD, by using a salicide technique.

For example, a metal film (now shown) is formed on the control gate electrode part CG, the memory gate electrode part MG, the source region MS, and the drain region MD, and then, the semiconductor substrate 100 is subjected to a heat treatment, so that the metal film reacts with the control gate electrode part CG, the memory gate electrode part MG, the source region MS, and the drain region MD. As a result, a metal silicide film SIL is formed on each of the control gate electrode part CG, the memory gate electrode part MG, the source region MS, and the drain region MD. The metal film is made of, for example, nickel (Ni), a nickel-platinum (Pt) alloy, or others, and can be formed by a sputtering method or others. Then, an unreacted metal film is removed. By the metal silicide film SIL, contact resistance and diffusion resistance can be reduced.

After that, a silicon oxide film 124 as an interlayer insulating film is deposited above the control gate electrode part CG, the memory gate electrode part MG, and others by a CVD method or others. Then, a plug (not shown) is formed in the silicon oxide film 124, and besides, a wiring line 125 is formed on the silicon oxide film 124 (see FIG. 1). The plug can be formed by, for example, embedding a conductive film into a contact hole in the interlayer insulating film. The wiring line 125 can be formed by, for example, depositing a conductive film on the silicon oxide film 124 and patterning the conductive film. After this, two or more-layered wiring line may be formed by repeating the step of forming the interlayer insulating film, the plug, and the wiring line.

By the above-described manufacturing process, the semiconductor device according to the present embodiment can be formed.

Eighth Embodiment

Although so-called split-gate-type memory cell has been described as an example in the first to seventh embodiments, another type of memory cell can also be used.

Figure 44:
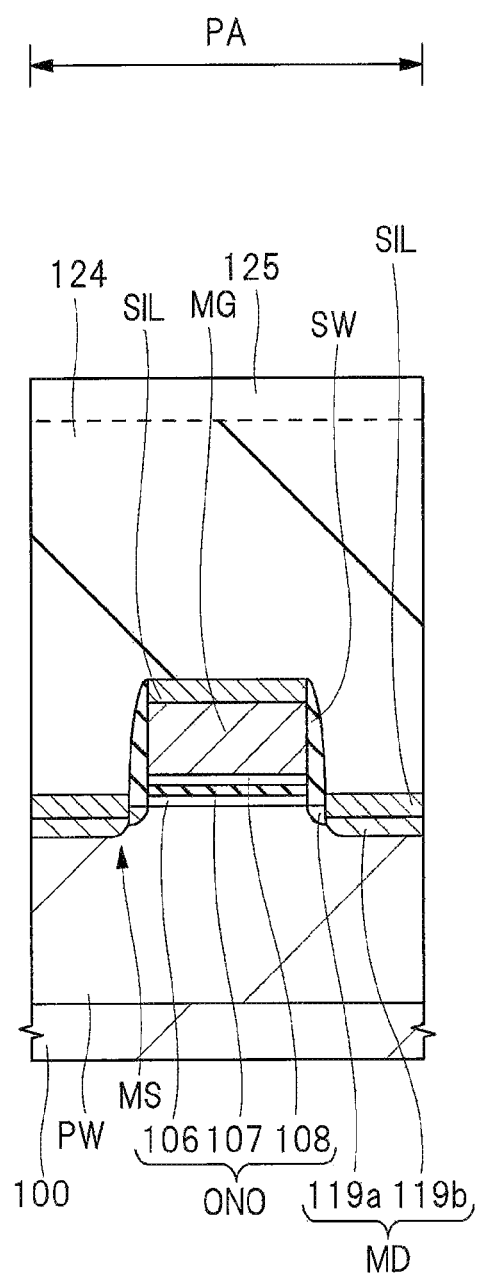
FIG. 44 is a cross-sectional view showing a semiconductor device according to an eighth embodiment.

FIG. 44 is a cross-sectional view showing a semiconductor device according to the present embodiment. The semiconductor device shown in FIG. 44 is so-called one-transistor-type MONOS memory cell.

As shown in FIG. 44, the memory cell (element) includes a transistor having a memory gate electrode part MG.

More specifically, the memory cell has the memory gate electrode part MG arranged above a semiconductor substrate 100 (p-type well PW). The memory gate electrode part MG is made of, for example, a silicon film. Further, the memory cell has an insulating film ONO (106, 107, 108) arranged between the memory gate electrode part MG and the semiconductor substrate 100 (p-type well PW). The insulating film ONO includes, for example, a lower layer insulating film 106, a middle layer insulating film 107 on the lower layer insulating film 106, and an upper layer insulating film 108 on the middle layer insulating film 107, as similar to the case of the first embodiment. The middle layer insulating film 107 becomes a charge accumulating part. The lower layer insulating film 106 is made of, for example, a silicon oxide film. The middle layer insulating film 107 is made of, for example, a silicon nitride film. The upper layer insulating film 108 is made of, for example, a laminated film including a silicon oxynitride film 108a formed on the middle layer insulating film 107, a silicon nitride film 108b formed on the silicon oxynitride film 108a, and a silicon oxide film 108c formed on the silicon nitride film 108b.

The insulating film ONO (106, 107, 108) is arranged between the memory gate electrode part MG and the semiconductor substrate 100 (p-type well PW).

Further, the memory cell has a source region MS and a drain region MD which are formed in the p-type well PW on both sides of the memory gate electrode part MG. A side wall insulating film SW made of an insulating film is formed on the side wall of the memory gate electrode part MG.

Each of the source region MS and the drain region MD is made of an n⁺-type semiconductor region 119b and an n⁻-type semiconductor region 119a. The n⁻-type semiconductor region 119a is formed to be self aligned with respect to the side wall of the memory gate electrode part MG. The n⁺-type semiconductor region 119b is formed to be self aligned with respect to a side surface of the side wall insulating film SW, and has a deeper junction depth and a higher impurity concentration than those of the n⁻-type semiconductor region 119a. Such source and drain regions as including low- and high-concentration semiconductor regions are called a lightly doped drain (LDD) structure.

Note that a metal silicide film SIL is formed on the source region MS and the drain region MD (the n⁺-type semiconductor region 119b).

Figure 45:
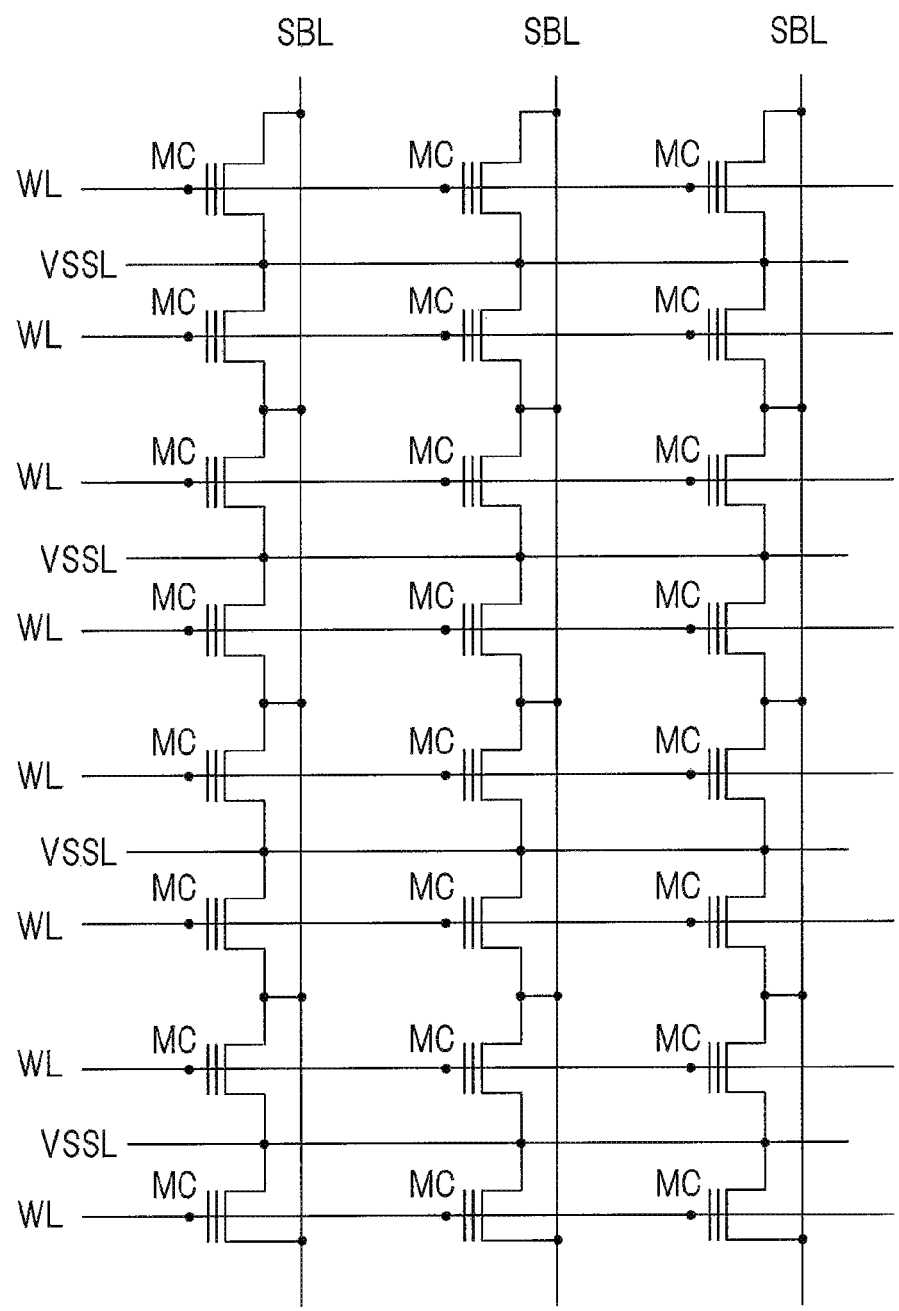
FIG. 45 is a circuit diagram showing one example of a memory cell array of a MONOS of one transistor type.

A silicon oxide film 124 is formed on the memory cell as an interlayer insulating film. A wiring line 125 and others are formed on the silicon oxide film 124 (see FIG. 1 and other drawings, although the CG does not exist therein). Note that FIG. 45 is a circuit diagram showing an example of an array of the one-transistor-type MONOS memory cells. As shown in the drawing, the memory cell MC has the memory gate electrode part and a charge accumulating part. A symbol "WL" indicates a word line. A symbol "VSSL" indicates a ground potential line connected to the drain region. A symbol "SBL" indicates a source bit line connected to the source region. As described above in the example, for example, a plurality of the memory cells are formed in an array form.

In the present embodiment, note that an n-MOS type memory cell has been described in detail. However, a p-MOS type memory cell with the configuration of the present embodiment has the same effect as that of the n-MOS type memory cell.

(Operation)

Next, an example of a basic operation of the memory cell is described. As the operations of the memory cell, three operations of the memory cell (1) reading operation, (2) writing operation, and (3) erasing operation are described. However, these operations have various definitions, and, particular, the erasing operation and the writing operation may be defined to be opposite to each other. Also in the present embodiment, a plurality of the memory cells are formed in an array form, and a plurality of memory cell regions MA (MA1-1, MA1-2, MA2-1, MA2-2) are shown as similar to the first embodiment (FIGS. 7 and 8). The memory cell region MA includes, for example, m×n memory cells. Herein, the description will be made with reference to FIG. 7.

(1) Reading Operation

In a case of reading the stored information (data) of a selected cell of the memory cell region MA (for example, MA1-1), the switch circuit SC11-1 is activated (enabled) while the switch circuit SC21-1 is inactivated (disenabled).

That is, a potential is supplied to the memory gate electrode part MG of the selected cell from only the voltage supply circuit VS1-1 on one side (on the left side in FIG. 7) of the memory cell region MA1-1, while a potential is not supplied to the memory gate electrode part MG of the selected cell from the voltage supply circuit VS1-2 on the other side (on the right side in FIG. 7) of the memory cell region MA1-1.

Then, for example, 0 V is applied to the drain region MD and the semiconductor substrate 100 (p-type well PW), 1.8 V is applied to the source region MS, and the memory gate electrode part MG is set to a predetermined potential (that is, an intermediate potential between a threshold value in a writing state and a threshold value in an erasing state, such as about 3 V), so that the accumulated charge information can be read out as a current.

(2) Writing Operation

In a case of writing the stored information (data) into a selected cell of the memory cell region MA (for example, MA1-1), the switch circuit SC11-1 is activated (enabled) while the switch circuit SC21-1 is inactivated (disenabled).

Then, for example, 0 V is applied to the source region MS and the semiconductor substrate 100 (p-type well PW), 4.5 V is applied to the drain region MD, and a writing potential (for example, about 9 V) is applied to the memory gate electrode part MG. As a result, the generated hot electrons are injected into the middle layer insulating film 107 which functions as the charge accumulating part. This writing method is called a channel hot electron (CHE) injection method.

(3) Erasing Operation

The erasing operation according to the present embodiment also includes an operation (step) of causing a current to flow through the memory gate electrode part MG to heat the memory gate electrode part MG. That is, as described above, the memory gate electrode part MG is heated by applying different potentials to the both end portions (1S and 2S) of the linearly-arranged memory gate electrode part MG by using the voltage supply circuit VS provided on both sides of the memory cell region MA.

First, a heating pulse is applied (St1). In this manner, the switch circuit SC11-1 is activated (enabled), and also the switch circuit SC21-1 is activated (enabled, see FIGS. 7 and 8).

For example, the switch elements SW1 and SW2 connected to the memory gate electrode part MG of the selected cell are turned on. In this manner, a voltage of a first potential (for example, 1 V) is applied to the end portion 1S of the memory gate electrode part MG of the memory cell region MA, and a voltage of a second potential (for example, 0 V) lower than the first potential is applied to the end portion 2S of the memory gate electrode part MG thereof. In this manner, a current is caused to flow through the selected memory gate electrode part MG of the memory cell region MA, so that Joule heat can be generated. In this manner, the selected cell of the memory cell region MA can be heated.

Then, an erasing pulse is applied (St2). In this manner, the switch circuit SC11-1 is activated (enabled), and the switch circuit SC21-1 is inactivated (disenabled, see FIGS. 7 and 8). For example, the switch element SW1 connected to the memory gate electrode part MG of the selected cell is turned on, but the switch element SW2 connected thereto is turned off. And, for example, a voltage of 13 V is applied to the memory gate electrode part MG, a voltage of 0 V is applied to the source region MS, and a voltage of 0 V is applied to the drain region MD. In this manner, the erasing operation is performed by injecting a hole from the memory gate electrode part MG side into a silicon nitride film (a charge accumulating part) 107 by the FN tunneling phenomena (FN tunneling method). In this manner, a plurality of cells connected to the memory gate electrode part MG can be collectively erased by injecting a hole from the memory gate electrode part MG side into a silicon nitride film (a charge accumulating part) 107.

After that, by the verification operation (St3), it is verified whether or not the memory cell has reached a desired threshold. When the memory cell has not reached the desired threshold, the application of the heating pulse (St1) and the application of the erasing pulse (St2) are performed again. As described above, until the memory cell has reached the desired threshold, the application of the heating pulse (St1), the application of the erasing pulse (St2), and the verification operation (St3) are repeated. When the memory cell has reached the desired threshold, the erasing operation ends.

As described above, also in the present embodiment, the step (St1) of applying the heating pulse is provided in the erasing operation, and therefore, the erasing speed can be increased as similar to the case of the first embodiment.

In addition, by heating the memory gate electrode part MG, the deterioration of the upper and lower layer insulating films is thermally recovered, and the problem of localization of the electrons and the holes is solved, so that the erasing characteristics, the writing characteristics, and the retention characteristics can be improved as similar to the case of the first embodiment.

In the present embodiment, note that the heating pulse and the erasing pulse are applied in different steps from each other as similar to the first embodiment. However, also in the present embodiment, an erasing-and-heating pulse may be applied as similar to the second embodiment. Also, as similar to the third embodiment, the flowing directions of the currents for heating may be changed. Further, by causing a current to flow through the memory gate electrode part MG in the vicinity of the erasing-target memory gate electrode part MG as similar to the sixth embodiment, the heating of the erasing-target memory gate electrode part MG may be assisted.

As described above, also by applying each configuration (heating step) of the above-described embodiments to the semiconductor device (the one-transistor-type MONOS memory) according to the present embodiment, the effect of each of the embodiments can be obtained.

Ninth Embodiment

In the first embodiment, the heating pulse is applied at the time of the erasing operation. However, a heating pulse may be applied at the time of a writing operation. The writing operation of the present embodiment includes an operation (a step) of causing a current to flow through a memory gate electrode part MG to heat the memory gate electrode part MG. That is, as described above, different potentials are applied to both end portions (1S and 2S) of the linearly-arranged memory gate electrode part MG by a voltage supply circuit VS provided on both sides of the memory gate electrode part MG, so that the memory gate electrode part MG is heated.

A semiconductor device according to the present embodiment will be described below, with reference to the drawings. Note that the description of the same configuration and operations of the semiconductor device as those of the first embodiment will be omitted. Therefore, the writing operation will be mainly described.

FIG. 46 is a cross-sectional view showing schematically an erasing operation according to the present embodiment. Also in the present embodiment, note that a plurality of the memory cells are formed in an array form, and a plurality of memory cell regions MA (MA1-1, MA1-2, MA2-1, MA2-2) are shown as similar to the first embodiment (FIGS. 7 and 8). Each memory cell region MA is formed of, for example, m×n memory cells. The description will be made with reference to FIG. 7.

First, a heating pulse is applied (St1). In this manner, a switch circuit SC11-1 is activated (enabled), and also a switch circuit SC21-1 is activated (enabled) (see FIGS. 7 and 8).

And, for example, as shown in FIG. 46 (St1), the switch elements (SW1), (SW2) connected to the memory gate electrode part MG2 of the selected cell are turned on. And, a voltage of a first potential (for example, 1 V) is applied to the end portion 1S of the memory gate electrode part MG of the memory cell region MA, and a voltage of a second potential (for example, 0 V) lower than the first potential is applied to the end portion 2S of the memory gate electrode part MG. In this manner, a current is caused to flow through the selected memory gate electrode part MG of the memory cell region MA, so that Joule heat can be generated. In this manner, the selected cell of the memory cell region MA can be heated.

Then, an SSI pulse is applied (St2). For example, as described in the first embodiment with reference to FIG. 10, a voltage of 9.5 V is applied to the memory gate electrode part MG, a voltage of 0.9 V is applied to the control gate electrode part CG, a voltage of 5.7 V is applied to the source region MS on the memory gate electrode part MG side, and a potential such as 0.3 V lower than that of the source region is applied to the drain region MD on the control gate electrode part CG side (FIG. 46 (St2)). The semiconductor substrate 100 (a p-type well PW) is set at 0 V. As a result, electrons are injected intensively into the end portion of the memory gate electrode part MG on the control gate electrode part CG side.

After that, by the verification operation (St3), it is verified whether or not the memory cell has reached a desired threshold. When the memory cell has not reached the desired threshold, the heating pulse is applied again, and besides, the SSI pulse is applied. As described above, until the memory cell has reached the desired threshold, the verification operation, the application of the heating pulse, the application of the SSI pulse are repeated. When the memory cell has reached the desired threshold, the writing operation ends.

In the present embodiment, note that the heating pulse and the SSI pulse are applied in different steps from each other as similar to the first embodiment. However, also in the present embodiment, an heating-and-SSI pulse may be applied as similar to the second embodiment. Also, as similar to the third embodiment, the flowing directions of the currents for heating may be changed. Also, as similar to the fourth and fifth embodiments, the heating pulse may be applied to the control gate electrode part CG.

As described above, in the present embodiment, the step of applying the heating pulse (St1) is provided to the writing operation. Therefore, the problem of localization of the electrons injected into the middle layer insulating film (the charge accumulating part, 107) by the heating at the time of the writing operation is solved, so that the distribution of the charge (the electrons, and the holes) is uniformed. Therefore, the writing characteristics, and the retention characteristics can be improved.

In the foregoing, the invention made by the present inventors has been concretely described based on the embodiments. However, it is needless to say that the present invention is not limited to the foregoing embodiments and various modifications and alterations can be made within the scope of the present invention.

For example, in the above-described embodiments, the end portion (1S, 2S) of the gate electrode part is not necessarily be the outermost end, but may be positioned to be inner than the outermost end of the gate electrode part by at a predetermined distance. Also, the gate electrode part may be partially heated. For example, an intermediate portion of the gate electrode part is set as an end portion (1S), a position thereof separated from the end portion (1S) by a predetermined distance is set as an end portion (2S), and a current is caused to flow between the two end portions, so that the entire gate electrode part may be heated by heat conduction while the gate electrode part is heated.

[Note 1]

A semiconductor device includes: a first memory cell array region and a second memory cell array region which are provided on a semiconductor substrate; a first voltage supply circuit arranged on one side of the first memory cell array region; a second voltage supply circuit arranged on the other side of the first memory cell array region, which is arranged between the first memory cell array region and the second memory cell array region; a first switch circuit arranged between the first memory cell array region and the first voltage supply circuit; a second switch circuit arranged between the first memory cell array region and the second voltage supply circuit; a plurality of gate electrode parts provided in the first memory cell array region; and an insulating film arranged between each of the plurality of the gate electrode parts and the semiconductor substrate, the insulating film having a charge accumulating part inside thereof. Each of the plurality of the gate electrode parts extends in a first direction from a first end thereof to a second end thereof, the first switch circuit has a plurality of first switch elements provided each between the first end of each of the plurality of the gate electrode parts and the first voltage supply region, and the second switch circuit has a plurality of second switch elements provided each between the second end of each of the plurality of the gate electrode parts and the second voltage supply region.

[Note 2]

In the semiconductor device according to note 1, the first switch circuit and the second switch circuit are activated, a first potential is applied to the first end of at least one of the plurality of the gate electrode parts, and a second potential lower than the first potential is applied to the second end, so that a current is caused to flow in a direction in which the gate electrode part extends, and an electron accumulated in the charge accumulating part is eliminated, by injecting a hole from the gate electrode part into the charge accumulating part.

[Note 3]

In the semiconductor device according to note 2, the hole is injected from the gate electrode part into the charge accumulating part by applying an erasing potential equal to or higher than a third potential to the gate electrode part.

[Note 4]

In the semiconductor device according to note 3, application of the first potential and application of the second potential are performed in a first period, and application of the erasing potential equal to or higher than the third potential is performed in a second period subsequent to the first period.

[Note 5]

In the semiconductor device according to note 3, the first potential and the second potential are equal to or higher than the third potential, and an electron accumulated in the charge accumulating part is eliminated by injecting a hole from the gate electrode part into the charge accumulating part while a current is caused to flow in the direction in which the gate electrode part extends.

[Note 6]

In the semiconductor device according to note 5, application of the first potential and application of the second potential are performed in a first period, and, in a second period subsequent to the first period, the second potential is applied to the first end of the gate electrode part, and the first potential is applied to the second end of the gate electrode part, so that a current is caused to flow in a direction opposite to a direction in the case of the first period.

[Note 7]

A semiconductor device includes: a first memory cell array region and a second memory cell array region which are provided on a semiconductor substrate; a first voltage supply circuit arranged on one side of the first memory cell array region; a second voltage supply circuit arranged on the other side of the first memory cell array region, which is arranged between the first memory cell array region and the second memory cell array region; a first switch circuit arranged between the first memory cell array region and the first voltage supply circuit; a second switch circuit arranged between the first memory cell array region and the second voltage supply circuit; a plurality of first gate electrode parts provided in the first memory cell array region; a plurality of second gate electrode parts which are arranged to be next to the plurality of the first gate electrode parts via a first insulating film, respectively; and a second insulating film arranged between each of the plurality of the second gate electrode parts and the semiconductor substrate, the second insulating film having a charge accumulating part inside thereof. Each of the plurality of the second gate electrode parts extends in a first direction from a first end thereof to a second end thereof, the first switch circuit has a plurality of first switch elements provided each between the first end of each of the plurality of the second gate electrode parts and the first voltage supply region, and the second switch circuit has a plurality of second switch elements provided each between the second end of each of the plurality of the second gate electrode parts and the second voltage supply region.

[Note 8]

In the semiconductor device according to note 7, the first switch circuit and the second switch circuit are activated, a first potential is applied to the first end of at least one of the plurality of the second gate electrode parts, and a second potential lower than the first potential is applied to the second end, so that a current is caused to flow in a direction in which the second gate electrode part extends, and an electron accumulated in the charge accumulating part is eliminated by injecting a hole from the second gate electrode part into the charge accumulating part.

[Note 9]

In the semiconductor device according to note 8, the hole is injected from the second gate electrode part into the charge accumulating part by applying an erasing potential equal to or higher than a third potential to the second gate electrode part.

[Note 10]

In the semiconductor device according to note 7, the second insulating film has a lower layer film, a middle layer film which is the charge accumulating part, and an upper layer film, and the upper layer film has a film containing nitrogen.

[Note 11]

In the semiconductor device according to note 10, the upper layer film has a silicon oxynitride film formed on the middle layer film, a silicon nitride film formed on the silicon oxynitride film, and a silicon oxide film formed on the silicon nitride film.

[Note 12]

In the semiconductor device according to note 9, application of the first potential and application of the second potential are performed in a first period, and application of the erasing potential equal to or higher than the third potential is performed in a second period subsequent to the first period.

[Note 13]

In the semiconductor device according to note 9, the first potential and the second potential are equal to or higher than the third potential, and an electron accumulated in the charge accumulating part is eliminated by injecting a hole from the second gate electrode part into the charge accumulating part while a current is caused to flow in the direction in which the second gate electrode part extends.

[Note 14]

In the semiconductor device according to note 9, application of the first potential and application of the second potential are performed in a first period, and, in a second period subsequent to the first period, the second potential is applied to the first end of the second gate electrode part, and the first potential is applied to the second end of the second gate electrode part, so that a current is caused to flow in a direction opposite to a direction in the case of the first period.

[Note 15]

A semiconductor device includes: a first memory cell array region and a second memory cell array region which are provided on a semiconductor substrate; a first voltage supply circuit arranged on one side of the first memory cell array region; a second voltage supply circuit arranged on the other side of the first memory cell array region, which is arranged between the first memory cell array region and the second memory cell array region; a first switch circuit arranged between the first memory cell array region and the first voltage supply circuit; a second switch circuit arranged between the first memory cell array region and the second voltage supply circuit; a plurality of first gate electrode parts provided in the first memory cell array region; a plurality of second gate electrode parts which are arranged to be next to the plurality of the first gate electrode parts via a first insulating film, respectively; and a second insulating film arranged between each of the plurality of the second gate electrode parts and the semiconductor substrate, the second insulating film having a charge accumulating part inside thereof. Each of the plurality of the first gate electrode parts extends in a first direction from a first end thereof to a second end thereof, the first switch circuit has a plurality of first switch elements provided each between the first end of each of the plurality of the first gate electrode parts and the first voltage supply region, and the second switch circuit has a plurality of second switch elements provided each between the second end of each of the plurality of the first gate electrode parts and the second voltage supply region.

[Note 16]

In the semiconductor device according to note 15, the first switch circuit and the second switch circuit are activated, a first potential is applied to the first end of at least one of the plurality of the first gate electrode parts, and a second potential lower than the first potential is applied to the second end, so that a current is caused to flow in a direction in which the first gate electrode part extends, and an electron accumulated in the charge accumulating part is eliminated by injecting a hole from the second gate electrode part into the charge accumulating part.

[Note 17]

In the semiconductor device according to note 16, the hole is injected from the second gate electrode part into the charge accumulating part by applying an erasing potential equal to or higher than a third potential to the second gate electrode part.

[Note 18]

In the semiconductor device according to note 15, the second insulating film has a lower layer film, a middle layer film which is the charge accumulating part, and an upper layer film, and the upper layer film has a film containing nitrogen.

[Note 19]

In the semiconductor device according to note 18, the upper layer film has a silicon oxynitride film formed on the middle layer film, a silicon nitride film formed on the silicon oxynitride film, and a silicon oxide film formed on the silicon nitride film.

[Note 20]

In the semiconductor device according to note 17, a fourth potential is applied to a first end of the second gate electrode part, and a fifth potential lower than the fourth potential is applied to a second end of the second gate electrode part, so that a current is caused to flow in a direction in which the second gate electrode part extends, and the fourth and fifth potentials are equal to or higher than the third potential.

What is claimed is:

1. A semiconductor device comprising
a memory cell including:
   a gate electrode part arranged above a semiconductor substrate; and
   an insulating film formed between the gate electrode part and the semiconductor substrate, the insulating film having a charge accumulating part inside thereof,
wherein a first potential is applied to a first end of the gate electrode part, and a second potential lower than the first potential is applied to a second end of the gate electrode part, in such a manner that a current flows in a direction in which the gate electrode part extends, and
an electron accumulated in the charge accumulating part is eliminated, by injecting a hole from the gate electrode part into the charge accumulating part.

2. The semiconductor device according to claim 1,
wherein the hole is injected from the gate electrode part into the charge accumulating part by applying an erasing potential equal to or higher than a third potential to the gate electrode part.

3. The semiconductor device according to claim 2,
wherein application of the first potential and application of the second potential are performed in a first period, and
application of the erasing potential equal to or higher than the third potential is performed in a second period subsequent to the first period.

4. The semiconductor device according to claim 2,
wherein the first potential and the second potential are equal to or higher than the third potential, and
an electron accumulated in the charge accumulating part is eliminated by injecting a hole from the gate electrode part into the charge accumulating part while a current is caused to flow in a direction in which the gate electrode part extends.

5. The semiconductor device according to claim 4,
wherein application of the first potential and application of the second potential are performed in a first period, and,
in a second period subsequent to the first period, the second potential is applied to the first end of the gate electrode part, and the first potential is applied to the second end of the gate electrode part, so that a current is caused to flow in a direction opposite to a direction in the case of the first period.

6. A semiconductor device comprising
a memory cell including:
   a semiconductor substrate;
   a first gate electrode part arranged above the semiconductor substrate;
   a second gate electrode part arranged above the semiconductor substrate so as to be next to the first gate electrode part;
   a first insulating film formed between the first gate electrode part and the semiconductor substrate; and
   a second insulating film formed between the second gate electrode part and the semiconductor substrate, and also between the first gate electrode part and the second gate electrode part, the second insulating film having a charge accumulating part inside thereof,
wherein a first potential is applied to a first end of the second gate electrode part, and a second potential lower than the first potential is applied to a second end of the second gate electrode part, so that a current is caused to flow in a direction in which the second gate electrode part extends, and
an electron accumulated in the charge accumulating part is eliminated by injecting a hole from the second gate electrode part into the charge accumulating part.

7. The semiconductor device according to claim 6,
wherein the hole is injected from the second gate electrode part into the charge accumulating part by applying an erasing potential equal to or higher than a third potential to the second gate electrode part.

8. The semiconductor device according to claim 7,
wherein the second insulating film has a lower layer film, a middle layer film which is the charge accumulating part, and an upper layer film, and
the upper layer film has a film containing nitrogen.

9. The semiconductor device according to claim 8,
wherein the upper layer film has a silicon oxynitride film formed on the middle layer film, a silicon nitride film formed on the silicon oxynitride film, and a silicon oxide film formed on the silicon nitride film.

10. The semiconductor device according to claim 7,
wherein application of the first potential and application of the second potential are performed in a first period, and
application of the erasing potential equal to or higher than the third potential is performed in a second period subsequent to the first period.

11. The semiconductor device according to claim 7,
wherein the first potential and the second potential are equal to or higher than the third potential, and an electron accumulated in the charge accumulating part is eliminated by injecting a hole from the second gate electrode part into the charge accumulating part while a current is caused to flow in a direction in which the second gate electrode part extends.

12. The semiconductor device according to claim 11, wherein application of the first potential and application of the second potential are performed in a first period, and, in a second period subsequent to the first period, the second potential is applied to the first end of the second gate electrode part, and the first potential is applied to the second end of the second gate electrode part, so that a current is caused to flow in a direction opposite to a direction in the case of the first period.

13. A semiconductor device comprising
a memory cell including:
  a semiconductor substrate;
  a first gate electrode part arranged above the semiconductor substrate;
  a second gate electrode part arranged above the semiconductor substrate so as to be next to the first gate electrode part;
  a first insulating film formed between the first gate electrode part and the semiconductor substrate; and
  a second insulating film formed between the second gate electrode part and the semiconductor substrate, and also between the first gate electrode part and the second gate electrode part, the second insulating film having a charge accumulating part inside thereof,
wherein a first potential is applied to a first end of the first gate electrode part, and a second potential lower than the first potential is applied to a second end of the first gate electrode part, so that a current is caused to flow in a direction in which the first gate electrode part extends, and
an electron accumulated in the charge accumulating part is eliminated by injecting a hole from the second gate electrode part into the charge accumulating part.

14. The semiconductor device according to claim 13, wherein the hole is injected from the second gate electrode part into the charge accumulating part by applying an erasing potential equal to or higher than a third potential to the second gate electrode part.

15. The semiconductor device according to claim 14, wherein the second insulating film has a lower layer film, a middle layer film which is the charge accumulating part, and an upper layer film, and
the upper layer film has a film containing nitrogen.

16. The semiconductor device according to claim 15, wherein the upper layer film has a silicon oxynitride film formed on the middle layer film, a silicon nitride film formed on the silicon oxynitride film, and a silicon oxide film formed on the silicon nitride film.

17. The semiconductor device according to claim 14, wherein a fourth potential is applied to the first end of the second gate electrode part, and a fifth potential lower than the fourth potential is applied to the second end of the second gate electrode part, so that a current is caused to flow in a direction in which the second gate electrode part extends, and
the fourth potential and the fifth potential are equal to or higher than the third potential.

18. A semiconductor device comprising
a plurality of memory cells each of which including:
  a gate electrode part arranged above a semiconductor substrate; and
  an insulating film formed between the gate electrode part and the semiconductor substrate, the insulating film having a charge accumulating part inside thereof,
wherein, among the plurality of the memory cells, the gate electrode part of a first memory cell and the gate electrode part of a second memory cell are provided so as to be next to each other,
a first potential is applied to a first end of the gate electrode part of the first memory cell, and a second potential lower than the first potential is applied to a second end of the gate electrode part, so that a current is caused to flow in a direction in which the gate electrode part of the first memory cell extends, and
an electron accumulated in the charge accumulating part is eliminated by injecting a hole from the gate electrode part of the second memory cell into the charge accumulating part.

19. The semiconductor device according to claim 18, wherein the hole is injected from the gate electrode part of the second memory cell into the charge accumulating part by applying an erasing potential equal to or higher than a third potential to the gate electrode part of the second memory cell.

20. A method of driving a semiconductor device comprising
a memory cell including:
  a gate electrode part arranged above a semiconductor substrate; and
  an insulating film formed between the gate electrode part and the semiconductor substrate, the insulating film having a charge accumulating part inside thereof,
wherein the method includes the steps of:
(a) applying a first potential to a first end of the gate electrode part, and applying a second potential lower than the first potential to a second end of the gate electrode part, so that a current is caused to flow in a direction in which the gate electrode part extends, and
(b) eliminating an electron accumulated in the charge accumulating part by injecting a hole from the gate electrode part into the charge accumulating part.

* * * * *